US010321081B2

(12) United States Patent
Watanabe et al.

(10) Patent No.: US 10,321,081 B2
(45) Date of Patent: Jun. 11, 2019

(54) SOLID-STATE IMAGING DEVICE

(71) Applicant: OLYMPUS CORPORATION, Hachioji-shi, Tokyo (JP)

(72) Inventors: Nobuyuki Watanabe, Yokohama (JP); Toru Kondo, Tokyo (JP); Kosei Tamiya, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/873,240

(22) Filed: Jan. 17, 2018

(65) Prior Publication Data
US 2018/0167575 A1 Jun. 14, 2018

Related U.S. Application Data

(63) Continuation of application No. PCT/JP2015/071038, filed on Jul. 23, 2015.

(51) Int. Cl.
*H04N 5/3745* (2011.01)
*H04N 5/378* (2011.01)
(Continued)

(52) U.S. Cl.
CPC ......... *H04N 5/3745* (2013.01); *H01L 27/146* (2013.01); *H04N 5/3454* (2013.01); *H04N 5/378* (2013.01); *H04N 5/37452* (2013.01)

(58) Field of Classification Search
CPC ............. H04N 5/3745; H04N 5/37452; H04N 5/3454; H04N 5/378; H01L 27/146
See application file for complete search history.

(56) References Cited

U.S. PATENT DOCUMENTS

2008/0180534 A1 7/2008 Murayama
2010/0182468 A1 7/2010 Posch et al.
(Continued)

FOREIGN PATENT DOCUMENTS

JP 2004-191647 A 7/2004
JP 2010-510732 A 4/2010
(Continued)

OTHER PUBLICATIONS

Berner et al., "A 240×180 10mW 12us Latency Sparse-Output Vision Sensor for Mobile Applications", 2013 Symposium on VLSI Circuits Digest of Technical Papers, 2013, pp. C186-C187, (2 pages).
(Continued)

*Primary Examiner* — Mekonnen D Dagnew
(74) *Attorney, Agent, or Firm* — Westerman, Hattori, Daniels & Adrian, LLP

(57) ABSTRACT

A solid-state imaging device includes n first photoelectric conversion elements configured to photoelectrically convert incident light, n first reading circuits configured to output corresponding first pixel signals, m second photoelectric conversion elements configured to photoelectrically convert incident light, m second reading circuits configured to sequentially output corresponding second pixel signals, and a reading control circuit, wherein each of the second reading circuits includes a detection circuit configured to output an event signal when a change in a second charge signal is detected and a pixel signal generation circuit configured to add address information to an event signal, and the reading control circuit causes the first pixel signal to be output by determining a reading region corresponding to address information, and n and m are natural numbers greater than or equal to 2.

13 Claims, 20 Drawing Sheets

(51) Int. Cl.
*H01L 27/146* (2006.01)
*H04N 5/345* (2011.01)

(56) References Cited

U.S. PATENT DOCUMENTS

| | | | |
|---|---|---|---|
| 2014/0125994 A1* | 5/2014 | Kim | G01B 11/22 356/601 |
| 2015/0156428 A1* | 6/2015 | Uchida | H04N 5/3696 348/294 |
| 2016/0063727 A1* | 3/2016 | Gao | G06K 9/00335 382/103 |
| 2016/0119607 A1* | 4/2016 | Konno | G06T 3/00 348/47 |

FOREIGN PATENT DOCUMENTS

| | | |
|---|---|---|
| JP | 2015-128284 A | 7/2015 |
| WO | 2006/022077 A1 | 3/2006 |

OTHER PUBLICATIONS

Komuro et al., "Vision Chip Specified for Target Tracking", Journal of IEICE D-II, 2001, vol. J84-D-II, No. 1, pp. 75-82, w/English translation (16 pages).
International Search Report dated Oct. 6, 2015, issued in counterpart International Application No. PCT/JP2015/071038, w/English translation (4 pages).

* cited by examiner

SOLID-STATE IMAGING DEVICE

This application is a continuation application based on PCT Patent Application No. PCT/JP2015/071038 filed on Jul. 23, 2015.

TECHNICAL FIELD

The present invention relates to a solid-state imaging device.

BACKGROUND ART

Conventionally, there is technology for motion detection for detecting the motion of an object. In conventional motion detection, moving objects are captured by taking differences between images captured at predetermined frame intervals. Thus, the motion of the object can be detected only at intervals of flames in conventional motion detection. In other words, it is not possible to sequentially detect the motion of the object.

Therefore, in recent years, for example, as disclosed in "A 240×180 10 mW 12 us latency sparse-output vision sensor for mobile applications," VLSI Circuits (VLSIC), 2013 Symposium on, Publication Year: 2013, Page(s): C186-C187 (hereinafter referred to as "Document 1"), technology of a solid-state imaging device configured to achieve both motion detection for sequentially detecting motion of an object and normal photographing, by detecting a change in a signal according to the motion of the object has been proposed. In the solid-state imaging device proposed in Document 1, each pixel includes one photoelectric conversion element (photodiode) configured to photoelectrically convert incident light and it is possible to asynchronously perform active pixel sensor (APS) reading for reading a charge signal in the normal photographing and address event representation (AER) reading for reading a charge signal for motion detection.

In the solid-state imaging device proposed in Document 1, a change over time in the charge signal photoelectrically converted by the photodiode is detected at the time of motion detection, and a pulse signal indicating the direction in which the charge signal changes is output only from a pixel in which the magnitude of the charge signal exceeds a predetermined threshold value through AER reading. In other words, in the solid-state imaging device proposed in Document 1, a pulse signal indicating an increase/decrease of the magnitude of the charge signal is output through the AER reading. At this time, address information indicating the position of the pixel configured to output the pulse signal is also added to the pulse signal output through the AER reading. In other words, address information indicating a pixel position at which motion of the object is detected is also added to the pulse signal output through the AER reading.

Thereby, in the solid-state imaging device proposed in Document 1, the pixel position at which the motion of the object is detected can be extracted at an asynchronous timing irrespective of a timing of a frame from which the charge signal is read in the normal photographing. Thereby, in the solid-state imaging device proposed in Document 1, it is possible to acquire a moving object at a rate higher than a frame rate in the normal photographing.

SUMMARY OF INVENTION

According to a first aspect of the present invention, a solid-state imaging device includes n first photoelectric conversion elements configured to photoelectrically convert incident light and generate first charge signals; n first reading circuits corresponding to the n first photoelectric conversion elements and configured to output signal voltages as first pixel signals, according to the first charge signals generated by the corresponding first photoelectric conversion elements; m second photoelectric conversion elements configured to photoelectrically convert incident light and generate second charge signals; m second reading circuits corresponding to the m second photoelectric conversion elements and configured to sequentially output second pixel signals according to changes in the second charge signals generated by the corresponding second photoelectric conversion elements; and a reading control circuit configured to control reading of the first pixel signals corresponding to the first photoelectric conversion elements arranged in predetermined reading regions within the first photoelectric conversion elements, wherein each of the m second reading circuits includes a detection circuit configured to detect a change over time in the second charge signal generated by the corresponding second photoelectric conversion element and output an event signal indicating the change when the change exceeding a predetermined threshold value is detected; and a pixel signal generation circuit configured to output the second pixel signal which is made by adding address information indicating a position at which the corresponding second photoelectric conversion element is arranged to the event signal, wherein the reading control circuit determines a region according to a position at which the second photoelectric conversion element corresponding to the address information included in the second pixel signal is arranged as the reading region for reading the first pixel signal, and causes each of the first reading circuits corresponding to each of the first photoelectric conversion elements arranged in the determined reading region to output the first pixel signal, wherein n is a natural number greater than or equal to 2, and wherein m is a natural number greater than or equal to 2.

According to a second aspect of the present invention, in the solid-state imaging device of the above-described first aspect, the reading control circuit may determine, a rectangular region generated on the basis of a position at which the second photoelectric conversion elements corresponding to the address information included in the second pixel signals output in the same period are distributed, as the reading region.

According to a third aspect of the present invention, in the solid-state imaging device of the above-described first aspect, the reading control circuit may determine, a rectangular region including a region in which the second photoelectric conversion elements corresponding to the address information included in the second pixel signals output in the same period are distributed, as the reading region.

According to a fourth aspect of the present invention, in the solid-state imaging device of the above-described first aspect, the reading control circuit may determine a rectangular region according to a magnitude of a distribution of the second photoelectric conversion elements as the reading region if the magnitude of the distribution of the second photoelectric conversion elements corresponding to the address information included in the second pixel signals output in the same period is greater than a predetermined threshold value, and the reading control circuit may not determine the reading region if the magnitude of the distribution of the second photoelectric conversion elements corresponding to the address information included in the second pixel signals output in the same period is less than or equal to the threshold value.

According to a fifth aspect of the present invention, in the solid-state imaging device of the above-described first aspect, the reading control circuit may determine the reading region corresponding to the second photoelectric conversion elements corresponding to the address information if the number of second photoelectric conversion elements corresponding to the address information included in the second pixel signals output in the same period is greater than a predetermined threshold value, and the reading control circuit may not determine the reading region if the number of second photoelectric conversion elements corresponding to the address information included in the second pixel signals output in the same period is less than or equal to the threshold value.

According to a sixth aspect of the present invention, in the solid-state imaging device of the above-described fourth aspect, the reading control circuit may divide an entire region in which the n first photoelectric conversion elements are arranged into a plurality of blocks segmented in a predetermined size and determine the reading region for each division block.

According to a seventh aspect of the present invention, in the solid-state imaging device of the above-described first aspect, each of the n first photoelectric conversion elements and each of the m second photoelectric conversion elements may be periodically arranged in a region of the same plane of a first semiconductor substrate.

According to an eighth aspect of the present invention, in the solid-state imaging device of the above-described seventh aspect, the pixel signal generation circuit may be arranged in a second semiconductor substrate stacked on a surface of the first semiconductor substrate, the surface being opposite to a side on which light is incident.

According to a ninth aspect of the present invention, the solid-state imaging device of the above-described eighth aspect may further include: a connection section formed between the first semiconductor substrate and the second semiconductor substrate and configured to electrically connect a circuit element of the first semiconductor substrate and a circuit element of the second semiconductor substrate, wherein the connection section electrically connects the detection circuit provided in each of the m second reading circuits and the corresponding second photoelectric conversion element.

According to a tenth aspect of the present invention, in the solid-state imaging device of the above-described ninth aspect, a charge signal in which s first charge signals generated by s first photoelectric conversion elements are designated as one unit may be also used as the second charge signal generated by the second photoelectric conversion element, s may be a natural number greater than or equal to 1, and the total number of the first photoelectric conversion elements configured to output the first charge signals also used as the second charge signals may be a natural number greater than or equal to 1 and less than or equal to n.

According to an eleventh aspect of the present invention, in the solid-state imaging device of the above-described tenth aspect, m may be less than n, s may be a natural number greater than or equal to 2, each of the m second reading circuits may further include an addition circuit configured to sum the s first charge signals generated by the s first photoelectric conversion elements corresponding thereto as one unit, and the detection circuit may detect a change in the first charge signal after summation by the addition circuit.

According to a twelfth aspect of the present invention, in the solid-state imaging device of the above-described first aspect, each of the n first photoelectric conversion elements may be periodically arranged on a first semiconductor substrate on which light is incident, each of the m second photoelectric conversion elements may be periodically arranged on a second semiconductor substrate stacked on a surface of the first semiconductor substrate, the surface being opposite to a side on which light is incident, and each of the m second photoelectric conversion elements may generate the second charge signal obtained by photoelectrically converting light passing through the first semiconductor substrate.

According to a thirteenth aspect of the present invention, in the solid-state imaging device of the above-described ninth aspect, each of the second reading circuits may further include an addition circuit configured to designate t second photoelectric conversion elements as one unit and sum second charge signals generated by the t second photoelectric conversion elements, the detection circuit may detect a change in the second charge signal after summation by the addition circuit, and t may be a natural number greater than or equal to 2.

DESCRIPTION OF EMBODIMENTS

First Embodiment

Figure 1:
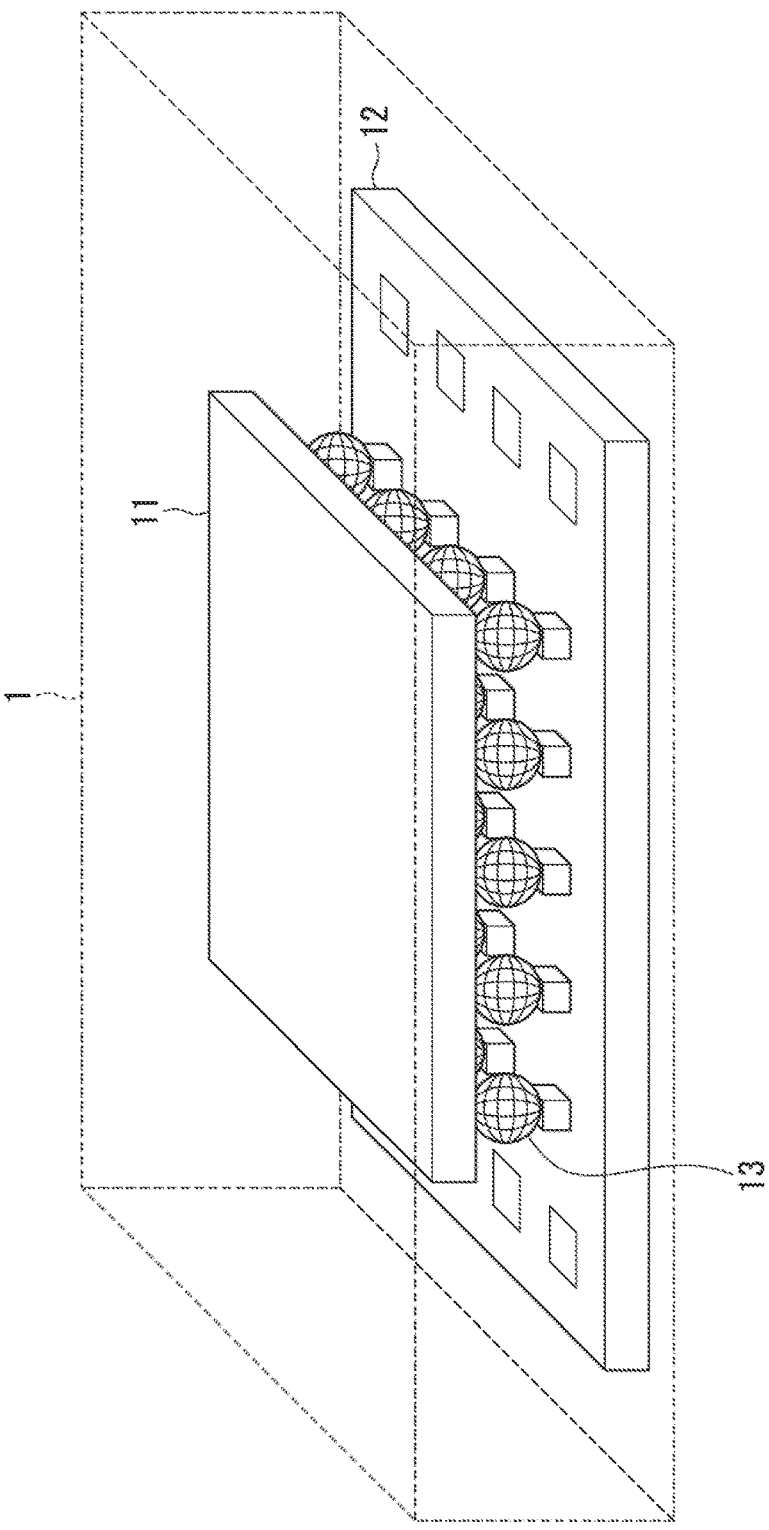
FIG. 1 is a schematic diagram showing a schematic configuration of a solid-state imaging device according to a first embodiment of the present invention.

Hereinafter, embodiments of the present invention will be described with reference to the drawings. FIG. 1 is a schematic diagram showing a schematic configuration of a solid-state imaging device according to a first embodiment of the present invention. A solid-state imaging device 1 of the first embodiment is configured by stacking (bonding) a plurality of semiconductor substrates. In FIG. 1, in the solid-state imaging device 1, a first semiconductor substrate 11 and a second semiconductor substrate 12 are bonded by a chip connection section 13.

In the solid-state imaging device 1, a circuit for implementing the function of the solid-state imaging device 1 is formed on one of the first semiconductor substrate 11 and the second semiconductor substrate 12. A circuit for implementing the function of the solid-state imaging device 1 includes a pixel array section in which a plurality of pixels, each of which includes a photoelectric conversion element such as a photodiode configured to photoelectrically convert incident light (a light beam) and a reading circuit configured to read a charge signal generated by the photoelectric conversion element, are arranged in a two-dimensional matrix, a driving circuit for driving the pixels within the pixel array section, and the like.

Also, each circuit for implementing the function of the solid-state imaging device 1 may be a configuration formed on both a first semiconductor substrate 11 and a second semiconductor substrate 12 as well as a configuration formed on one of the first semiconductor substrate 11 and the second semiconductor substrate 12.

Circuits for implementing the function of the solid-state imaging device 1 formed on the semiconductor substrates are electrically connected by the chip connection section 13. The circuit formed on the first semiconductor substrate 11 and the circuit formed on the second semiconductor substrate 12 performs signal transmission and reception via the chip connection section 13.

As the chip connection section 13, for example, a micro bump or the like manufactured by a vapor deposition method, a plating method, or the like is used. A method of connecting the circuits for implementing the function of the solid-state imaging device 1 formed on each semiconductor substrate is not limited to the method using a micro bump, and may be, for example, a method using a silicon through electrode (through-silicon-via (TSV)).

Figure 2:
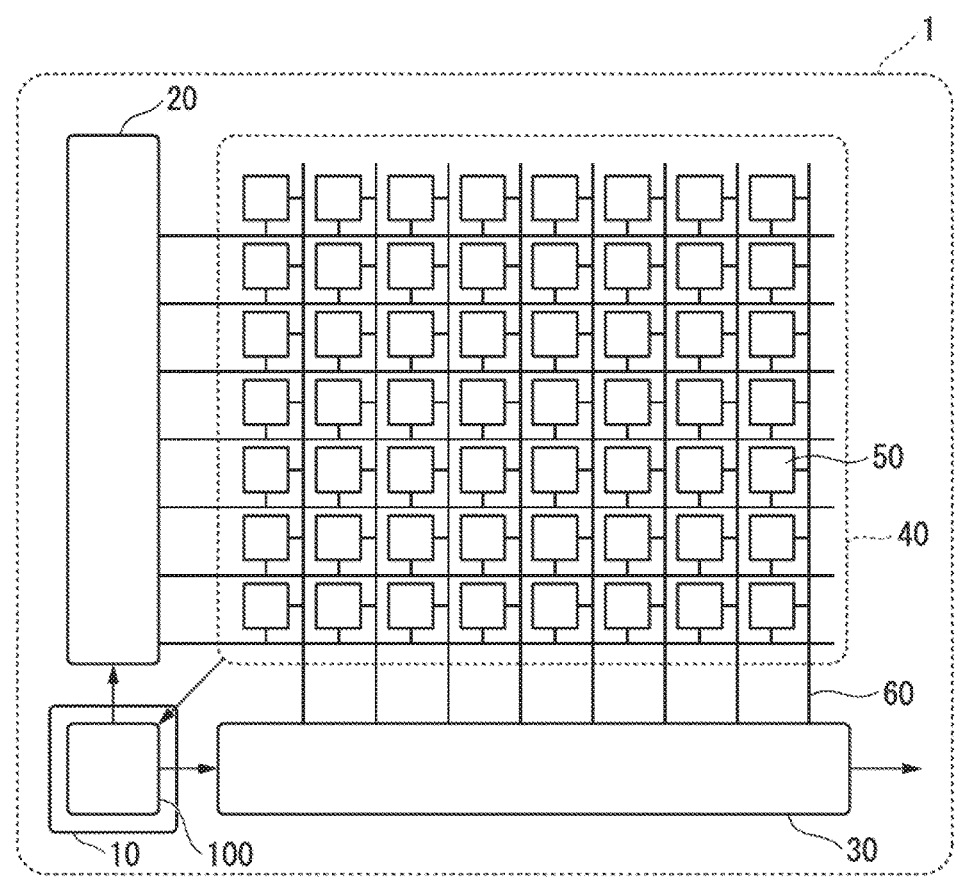
FIG. 2 is a block diagram showing a schematic configuration of the solid-state imaging device according to the first embodiment of the present invention.

Next, an example of the configuration of the solid-state imaging device 1 according to the first embodiment will be described. FIG. 2 is a block diagram showing a schematic configuration of the solid-state imaging device 1 according to the first embodiment of the present invention. In FIG. 2, the solid-state imaging device 1 includes a control circuit 10, a vertical scanning circuit 20, a horizontal scanning circuit 30, and a pixel array section 40 in which a plurality of pixels 50 are arranged. Also, the control circuit 10 includes a reading address control circuit 100. Also, in the solid-state imaging device 1 shown in FIG. 1, an example of the pixel array section 40 in which the plurality of pixels 50 are two-dimensionally arranged in 7 rows and 8 columns is shown.

Each pixel 50 arranged within the pixel array section 40 generates a charge signal obtained by photoelectric conversion of incident light (a light beam). The pixels 50 arranged within the pixel array section 40 include a pixel 50 configured to generate a charge signal in normal photographing and a pixel 50 configured to generate a charge signal for motion detection.

The pixel 50 configured to generate a charge signal in the normal photographing outputs a pixel signal according to the generated charge signal to a vertical signal line 60 for each row through active pixel sensor (APS) reading (hereinafter, referred to as "normal reading") according to a control signal input from the vertical scanning circuit 20. Pixel signals of rows output to the vertical signal line 60 are output outside the solid-state imaging device 1 in accordance with control by the horizontal scanning circuit 30. In other words, the pixel signal of the pixel 50 configured to generate a charge signal in the normal photographing is output outside the solid-state imaging device 1 for each frame in the normal photographing. In the following description, the pixel 50 configured to generate a charge signal in the normal photographing (i.e., the pixel 50 configured to output a pixel signal of the normal photographing) is referred to as a "normal pixel 51".

Also, in addition to sequentially outputting the pixel signals outside the solid-state imaging device 1 for each frame, the normal pixel 51 can output the pixel signal from the designated normal pixel 51 outside the solid-state imaging device 1. Also, designation of the normal pixel 51 configured to output the pixel signal is performed by the control circuit 10 controlling the vertical scanning circuit 20 and the horizontal scanning circuit 30. Also, at this time, the method of designating the normal pixel 51 configured to output the pixel signal may be either a method of directly designating each normal pixel 51 or a method of designating a region in which the normal pixel 51 is arranged.

The pixel 50 configured to generate a charge signal for motion detection outputs a pulse signal representing a change over time in a charge signal and a change direction without being synchronous with the driving of the normal pixel 51 by the vertical scanning circuit 20 according to address event representation (AER) reading (hereinafter referred to as "motion detection reading"). In other words, the pixel 50 configured to generate a charge signal for motion detection asynchronously outputs a pulse signal indicating a change over time in the charge signal and a change direction. At this time, the pixel 50 configured to generate a charge signal for motion detection adds address information indicating a position of the pixel 50 itself to the pulse signal and outputs the pulse signal with the address information as a pixel signal. In the following description, the pixel 50 configured to generate a charge signal for motion detection (i.e., the pixel 50 configured to output a pixel signal of motion detection) is referred to as a "motion detection pixel 52". In the solid-state imaging device 1, the motion detection pixel 52 outputs a pixel signal of motion detection to the control circuit 10.

A circuit element constituting each of the normal pixel 51 and the motion detection pixel 52 is formed on either one or both of the first semiconductor substrate 11 and the second semiconductor substrate 12 and is connected within the pixel array section 40 by the chip connection section 13.

The control circuit 10 controls the vertical scanning circuit 20 and the horizontal scanning circuit 30. When the control circuit 10 outputs (reads) the pixel signal of one frame from each normal pixel 51 through normal reading, the vertical scanning circuit 20 and the horizontal scanning circuit 30 perform control so that the normal pixels 51 are sequentially driven. Also, when the control circuit 10 designates the normal pixel 51 and outputs (reads) the pixel signal, the vertical scanning circuit 20 and the horizontal scanning circuit 30 perform control so that the normal pixel 51 arranged at the designated position in the pixel array section 40 is driven. Also, in the control circuit 10, the reading address control circuit 100 controls designation of the normal pixel 51 when the normal pixel 51 is designated and the pixel signal is output (read).

The reading address control circuit 100 designates the normal pixel 51 configured to output (read) pixel signals of the normal photographing on the basis of the address information included in pixel signals of the motion detection output from motion detection pixels 52 arranged within the pixel array section 40. At this time, the reading address control circuit 100 designates the normal pixel 51 arranged in a predetermined region (hereinafter referred to as a "reading region") around a position at which the motion detection pixel 52 indicated by the address information is arranged. Also, a detailed description of a method of designating the normal pixel 51 when the pixel signal of the normal photographing by the reading address control circuit 100 is output will be described below.

The vertical scanning circuit 20 is a driving circuit configured to control each normal pixel 51 within the pixel array section 40 and output a pixel signal of each normal pixel 51 to the vertical signal line 60 in accordance with control from the control circuit 10. When the control circuit 10 performs control so that normal pixels 51 are sequentially driven to output (read) pixel signals of one frame, the vertical scanning circuit 20 outputs a control signal for driving the normal pixels 51 for each row of the normal pixels 51 provided in the pixel array section 40. When the normal pixel 51 to be driven by the control circuit 10 (i.e., the reading address control circuit 100) is designated, the vertical scanning circuit 20 outputs a control signal for driving the normal pixel 51 to the row of the pixel array section 40 in which the designated normal pixel 51 is arranged.

The horizontal scanning circuit 30 is a driving circuit configured to output the pixel signals of the rows output from the normal pixels 51 provided in the pixel array section 40 outside the solid-state imaging device 1. When the control circuit 10 performs control so that the normal pixels 51 are sequentially driven by the control circuit 10 to output (read) the pixel signals of one frame, the horizontal scanning circuit 30 sequentially outputs the pixel signals, which have been output from the normal pixels 51 for each row, for each column of the normal pixels 51 provided in the pixel array section 40. Also, when the normal pixel 51 to be driven by the control circuit 10 (i.e., the reading address control circuit 100) is designated, the horizontal scanning circuit 30 outputs the pixel signal of the column of the pixel array section 40 where the designated normal pixel 51 is arranged.

Figure 3A:
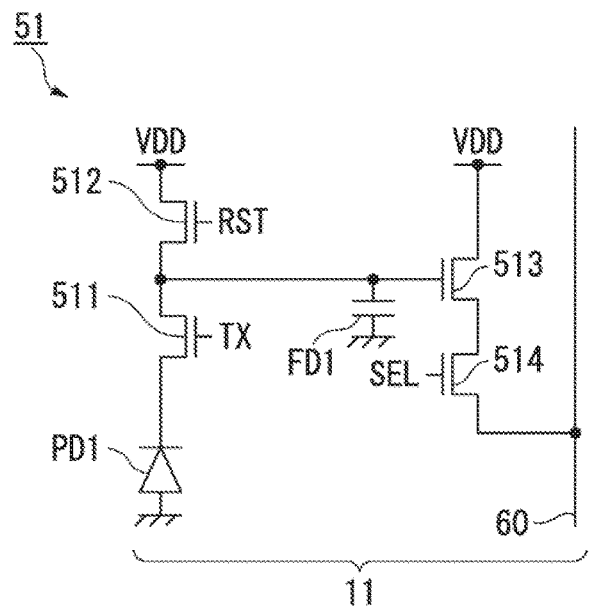
FIG. 3A is a circuit diagram showing an example of a configuration of a pixel in the solid-state imaging device according to the first embodiment of the present invention.
Figure 3B:
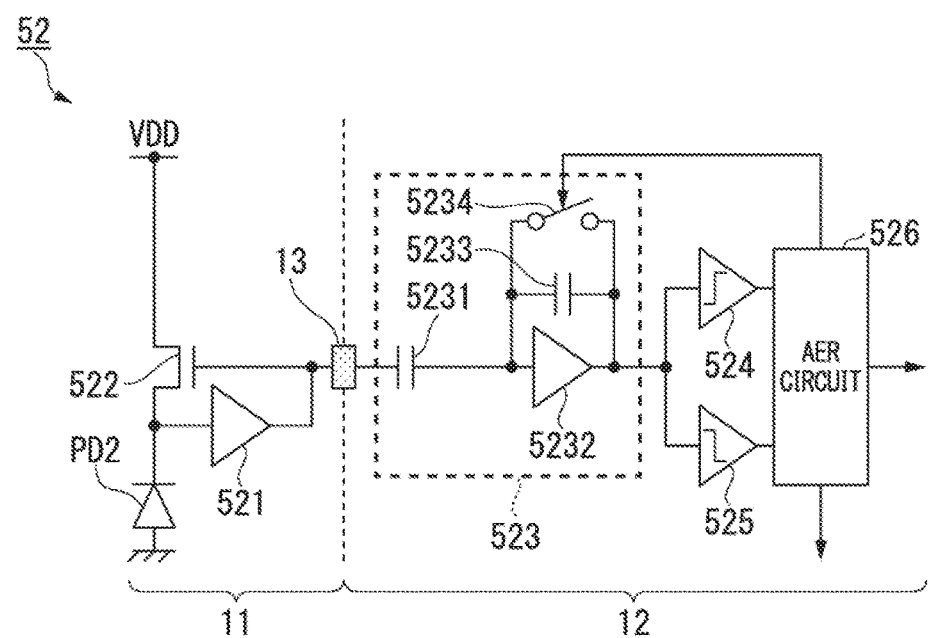
FIG. 3B is a circuit diagram showing an example of a configuration of a pixel in the solid-state imaging device according to the first embodiment of the present invention.

Next, the configurations of the normal pixel 51 and the motion detection pixel 52 arranged within the pixel array section 40 in the solid-state imaging device 1 of the first embodiment will be described. FIG. 3A and FIG. 3B are circuit diagrams showing an example of the configurations of the pixels 50 (the normal pixel 51 and the motion detection pixel 52) in the solid-state imaging device 1 according to the first embodiment of the present invention. An example of the configuration of the normal pixel 51 arranged in the pixel array section 40 of the solid-state imaging device 1 is shown in FIG. 3A. An example of the configuration of the motion detection pixel 52 arranged within the pixel array section 40 of the solid-state imaging device 1 is shown in FIG. 3B.

First, the configuration of the normal pixel 51 will be described with reference to FIG. 3A. In FIG. 3A, a normal pixel 51 includes a photoelectric conversion element PD1, a charge transfer transistor 511, a pixel reset transistor 512, an amplification transistor 513, and a selection transistor 514. In FIG. 3A, a node capacitor FD1, which is a capacitor associated with a node connected to a gate terminal of the amplification transistor 513 provided in the normal pixel 51, is indicated by a symbol of a capacitor serving as a circuit element of the normal pixel 51.

In the normal pixel 51, the charge transfer transistor 511, the pixel reset transistor 512, the amplification transistor 513, the selection transistor 514, and the node capacitor FD1 constitute a reading circuit configured to read a pixel signal according to the charge signal generated by the photoelectric conversion element PD1. In the solid-state imaging device 1, the photoelectric conversion element PD1 and the reading circuit are formed on the first semiconductor substrate 11.

The photoelectric conversion element PD1 is a photodiode configured to photoelectrically convert incident light (a light beam), generate a charge signal, and store the generated charge signal.

The charge transfer transistor 511 transfers the charge signal generated and accumulated by the photoelectric conversion element PD1 to the gate terminal of the amplification transistor 513 in accordance with a control signal TX input from the vertical scanning circuit 20. Thereby, the charge signal transferred by the charge transfer transistor 511 is stored in the node capacitor FD1.

The amplification transistor 513 outputs a signal voltage corresponding to the charge signal transferred to the gate terminal (i.e., the charge signal stored in the node capacitor FD1) to the selection transistor 514.

The pixel reset transistor 512 resets the charge signal within the normal pixel 51 to a power supply voltage VDD in accordance with a control signal RST input from the vertical scanning circuit 20.

The selection transistor 514 outputs a signal voltage output from the amplification transistor 513 to the vertical signal line 60 as a pixel signal of the normal pixel 51 in accordance with a control signal SEL input from the vertical scanning circuit 20. Thereby, the pixel signal corresponding to the charge signal generated by the photoelectric conversion element PD1 included in the normal pixel 51 is read to the vertical signal line 60.

According to such a configuration, in the normal pixel 51, each signal voltage according to the charge signal obtained through photoelectric conversion of the light incident on the photoelectric conversion element PD1 is read as a pixel signal to the vertical signal line 60.

Subsequently, the configuration of the motion detection pixel 52 will be described with reference to FIG. 3B. In FIG. 3B, the motion detection pixel 52 includes a photoelectric conversion element PD2, an amplifier 521, a bias transistor 522, a switched capacitor amplifier circuit 523, a threshold amplifier 524, a threshold amplifier 525, and an AER circuit 526. Also, the switched capacitor amplifier circuit 523 includes a capacitor 5231, an amplifier 5232, a capacitor 5233, and a switch 5234.

In the motion detection pixel 52, the amplifier 521 and the bias transistor 522 constitute an output circuit configured to output the charge signal generated by the photoelectric conversion element PD2. Also, in the motion detection pixel 52, the switched capacitor amplifier circuit 523, the threshold amplifier 524, the threshold amplifier 525, and the AER circuit 526 constitute a reading circuit configured to read the charge signal generated by the photoelectric conversion element PD2. In the solid-state imaging device 1, the photoelectric conversion element PD2 and the output circuit are formed on the first semiconductor substrate 11 and the reading circuit is formed on the second semiconductor substrate 12.

Similar to the photoelectric conversion element PD1 provided in the normal pixel 51, the photoelectric conversion element PD2 is a photodiode configured to photoelectrically convert incident light (a light beam) to generate a charge signal and store the generated charge signal. The photoelectric conversion element PD2 sequentially outputs the generated charge signal to the amplifier 521.

The amplifier 521 amplifies the charge signal generated and output by the photoelectric conversion element PD2. The amplifier 521 outputs the amplified charge signal to the switched capacitor amplifier circuit 523 via the chip connection section 13. Thereby, the change in the charge signal generated by the photoelectric conversion element PD2 is input to the switched capacitor amplifier circuit 523. Also, the amplifier 521 transfers the amplified charge signal to the gate terminal of the bias transistor 522.

The bias transistor 522 performs control so that a current flowing through the photoelectric conversion element PD2 becomes a constant current in accordance with the charge signal transferred to the gate terminal thereof. Thereby, if the charge signal generated by the photoelectric conversion element PD2 changes, the magnitude of the charge signal is stabilized at a magnitude after the change is sequentially made. In other words, an output of the photoelectric conversion element PD2 is clipped.

The switched capacitor amplifier circuit 523 converts a change in the charge signal input from the amplifier 521 via the chip connection section 13 into a voltage signal in a predetermined voltage range and outputs the voltage signal to each of the threshold amplifier 524 and the threshold amplifier 525. In other words, the switched capacitor amplifier circuit 523 converts an increase/decrease of the charge signal generated by the photoelectric conversion element PD2 into a voltage signal of a predetermined voltage range, and outputs the voltage signal to each of the threshold amplifier 524 and the threshold amplifier 525. Also, the operation of the switched capacitor amplifier circuit 523 is reset by the AER circuit 526.

More specifically, the charge signal input from the amplifier 521 via the chip connection section 13 is input to a first terminal of the capacitor 5231 and stored. Thereby, a voltage signal having a voltage according to the stored charge signal is output from a second terminal of the capacitor 5231 and output to the amplifier 5232.

The amplifier 5232 amplifies the voltage of the input voltage signal and outputs the amplified voltage signal as an output of the switched capacitor amplifier circuit 523 through the threshold amplifier 524 and the threshold amplifier 525. Also, the voltage signal output from the amplifier 5232 is input to a first terminal of the capacitor 5233 and stored. Thereby, a signal of a voltage according to the stored voltage signal is output as a feedback signal from a second terminal of the capacitor 5233 to the amplifier 5232. Then, the amplifier 5232 continuously outputs a voltage signal of a constant voltage according to the voltage of the feedback signal. In other words, the amplifier 5232 continuously outputs a voltage signal of a voltage according to the charge signal input from the amplifier 521 to the switched capacitor amplifier circuit 523 via the chip connection section 13 to the threshold amplifier 524 and the threshold amplifier 525. Here, the voltage signal output by the amplifier 5232 to each of the threshold amplifier 524 and the threshold amplifier 525 is a signal of a voltage indicating an increased/decreased magnitude of the charge signal generated by the photoelectric conversion element PD2.

Also, the output terminal of the amplifier 5232 (which is also the first terminal of the capacitor 5233) is connected to a first terminal of the switch 5234 and the input terminal of the amplifier 5232 (which is also the second terminal of the capacitor 5233) is connected to a second terminal of the switch 5234. A short circuit and an open circuit of the switch 5234 are controlled by a reset signal output from the AER circuit 526 and input to a control terminal. When the switch 5234 is controlled so that it is short-circuited by the reset signal output from the AER circuit 526, the switch 5234 short-circuits the first terminal and the second terminal. Thereby, both the terminals of the capacitor 5233 are short-circuited, the voltages of both terminals of the capacitor 5233 are reset to the same voltage and an operation in which the amplifier 5232 amplifies the voltage signal is also reset.

Also, although the switched capacitor amplifier circuit 523 including the capacitor 5231, the amplifier 5232, the capacitor 5233, and the switch 5234 is shown in FIG. 3B, the configuration of the switched capacitor amplifier circuit 523 is not limited to the configuration shown in FIG. 3B.

Each of the threshold amplifier 524 and the threshold amplifier 525 detects a change in the voltage of the voltage signal input from the amplifier 5232 within the switched capacitor amplifier circuit 523 and a change direction.

More specifically, each of the threshold amplifier 524 and the threshold amplifier 525 compares the voltage of the voltage signal input from the amplifier 5232 within the switched capacitor amplifier circuit 523 with a predetermined threshold voltage (a threshold voltage). Each of the threshold amplifier 524 and the threshold amplifier 525 outputs an event signal indicating that there is a change exceeding the threshold voltage to the AER circuit 526 if the voltage of the input voltage signal exceeds the threshold voltage.

Also, in each of the threshold amplifier 524 and the threshold amplifier 525, either one of a predetermined positive voltage and a predetermined negative voltage is set as the threshold voltage. In the configuration shown in FIG. 3B, a voltage in the positive direction of a predetermined voltage value is set as the threshold voltage in the threshold amplifier 524 and a voltage in the negative direction of a predetermined voltage value is set as a threshold voltage in the threshold amplifier 525. Thus, the threshold amplifier 524 detects whether or not the voltage of the voltage signal input from the amplifier 5232 has changed in the positive direction (an increasing direction) more than the threshold voltage in the positive direction. Also, the threshold amplifier 525 detects whether or not the voltage of the voltage signal input from the amplifier 5232 has changed in the negative direction (a decreasing direction) more than the threshold voltage in the negative direction.

In this manner, a change exceeding the threshold voltage of the voltage signal converted into the predetermined voltage range by the switched capacitor amplifier circuit 523 and a change direction are detected according to the configurations of the threshold amplifier 524 and the threshold amplifier 525. This corresponds to detecting the change in the charge signal generated by the photoelectric conversion element PD2 exceeding the predetermined threshold value and the change direction. The event signal output by each of the threshold amplifier 524 and the threshold amplifier 525 to the AER circuit 526 indicates the change in the charge signal generated by the photoelectric conversion element PD2 and the change direction (the positive direction or the negative direction). In other words, when the threshold amplifier 524 outputs the event signal, this means that the charge signal generated by the photoelectric conversion element PD2 has changed beyond a predetermined threshold value in the positive direction. On the other hand, if the threshold amplifier 525 outputs the event signal, this means that the charge signal generated by the photoelectric conversion element PD2 has changed beyond a predetermined threshold value in the negative direction.

Also, in the configuration shown in FIG. 3B, a change over time in the charge signal generated by the photoelectric conversion element PD2 is detected by the configurations of the switched capacitor amplifier circuit 523, the threshold amplifier 524, and the threshold amplifier 525. However, the configuration in which the change over time in the charge signal generated by the photoelectric conversion element PD2 is detected is not limited to the configuration shown in FIG. 3B. For example, the threshold amplifier 524 and the threshold amplifier 525 may be configured to detect the change over time in the charge signal generated by the photoelectric conversion element PD2.

On the basis of the event signal input from each of the threshold amplifier 524 and the threshold amplifier 525, the AER circuit 526 determines the positive direction or the negative direction in which the charge signal generated by the photoelectric conversion element PD2 has changed. In other words, the AER circuit 526 determines the increase/decrease in the magnitude of the charge signal on the basis of the event signal input from each of the threshold amplifier 524 and the threshold amplifier 525. Then, the AER circuit 526 generates a pulse signal indicating a determination result. For example, the AER circuit 526 generates a pulse signal of the positive direction if the charge signal generated by the photoelectric conversion element PD2 changes in the positive direction (the increasing direction) and generates a pulse signal of the negative direction if the charge signal generated by the photoelectric conversion element PD2 changes in the negative direction (the decreasing direction). Then, the AER circuit 526 adds address information indicating the position of the motion detection pixel 52 itself to the generated pulse signal and outputs the pulse signal with the address information as a pixel signal. In the following description, the pixel signal output from the AER circuit 526 (i.e., the motion detection pixel 52) is referred to as an "event pixel signal" in order to distinguish the event pixel signal from the pixel signal output by the normal pixel 51.

According to such a configuration, in the motion detection pixel 52, the photoelectric conversion element PD2 detects a change in the charge signal obtained by photoelectrically converting incident light and a change direction and outputs detected information and address information indicating a position of the motion detection pixel 52 for each motion detection pixel 52.

Then, in the solid-state imaging device 1, the reading address control circuit 100 outputs (reads) a pixel signal from the normal pixel 51 arranged in a predetermined reading region around a position at which the motion detection pixel 52 indicated by the address information (i.e., the motion detection pixel 52 detecting the motion of the object) is arranged on the basis of the address information included in the event pixel signal output from the motion detection pixel 52.

Also, although the motion detection pixel 52 outputs the event pixel signal for each motion detection pixel 52 to the reading address control circuit 100 as described above, a configuration in which each motion detection pixel 52 outputs the event pixel signal to the reading address control circuit 100 is not limited. For example, each motion detection pixel 52 may be configured to output the event pixel signal via the horizontal scanning circuit 30.

Also, although a configuration in which the AER circuit 526 outputs the pulse signal as the event pixel signal by adding the address information to the generated pulse signal is shown in the motion detection pixel 52, a configuration in which the address information is added to the pulse signal is not limited to the AER circuit 526. For example, a component (not shown) included in the solid-state imaging device 1 may be configured to add address information indicating a position of the motion detection pixel 52 having output the pulse signal to the pulse signal output by the AER circuit 526 provided in each motion detection pixel 52 and output the pulse signal with the address information as an event pixel signal.

Also, in the motion detection pixel 52, a configuration in which the switched capacitor amplifier circuit 523 converts the charge signal generated by the photoelectric conversion element PD2 into a voltage signal in a predetermined voltage range after amplifying the charge signal is shown. However, in the motion detection pixel 52, the configuration in which the charge signal generated by the photoelectric conversion element PD2 is converted into the voltage signal in the predetermined voltage range is not limited to the configuration according to the switched capacitor amplifier circuit 523. For example, the motion detection pixel 52 may be replaced with a configuration in which the amplifier 5232 provided in the switched capacitor amplifier circuit 523 is not provided, i.e., a configuration in which a so-called switched capacitor circuit converts the charge signal generated by the photoelectric conversion element PD2 into a voltage signal of a predetermined voltage range. In this case, the motion detection pixel 52 may detect a change over time in the charge signal generated by the photoelectric conversion element PD2 according to the configurations of the switched capacitor circuit, the threshold amplifier 524, and the threshold amplifier 525.

Figure 4:
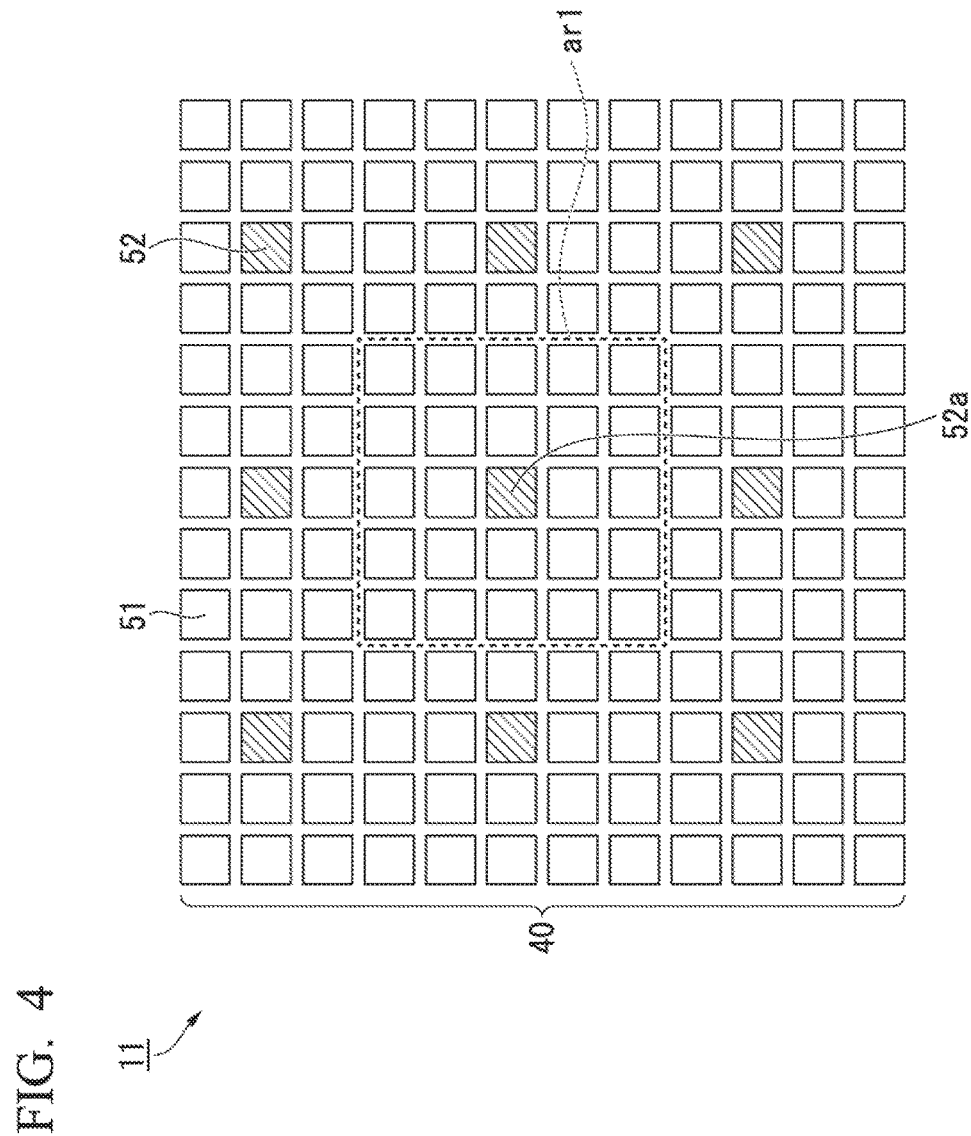
FIG. 4 is a diagram schematically showing an example of an arrangement of pixels and a region in which a pixel configured to output a pixel signal is designated in the solid-state imaging device according to the first embodiment of the present invention.

Next, an example of the arrangement of the normal pixels 51 and the motion detection pixels 52 within the pixel array section 40 in the solid-state imaging device 1 of the first embodiment and a method of designating the normal pixels 51 configured to output pixel signals will be described. FIG. 4 is a diagram schematically showing an example of an arrangement of the pixels 50 (normal pixels 51 and motion detection pixels 52) and a region (a reading region) in which the pixels 50 (normal pixels 51) configured to output pixel signals are designated in the solid-state imaging device 1 according to the first embodiment of the present invention. An example in which the pixels 50 (the normal pixels 51 and the motion detection pixels 52) are arranged in the region of the pixel array section 40 of the first semiconductor substrate 11 constituting the solid-state imaging device 1 is shown in FIG. 4.

In the solid-state imaging device 1, the pixels 50, i.e., the normal pixels 51 and the motion detection pixels 52, are arranged on a planar form. At this time, in the solid-state imaging device 1, as described above, the normal pixels 51 are formed on the first semiconductor substrate 11 and the motion detection pixels 52 are divided and formed on the first semiconductor substrate 11 and the second semiconductor substrate 12.

More specifically, as shown in FIG. 4, in a plane region of the pixel array section 40 of the first semiconductor substrate 11, the normal pixels 51 (the photoelectric conversion elements PD1 and the reading circuits) and the photoelectric conversion elements PD2 and the output circuits of the motion detection pixels 52 are periodically arranged in a row direction and a column direction. At this time, as shown in FIG. 4, more normal pixels 51 are arranged than the motion detection pixels 52. In FIG. 4, the normal pixels 51 are uniformly arranged in the entire plane region of the pixel array section 40 and the normal pixels 51 arranged at predetermined intervals (every four normal pixels 51 in FIG. 4) are replaced with the photoelectric conversion element PD2 and the output circuit of the motion detection pixel 52.

Also, in the plane region of the pixel array section 40 of the second semiconductor substrate 12, the reading circuits of the motion detection pixels 52 corresponding to the photoelectric conversion elements PD2 and the reading circuits of the motion detection pixels 52 arranged on the first semiconductor substrate 11 are uniformly arranged in the entire plane region of the pixel array section 40. At this time, the reading circuits of the motion detection pixels 52 are formed to include the plane region of the pixel array section 40 of the second semiconductor substrate 12 corresponding to the normal pixels 51 arranged on the first semiconductor substrate 11. In other words, because the solid-state imaging device 1 includes circuit elements greater in number than the normal pixels 51 in the solid-state imaging device 1, the motion detection pixels 52 that require a large region during formation are formed using a region of the second semiconductor substrate 12 unused to form the normal pixels 51. More specifically, in the second semiconductor substrate 12 stacked on an opposite surface a surface on which light is incident on the normal pixel 51, the reading circuit of the motion detection pixel 52 is formed to include a region overlapping that of the normal pixel 51 formed on the first semiconductor substrate 11. Then, the output circuit formed on the first semiconductor substrate 11 and the reading circuit formed on the second semiconductor substrate 12 is electrically connected by the chip connection section 13.

As shown in FIG. 4, in the solid-state imaging device 1, normal pixels 51 greater in number than motion detection pixels 52 are arranged. In other words, in the solid-state imaging device 1, the number of motion detection pixels 52 arranged within the pixel array section 40 is less than the number of normal pixels 51. However, in the detection of the motion of the object, a resolution, i.e., the quality of an image, as high as in an image generated in the normal photographing is not required. Rather, in motion detection in which the motion of the object is sequentially detected, it is desirable for the photoelectric conversion element PD2 of the motion detection pixel 52 to generate a charge signal and perform motion detection for a short time. On the other hand, in the solid-state imaging device 1, it is desirable to increase the number of pixels in the normal photographing by increasing the number of normal pixels 51 provided within the pixel array section 40. In the solid-state imaging device 1, by further increasing the number of the normal pixels 51 arranged within the pixel array section 40, it is possible to adopt a configuration in which the quality of an image generated in the normal photographing can be improved, i.e., a high-definition output can be obtained. More specifically, in order to form each of the normal pixel 51 specialized for outputting a pixel signal in the normal photographing and the motion detection pixel 52 specialized for outputting an event pixel signal in the motion detection within the pixel array section 40 in the solid-state imaging device 1, a configuration in which the normal pixels 51 may be formed with higher definition and more normal pixels 51 than in the example of the arrangement shown in FIG. 4 are arranged may be adopted.

When an event pixel signal is input from any one motion detection pixel 52 arranged as shown in FIG. 4 to the reading address control circuit 100 in the control circuit 10 in the solid-state imaging device 1, the reading address control circuit 100 outputs (reads) a pixel signal from the normal pixel 51 arranged in a predetermined neighboring region (reading region) around the position of the motion detection pixel 52 having output the event pixel signal on the basis of the address information included in the event pixel signal. For example, in an example of the arrangement of the pixels 50 (the normal pixel 51 and the motion detection pixel 52) shown in FIG. 4, a case in which the event pixel signal is input from the motion detection pixel 52a arranged in a 7th column of a 6th row to the reading address control circuit 100 is conceivable. In this case, the reading address control circuit 100 outputs (reads) the pixel signal from the normal pixel 51 arranged in a predetermined rectangular reading region ar1 of 5 rows and 5 columns around the position of the motion detection pixel 52a.

Also, in the solid-state imaging device 1, the normal pixels 51 perform exposure for the normal photographing at a predetermined cycle (frame rate). In other words, in the normal pixel 51, the photoelectric conversion of incident light (a light beam) by the photoelectric conversion element PD1, the transfer of the charge signal generated by the photoelectric conversion element PD1 by the charge transfer transistor 511 to the node capacitor FD1, and the resetting of the charge signal stored in the node capacitor FD1 by the pixel reset transistor 512 are periodically iterated. Accordingly, if the reading address control circuit 100 designates the normal pixel 51 in the reading region ar1 as the normal pixel 51 configured to output (read) the pixel signal, the designated normal pixel 51 outputs (reads) a signal voltage according to the charge signal obtained by the most recent exposure which is periodically performed as a pixel signal. Also, the most recent exposure may be an immediately previous exposure already completed when the normal pixel 51 is designated by the reading address control circuit 100 or an exposure immediately after the designation by the reading address control circuit 100 ends. Accordingly, in the following description, an exposure timing for obtaining the pixel signal output by the designated normal pixel 51 is not particularly specified.

(First Pixel Designation Method)

Figure 5:
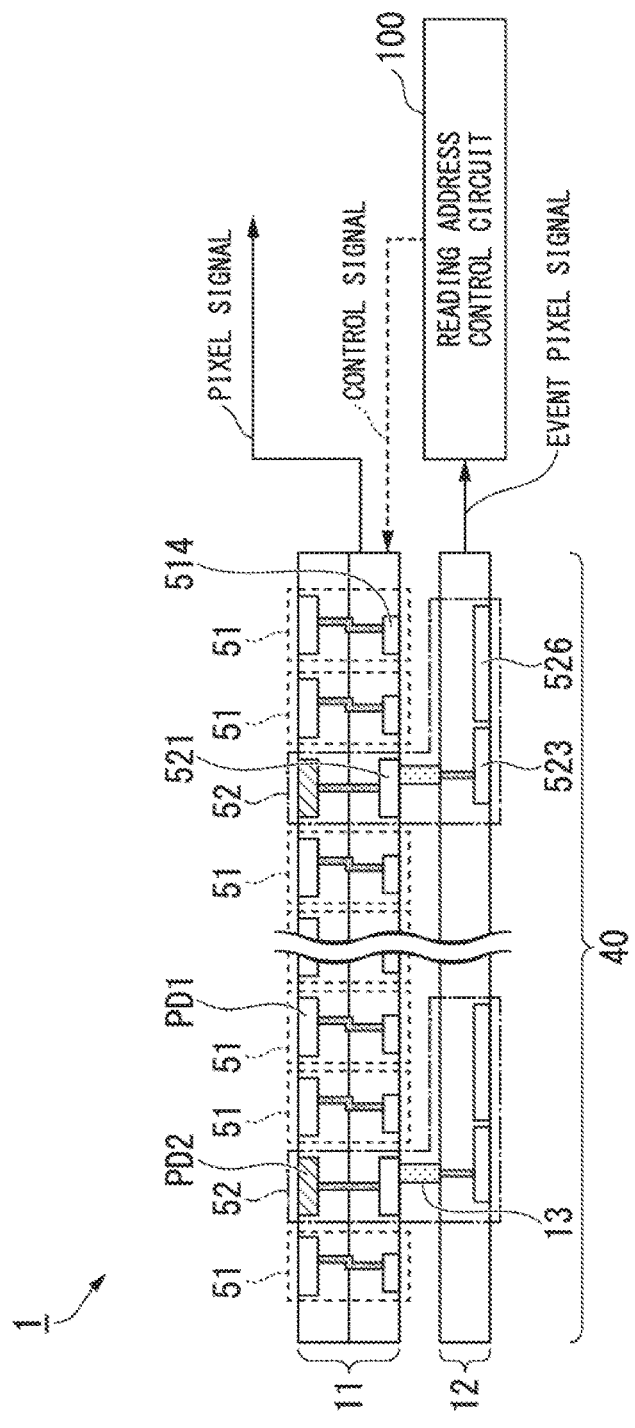
FIG. 5 is a diagram showing a configuration in which pixel signals are output in the solid-state imaging device according to the first embodiment of the present invention.

Next, a method of designating the normal pixels 51 in the solid-state imaging device 1 of the first embodiment will be described. FIG. 5 is a diagram showing a configuration in which pixel signals are output in the solid-state imaging device 1 according to the first embodiment of the present invention. A vertical structure of a part of the pixel array section 40 when the normal pixels 51 and the motion detection pixels 52 are arranged as shown in FIG. 4 in the solid-state imaging device 1 and the reading address control circuit 100 provided in the control circuit 10 are shown in FIG. 5. More specifically, signals exchanged between the normal pixels 51 formed on the first semiconductor substrate 11, the motion detection pixels 52 formed on the first semiconductor substrate 11 and the second semiconductor substrate 12, and the reading address control circuit 100 are shown.

As described above, in the solid-state imaging device 1, the photoelectric conversion element PD1 and the reading circuit of the normal pixel 51 are formed on the first semiconductor substrate 11. In FIG. 5, a state in which the photoelectric conversion element PD1 of the normal pixel 51 and the selection transistor 514 provided in the reading circuit of the normal pixel 51 are formed on the first semiconductor substrate 11 is shown.

Also, as described above, in the solid-state imaging device 1, the photoelectric conversion element PD2 and the output circuit of the motion detection pixel 52 are formed on the first semiconductor substrate 11, and the reading circuit is formed on the second semiconductor substrate 12. In FIG. 5, a state in which the photoelectric conversion element PD2 of the motion detection pixel 52 and the amplifier 521 provided in the output circuit are formed on the first semiconductor substrate 11, and the switched capacitor amplifier circuit 523 and the AER circuit 526 provided in the reading circuit of the motion detection pixel 52 are formed on the second semiconductor substrate 12 is shown.

At this time, in the solid-state imaging device 1, the reading circuit of the motion detection pixel 52 is formed in a region of the second semiconductor substrate 12 including a region overlapping that of the normal pixel 51 formed on the first semiconductor substrate 11. In FIG. 5, a state in which the switched capacitor amplifier circuit 523 and the AER circuit 526 provided in the reading circuit of the motion detection pixel 52 are formed in a region of the second semiconductor substrate 12 including a region overlapping that of the normal pixel 51 formed on the first semiconductor substrate 11 is shown.

As described above, in the solid-state imaging device 1, the output circuit of the motion detection pixel 52 and the reading circuit of the motion detection pixel 52 corresponding thereto are electrically connected by the chip connection section 13 formed between the first semiconductor substrate 11 and the second semiconductor substrate 12. In FIG. 5, a state in which the amplifier 521 provided in the output circuit of the motion detection pixel 52 formed on the first semiconductor substrate 11 and the switched capacitor amplifier circuit 523 provided in the reading circuit of the motion detection pixel 52 formed on the second semiconductor substrate 12 are connected by the chip connection section 13 is shown.

As described above, when the AER circuit 526 of the motion detection pixel 52 formed on the second semiconductor substrate 12 detects a change over time in the charge signal generated by the photoelectric conversion element PD2 in the solid-state imaging device 1, an event pixel signal is output to the reading address control circuit 100.

When the event pixel signal is input, the reading address control circuit 100 detects (confirms) a position of the motion detection pixel 52 having output the event pixel signal from the address information included in the input event pixel signal. For example, when the event pixel signal is input from the motion detection pixel 52a shown in FIG. 4, the reading address control circuit 100 detects (confirms) that the motion detection pixel 52 having output the event pixel signal is a motion detection pixel 52a arranged in a 7th column of a 6th row from the address information included in the event pixel signal.

Then, the reading address control circuit 100 determines the region of the normal pixel 51 arranged in a predetermined region around the position of the detected (confirmed) motion detection pixel 52 as the reading region. Then, the reading address control circuit 100 outputs a control signal for designating the normal pixel 51 arranged within the determined reading region to the vertical scanning circuit 20 and the horizontal scanning circuit 30. For example, the reading address control circuit 100 determines a rectangular reading region ar1 of 5 rows and 5 columns around the position of the motion detection pixel 52a shown in FIG. 4 as a reading region for outputting (reading) pixel signals from the normal pixel 51. Then, the reading address control circuit 100 outputs a control signal for designating the normal pixel 51 arranged in the determined reading region ar1 to the vertical scanning circuit 20 and the horizontal scanning circuit 30.

Thereby, each of the vertical scanning circuit 20 and the horizontal scanning circuit 30 sequentially drives the designated normal pixels 51 and outputs (reads) pixel signals from the normal pixels 51 designated by the reading address control circuit 100. For example, when a control signal for designating the normal pixel 51 arranged within the reading region ar1 shown in FIG. 4 is input, each of the vertical scanning circuit 20 and the horizontal scanning circuit 30 outputs (reads) a pixel signal from each normal pixel 51 arranged within the reading region ar1 by sequentially driving the normal pixels 51 arranged within the reading region ar1.

As described above, in the solid-state imaging device 1, both the motion detection for sequentially detecting the motion of the object and the normal photographing are achieved by arranging each of the normal pixel 51 specialized for outputting a pixel signal in the normal photographing and the motion detection pixel 52 specialized for outputting an event pixel signal in the motion detection within the pixel array section 40. At this time, in the solid-state imaging device 1, the motion detection for sequentially detecting the motion of the object can be performed at an asynchronous timing irrespective of the normal reading in which pixel signals are sequentially read frame by frame in the normal photographing. In other words, in the solid-state imaging device 1, the normal reading and motion detection reading can be performed in the same period. In the solid-state imaging device 1, as in the example of the arrangement of the normal pixels 51 and the motion detection pixels 52 shown in FIG. 4, the number of normal pixels 51 arranged within the pixel array section 40 is set to be greater than the number of motion detection pixels 52. In other words, in the solid-state imaging device 1, the number of the normal pixels 51 to be arranged within the pixel array section 40 is increased by dividing and forming the motion detection pixels 52 arranged within the pixel array section 40 on the first semiconductor substrate 11 and the second semiconductor substrate 12. Thus, in the imaging system equipped with the solid-state imaging device 1, an image processing section configured to generate an image on the basis of the pixel signals in the normal photographing output from the solid-state imaging device 1 can generate higher-resolution images, i.e., higher-quality images.

Also, when an image according to each pixel signal is generated, the image processing section provided in the imaging system equipped with the solid-state imaging device 1 may generate an image including pixel signals of all pixels by interpolating a pixel signal (i.e., a pixel signal of a pixel which is deficient) of a position at which the motion detection pixel 52 is arranged in the solid-state imaging device 1. More specifically, when an image is generated from the pixel signal read from the normal pixel 51 through the normal reading, the pixel signal of the normal pixel 51 corresponding to the position at which the motion detection pixel 52 is arranged is interpolated on the basis of the pixel signal of the neighboring normal pixel 51. Also, in the present invention, a method in which the image processing section interpolates a pixel signal of each normal pixel 51 corresponding to the position at which the motion detection pixel 52 is arranged (an image interpolation calculation method) is not particularly defined.

Also, when an event pixel signal is output from the motion detection pixel 52 in the solid-state imaging device 1, a pixel signal is output (read) from the normal pixel 51 arranged within a predetermined reading region around the position of the motion detection pixel 52 having output the event pixel signal as in a first pixel designation method. In other words, in the solid-state imaging device 1, pixel signals of the normal photographing are output (read) from only the normal pixels 51 arranged in a predetermined small reading region around a position at which the motion detection pixel 52 having detected the motion of the object is arranged. Thereby, in the solid-state imaging device 1, it is possible to reduce power consumption as compared with reading all the pixel signals obtained through the normal photographing to generate an image reflecting the motion of the object as in the conventional solid-state imaging device.

Also, the image processing section provided in the imaging system equipped with the solid-state imaging device 1 generates an image reflecting the motion of the object on the basis of a pixel signal of a small reading region in which the motion of the object output (read) in the first pixel designation method is detected. In other words, the image processing section generates an image reflecting the motion of the object by generating an image by replacing a small number of pixel signals corresponding to a small reading region in which motion is detected within pixel signals of one frame already acquired from the solid-state imaging device 1.

Also, in the first pixel designation method, when one motion detection pixel 52 outputs an event pixel signal, a method of designating the normal pixel 51 configured to read the pixel signal on the basis of a position at which the motion detection pixel 52 having output the event pixel signal is arranged is shown. However, as described above, in the solid-state imaging device 1, it is possible to sequentially perform motion detection in which the motion of the object is detected. Therefore, it is conceivable that a plurality of motion detection pixels 52 detect motion of an object in the same period.

Figure 6:
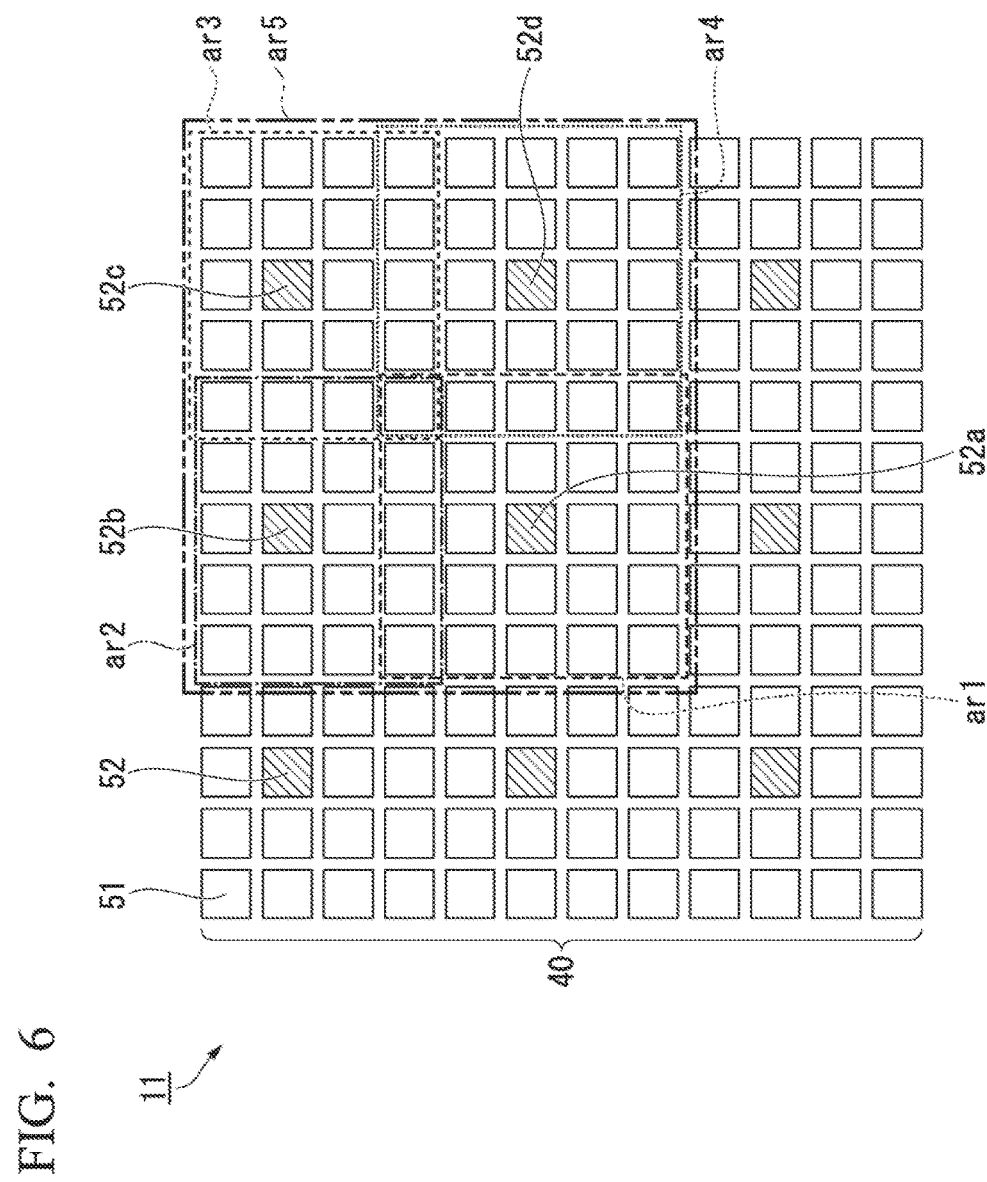
FIG. 6 is a diagram schematically showing an example of a region in which a pixel configured to output a pixel signal is designated in the solid-state imaging device according to the first embodiment of the present invention.

Here, a method of determining a reading region in which the reading address control circuit 100 outputs (reads) the pixel signal when the event pixel signal is output from a plurality of motion detection pixels 52 in the same period will be described. FIG. 6 is a diagram schematically showing an example of a region (reading region) in which the pixel 50 (a normal pixel 51) configured to output a pixel signal is designated in the solid-state imaging device 1 according to the first embodiment of the present invention. In FIG. 6, if pixels 50 (normal pixels 51 and motion detection pixels 52) are arranged within the region of the pixel array section 40 of the first semiconductor substrate 11 constituting the solid-state imaging device 1 as shown in FIG. 4, an example of a method of determining a reading region in which normal pixels 51 configured to output pixel signals are arranged when event pixel signals are output from a plurality of motion detection pixels 52 in the same period is shown.

In an example of the arrangement of the pixels 50 (normal pixels 51 and motion detection pixels 52) shown in FIG. 6, a case in which the event pixel signals are output in the same period from a motion detection pixel 52a arranged in a 7th column of a 6th row, a motion detection pixel 52b arranged in a 7th column of a 2nd row, a motion detection pixel 52c arranged in an 11th column of the 2nd row, and a motion detection pixel 52d arranged in the 11th column of the 6th row is conceivable. In this case, the reading address control circuit 100 determines reading regions of a predetermined rectangular reading region ar1 of 5 rows and 5 columns around a position of the motion detection pixel 52a, a predetermined rectangular reading region ar2 of 5 rows and 5 columns around a position of the motion detection pixel 52b, a predetermined rectangular reading region ar3 of 5 rows and 5 columns around a position of the motion detection pixel 52c, and a predetermined rectangular reading region ar4 of 5 rows and 5 columns around a position of the motion detection pixel 52d.

However, as shown in FIG. 6, in the reading regions of the reading region ar1, the reading region ar2, the reading region ar3, and the reading region ar4, the same normal pixel 51 is included in adjacent reading regions. In other words, the normal pixels 51 arranged in the reading region overlap each other. In such a case, the reading address control circuit 100 determines a reading region in which pixel signals are read so that pixel signals are not redundantly read from the normal pixels 51 overlapping each other in the reading region. More specifically, as shown in FIG. 6, a rectangular reading region ar5 including all the rectangular reading regions (reading regions ar1 to ar4) corresponding to all the motion detection pixels 52 having output the event pixel signal is determined as a reading region in which the pixel signal is output (read) from the normal pixel 51. Then, the reading address control circuit 100 outputs a control signal for designating the normal pixel 51 arranged within the reading region ar5 to the vertical scanning circuit 20 and the horizontal scanning circuit 30.

Thereby, each of the vertical scanning circuit 20 and the horizontal scanning circuit 30 sequentially drives the normal pixels 51 within the designated reading region ar5 to sequentially output (read) pixel signals from the normal pixels 51 arranged within the reading region ar5.

As described above, if event pixel signals are output from a plurality of motion detection pixels 52 in the same period in the solid-state imaging device 1, the reading address control circuit 100 determines a reading region for designating the normal pixel 51 from which a pixel signal is read in accordance with a position at which each motion detection pixel 52 having output the event pixel signal is arranged in the first pixel designation method. Thereby, it is possible to reduce the power consumption without outputting (reading) pixel signals from overlapping normal pixels 51 a plurality of times in the solid-state imaging device 1.

A case in which a predetermined reading region in which the pixel signal is output (read) from the normal pixel 51 is a rectangular reading region of 5 rows and 5 columns around a position of the motion detection pixel 52a having output the event pixel signal has been described in the first pixel designation method. However, the size of the predetermined reading region in which the pixel signal is output (read) from the normal pixel 51 is not limited to the above-described 5 rows and 5 columns and various sizes (numbers of rows/columns) are conceivable in accordance with an arrangement of the normal pixels 51 and the motion detection pixels 52 within the pixel array section 40 or the like. Also, each reading region is not limited to a reading region in which adjacent reading regions overlap, i.e., a reading region including the same normal pixel 51.

Also, a case in which the reading address control circuit 100 determines a rectangular reading region for designating a normal pixel 51 from which a pixel signal is read on the basis of a position at which the motion detection pixel 52 having output the event pixel signal is arranged when one motion detection pixel 52 or a plurality of motion detection pixels 52 output an event pixel signal(s) in the first pixel designation method has been described. However, the position at which the motion detection pixel 52 having output the event pixel signal is arranged is not always arranged at a position at which the rectangular reading region can be constantly easily detected. Particularly, if event pixel signals are output from a plurality of motion detection pixels 52 in the same period, the reading address control circuit 100 is not always arranged at a position at which a rectangular reading region can be determined as shown in FIG. 6 according to a position at which the motion detection pixel 52 having output the event pixel signal is arranged. Therefore, the reading address control circuit 100 may be configured to change the method of determining the reading region for designating the normal pixel 51 from which the pixel signal is read in accordance with a position at which the motion detection pixel 52 having output the event pixel signal are arranged.

(Second Pixel Designation Method)

Figure 7:
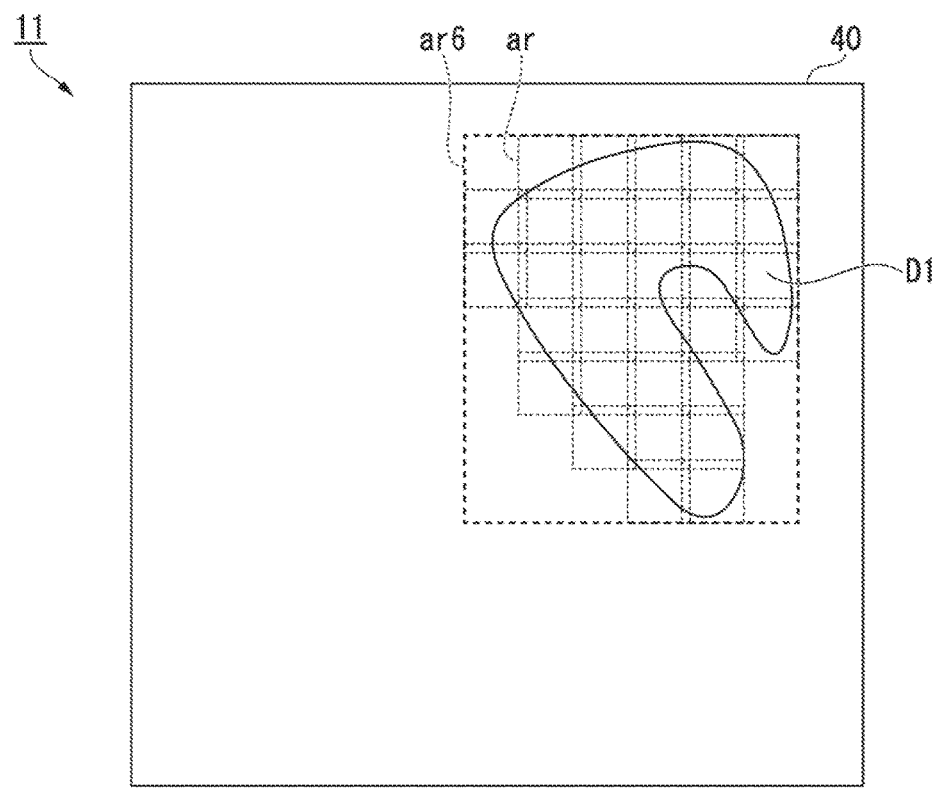
FIG. 7 is a diagram schematically showing another example of a region in which a pixel configured to output a pixel signal is designated in the solid-state imaging device according to the first embodiment of the present invention.

Next, another method of designating the normal pixel 51 in the solid-state imaging device 1 of the first embodiment will be described. FIG. 7 is a diagram schematically showing another example of a region (a reading region) in which the pixel 50 (a normal pixel 51) configured to output a pixel signal is designated in the solid-state imaging device 1 according to the first embodiment of the present invention. In FIG. 7, an example of a method of determining a reading region in which the normal pixel 51 configured to output the pixel signal is arranged if event pixel signals are output from a plurality of motion detection pixels 52 in the same period when the pixels 50 (the normal pixels 51 and the motion detection pixels 52) are arranged within the region of the pixel array section 40 of the first semiconductor substrate 11 constituting the solid-state imaging device 1.

Also, in FIG. 7, a motion detection pixel distribution D1 shows a range in which the motion detection pixels 52 having output the event pixel signals in the same period among the plurality of motion detection pixels 52 arranged in the entire region of the pixel array section 40 are distributed. Accordingly, the region of the motion detection pixel distribution D1 corresponds to the minimum reading region for designating the normal pixel 51 from which the reading address control circuit 100 reads the pixel signal.

As in the motion detection pixel distribution D1 shown in FIG. 7, a case in which a normal pixel 51 from which a pixel signal is read can be designated by combining a plurality of rectangular reading regions corresponding to motion detection pixels 52 having output event pixel signals (referred to as a "reading region ar" when rectangular reading regions corresponding to motion detection pixels 52) are indicated without distinguishing there between is conceivable. In this case, the designation method in which the reading address control circuit 100 designates the normal pixels 51 arranged in the region of the motion detection pixel distribution D1 becomes complicated even if the reading address control circuit 100 determines the region excluding the overlapping normal pixels 51 in each reading region ar as the reading region on the basis of a concept of the first pixel designation method. In other words, it is necessary to perform control in consideration of a timing of outputting a control signal for designating the normal pixels 51 arranged in the reading regions ar in order to efficiently read the pixel signals from the normal pixels 51. For example, it is also necessary for the reading address control circuit 100 to consider a timing at which a control signal for designating the normal pixels 51 arranged within the reading regions ar is output to read the pixel signals from the normal pixels 51. Thus, a case in which it is impossible to efficiently read the pixel signals from the normal pixels 51 arranged within the reading region ar corresponding to the motion detection pixels 52 distributed in a complicated shape as in the motion detection pixel distribution D1 is also conceivable.

Therefore, in the second pixel designation method in the reading address control circuit 100, a rectangular region including the motion detection pixel distribution D1 is determined as a reading region in which the pixel signal is output (read) from the normal pixel 51. More specifically, in the second pixel designation method, a rectangular reading region ar6 including all the rectangular reading regions ar corresponding to all the motion detection pixels 52 having output the event pixel signals is determined as a reading region in which pixel signals are output (read) from the normal pixels 51. In this case, for example, the reading address control circuit 100 obtains a position of an upper left normal pixel 51 and a position of a lower right normal pixel 51 between which all rectangular reading regions ar are included from the rectangular reading regions ar corresponding to motion detection pixels 52. Then, the reading address control circuit 100 determines the rectangular reading region ar6 indicated by the obtained positions of the upper left normal pixel 51 and the lower right normal pixel 51 as the reading region of the normal pixel 51 from which the pixel signal corresponding to the motion detection pixel distribution D1 is read.

Thereby, although the pixel signals are read from the normal pixels 51 arranged in the reading region which is larger than a minimum reading region for designating the normal pixel 51 from which the pixel signal is read, a process of outputting a control signal for designating the normal pixel 51 is simplified. Then, the reading address control circuit 100 outputs a control signal for designating the normal pixel 51 arranged within the reading region ar6 to the vertical scanning circuit 20 and the horizontal scanning circuit 30.

Each of the vertical scanning circuit 20 and the horizontal scanning circuit 30 sequentially drives the pixels from the normal pixel 51 of the upper left position (a start position) to the normal pixel 51 of the lower right position (an end position) and outputs (reads) the pixel signal from each normal pixel 51 arranged within the reading region ar6. Also, a method of outputting (reading) a pixel signal from a normal pixel 51 on the basis of the start position and the end position is a method that generally matches a pixel signal reading method capable of being generally performed in many solid-state imaging devices.

In this manner, when event pixel signals are output from a plurality of motion detection pixels 52 distributed in a complicated shape in the same period in the solid-state imaging device 1, the reading address control circuit 100 determines a rectangular region in which a process of outputting a control signal for designating a normal pixel 51 is simplified as a reading region for designating the normal pixel 51 from which a pixel signal is read in the second pixel designation method. Thereby, it is also possible to simplify a process when the image processing section provided in the imaging system equipped with the solid-state imaging device 1 is mounted generates an image reflecting the motion of the object.

Also, a case in which the motion detection pixel 52 configured to output the event pixel signal is one position in the entire region of the pixel array section 40 has been described in the first pixel designation method and the second pixel designation method. However, it is also conceivable that the motion detection pixels 52 configured to output the event pixel signals exist at a plurality of positions within the entire region of the pixel array section 40.

Figure 8:
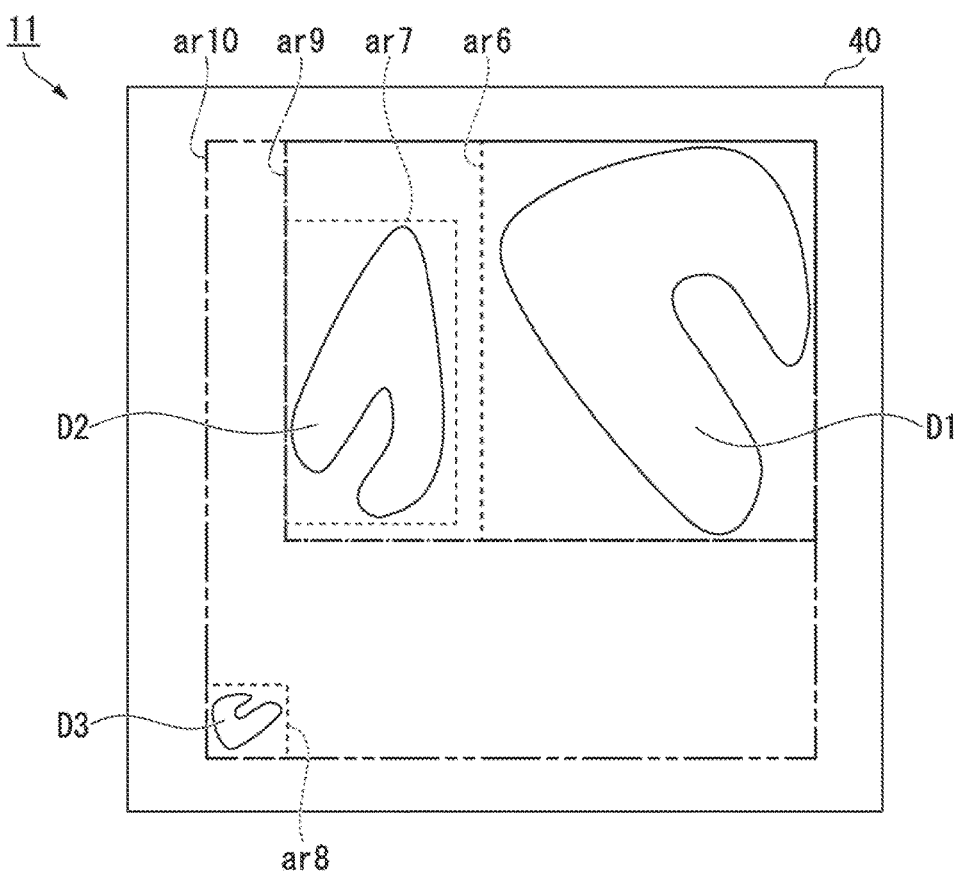
FIG. 8 is a diagram schematically showing still another example of a region in which a pixel configured to output a pixel signal is designated in the solid-state imaging device according to the first embodiment of the present invention.

Here, a method of determining a reading region in which the reading address control circuit 100 outputs (reads) pixel signals when event pixel signals are output in the same period from the motion detection pixels 52 existing at a plurality of positions within the entire region of the pixel array section 40 will be described. FIG. 8 is a diagram schematically showing still another example of a region (a reading region) in which the pixel 50 (a normal pixel 51) configured to output a pixel signal is designated in the solid-state imaging device 1 according to the first embodiment of the present invention. In FIG. 8, an example of a method of determining a reading region in which normal pixels 51 from which pixel signals are output is arranged when distributions of a plurality of motion detection pixels 52 configured to output event pixel signals in the same period are present at a plurality of positions if the pixels 50 (the normal pixels 51 and the motion detection pixels 52) are arranged within the region of the pixel array section 40 of the first semiconductor substrate 11 constituting the solid-state imaging device 1 as shown in FIG. 7 is shown.

Also, each of the motion detection pixel distribution D1, a motion detection pixel distribution D2, and a motion detection pixel distribution D3 shown in FIG. 8 indicates the distribution of the motion detection pixels 52 having output the event pixel signal in the same period. Accordingly, the regions of the motion detection pixel distribution D1, the motion detection pixel distribution D2, and the motion detection pixel distribution D3 correspond to smallest reading regions in which the normal pixels 51 from which the reading address control circuit 100 reads pixel signals are designated.

As shown in FIG. 8, if distributions of a plurality of motion detection pixels 52 configured to output event pixel signals in the same period are present at a plurality of positions, the reading address control circuit 100 determines the reading regions from which the pixel signals are read from the normal pixels 51 corresponding to the motion detection pixel distributions on the basis of the concept of the second pixel designation method. More specifically, each reading region of a rectangular reading region ar6 corresponding to the motion detection pixel distribution D1, a rectangular reading region ar7 corresponding to the motion detection pixel distribution D2, a rectangular reading region ar8 corresponding to the motion detection pixel distribution D3 is determined.

However, it is also conceivable that pixel signals cannot be efficiently read from normal pixels 51 when the pixel signals are read from the normal pixel 51 in the reading region ar6 and the normal pixel 51 in the reading region ar7 if the reading region ar6 and the reading region ar7 exist at positions close to each other as shown in FIG. 8. In other words, it is also conceivable that reading pixel signals from normal pixels 51 within a reading region obtained by combining the reading region ar6 and the reading region ar7 is more efficient than reading pixel signals from normal pixels 51 within each reading region by separately forming the reading region ar6 and the reading region ar7 if the reading region ar6 and the reading region ar7 are close to each other.

In such a case, the reading address control circuit 100 determines a region including a plurality of adjacent reading regions as a reading region in which pixel signals are read. More specifically, as shown in FIG. 8, a rectangular reading region ar9 including the reading region ar6 and the reading region ar7 is determined as a reading region in which the pixel signal is output (read) from the normal pixel 51.

On the other hand, as shown in FIG. 8, the reading region ar8 is not close to either the reading region ar6 or the reading region ar7. In this case, when the reading address control circuit 100 determines a rectangular reading region ar10 including the reading region ar8, the reading region ar6, and the reading region ar7 as the reading region in which the pixel signal is output (read) from the normal pixel 51, reading of pixel signals from normal pixels 51 within the reading region ar10 increases.

In such a case, the reading address control circuit 100 does not determine the reading region ar10 as a reading region in which the pixel signal is output (read) from the normal pixel 51, and may be configured to separately set the reading region ar9 and the reading region ar8 as a reading region in which the pixel signal is output (read) from the normal pixel 51 or read the pixel signal from the normal pixel 51 within each reading region. However, as shown in FIG. 8, if it can be determined that the reading region ar10 is substantially the entire region of the pixel array section 40, the entire region of the pixel array section 40 may be determined to be a reading region in which pixel signals are output (read) from normal pixels 51. In other words, pixel signals for one frame may be read.

Also, a determination of whether or not to determine a reading region, which is a combination of a plurality of reading regions, as the reading region in which the pixel signals are read is performed according to whether or not a process for outputting a control signal for designating the normal pixel 51 is simplified as described above. In this case, in a state before a plurality of reading regions are combined, a result of comparing a sum of a data output time when pixel signals are read from the normal pixels 51 within each reading region and a processing time of a process of switching the reading region in which the pixel signals are read with a data output time at the time of reading the pixel signal from the normal pixel 51 in the reading region obtained by combining the plurality of reading regions may also be used as a determination material. Also, the material for determining whether or not to combine a plurality of reading regions as a reading region in which pixel signals are read is not limited to the above-described time comparison result and various types of determination materials such as differences between processing loads when a plurality of reading regions are combined and processed and when the reading regions are separately processed are conceivable.

In this manner, if distributions of a plurality of motion detection pixels 52 configured to output event pixel signals in the same period are present at a plurality of positions in the solid-state imaging device 1, the reading address control circuit 100 determines a reading region obtained by combining a plurality of reading regions corresponding to distributions as one reading region in which normal pixels 51 from which pixel signals are read are designated in accordance with a position at which a distribution of each motion detection pixel 52 is present in the second pixel designation method. Thereby, in the solid-state imaging device 1, a process of outputting a control signal for designating the normal pixel 51 can be more simplified.

Also, a predetermined rectangular reading region around a position of the motion detection pixel 52 having output an event pixel signal is designated as a reading region in which pixel signals are read from normal pixels 51 when the motion detection pixel 52 outputs the event pixel signal in the first and second pixel designation methods has been described. However, for example, as in a case in which the distribution of the motion detection pixels 52 having outputting the event pixel signals is only the motion detection pixel distribution D3 shown in FIG. 8, a configuration in which motion of an object is determined to be little according to the number of motion detection pixels 52 having outputting the event pixel signals and a magnitude of a range in which motion detection pixels 52 are distributed and a reading region is not designated as a reading region in which pixel signals are read from the normal pixels 51 may be adopted.

(Third Pixel Designation Method)

Figure 9:
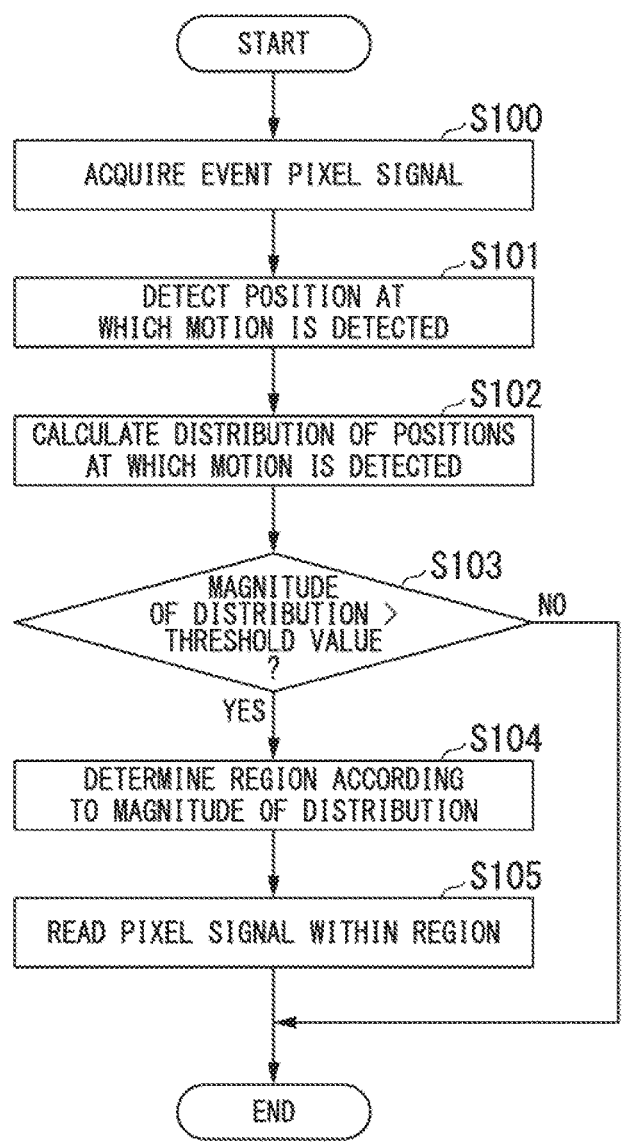
FIG. 9 is a flowchart showing a processing procedure of a process of determining a region in which a pixel configured to output a pixel signal is designated in the solid-state imaging device according to the first embodiment of the present invention.

Next, still another method of designating normal pixels 51 in the solid-state imaging device 1 of the first embodiment will be described. FIG. 9 is a flowchart showing a processing procedure of a process of determining a region (a reading region) in which pixels 50 (normal pixels 51) configured to output pixel signals are designated in the solid-state imaging device 1 according to the first embodiment of the present invention.

When an event pixel signal is input from any one of the motion detection pixels 52 arranged in the pixel array section 40, the reading address control circuit 100 acquires the input event pixel signal (step S100). Subsequently, the reading address control circuit 100 detects (confirms) a position of the motion detection pixel 52 having output the event pixel signal from address information included in the acquired event pixel signal (step S101). Then, the reading address control circuit 100 calculates a distribution of positions of motion detection pixels 52 having output detected (confirmed) event pixel signals (step S102).

Subsequently, the reading address control circuit 100 determines whether or not a magnitude of the calculated distribution of the positions of the motion detection pixels 52 is larger than a threshold value of a predetermined distribution size (step S103). Here, the threshold value of the predetermined distribution magnitude is a value indicating a magnitude of a predetermined distribution serving as a magnitude of a minimum distribution for setting a reading region of a normal pixel 51 from which a pixel signal is read according to, for example, an area or a ratio of an area to the entire region of the pixel array section 40.

As a result of the determination in step S103, if it is determined that the calculated magnitude of the distribution of the positions of the motion detection pixels 52 is larger than the predetermined threshold value of the distribution magnitude ("YES" in step S103), the reading address control circuit 100 determines a reading region (for example, the reading region ar shown in FIG. 7) of the normal pixels 51 from which the pixel signals are read according to the calculated magnitude of the distribution of the positions of the motion detection pixels 52 (step S104).

Subsequently, the reading address control circuit 100 outputs control signals for designating the normal pixels 51 arranged within the determined reading region to the vertical scanning circuit 20 and the horizontal scanning circuit 30. Thereby, each of the vertical scanning circuit 20 and the horizontal scanning circuit 30 sequentially drives the designated normal pixels 51 in accordance with the control signal output from the reading address control circuit 100 and reads pixel signals (step S105). Then, the reading address control circuit 100 completes a process of determining a reading region in which normal pixels 51 configured to output pixel signals are designated.

On the other hand, as a result of the determination in step S103, if it is determined that the calculated magnitude of the distribution of the positions of the motion detection pixels 52 is not larger than the predetermined threshold value of the magnitude of the distribution, i.e., less than or equal to the predetermined threshold value of the magnitude of the distribution ("NO" in step S103), the reading address control circuit 100 completes the process of determining a reading region in which normal pixels 51 from which pixel signals are read is designated. In other words, the reading address control circuit 100 completes the process without determining the reading region of the normal pixels 51 from which the pixel signals are read (without reading the pixel signals from the normal pixels 51).

The reading address control circuit 100 performs the processing procedure of the flowchart shown in FIG. 9 every time an event pixel signal is input from the motion detection pixel 52. Thereby, if the range of the motion detection pixel 52 having detected the motion of the object becomes a range larger than the magnitude of the distribution defined by the threshold value, the reading address control circuit 100 can determine a reading region of normal pixels 51 from which pixel signals are read. More specifically, for example, when the distribution of the motion detection pixels 52 having output the event pixel signals is as large as the motion detection pixel distribution D1 shown in FIG. 8, a process of determining the rectangular reading region ar6 as a reading region in which pixel signals are output (read) from normal pixels 51 is completed. On the other hand, for example, when the distribution of the motion detection pixels 52 having output the event pixel signals is as large as the motion detection pixel distribution D3 shown in FIG. 8, the process is completed without determining the rectangular reading region ar8 as a reading region in which pixel signals are output (read) from normal pixels 51. Thereby, when the motion of the object is little in the solid-state imaging device 1, it is possible to reduce power consumption without reading pixel signals from the normal pixels 51.

It is also conceivable that, even when a plurality of motion detection pixels 52 detect motion of an object and output event pixel signals in the same period, the event pixel signals are not input to the reading address control circuit 100 at the same time. Thus, if the reading address control circuit 100 calculates the distribution of the positions of the motion detection pixels 52 having output the event pixel signals in step S102, it is desirable to calculate the distribution on the basis of positions of a plurality of motion detection pixels 52 having output the event pixel signals within a predetermined period. In other words, it is desirable to perform the determination in step S103 after a state in which the magnitude of the distribution of the positions of the motion detection pixels 52 having output the event pixel signals is established by iterating the processing of steps S100 to S102 in the flowchart shown in FIG. 9 during a predetermined period.

Also, the process of determining the reading region of the normal pixels 51 having output the pixel signals is not limited to a process according to the distribution of the motion detection pixels 52 as shown in the flowchart of FIG. 9, and may be a process according to the number of motion detection pixels 52 having output the event pixel signals as described above.

Figure 10:
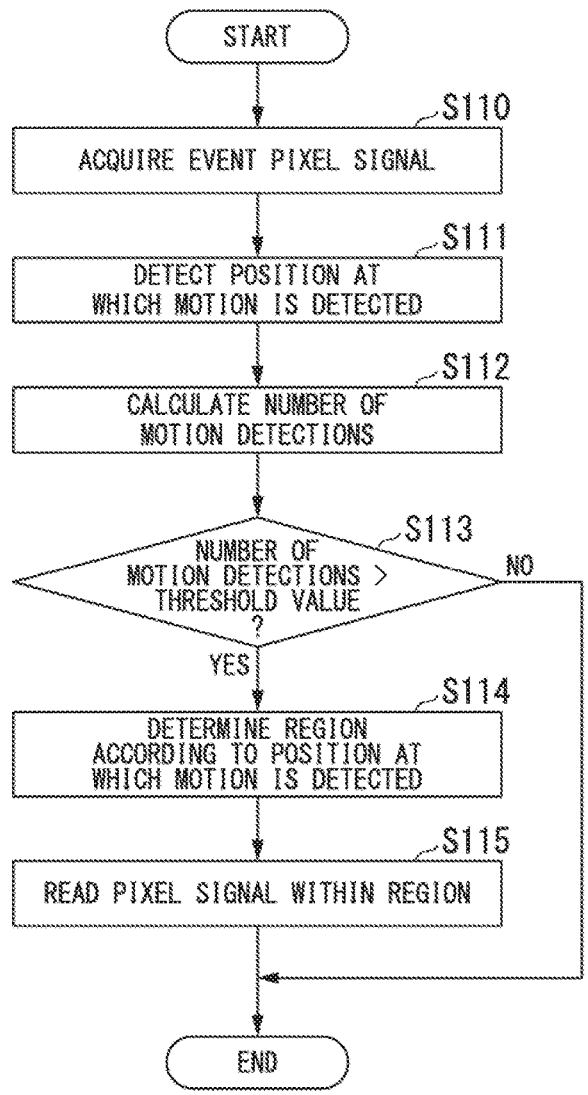
FIG. 10 is a flowchart showing a processing procedure of another process of determining a region in which a pixel configured to output a pixel signal is designated in the solid-state imaging device according to the first embodiment of the present invention.

Here, a process of determining a reading region of normal pixels 51 configured to output pixel signals on the basis of the number of motion detection pixels 52 having output event pixel signals will be described. FIG. 10 is a flowchart showing a processing procedure of another process of determining a region (a reading region) in which pixels 50 (normal pixels 51) configured to output pixel signals are designated in the solid-state imaging device 1 according to the first embodiment of the present invention.

When an event pixel signal is input from any one motion detection pixel 52 arranged within the pixel array section 40, the reading address control circuit 100 acquires the input event pixel signal as in the step S100 in the flowchart shown in FIG. 9 (step S110). Subsequently, the reading address control circuit 100 detects the position of the motion detection pixel 52 having output the event pixel signal from address information included in the acquired event pixel signal as in step S101 in the flowchart shown in FIG. 9 (step S111). Then, the reading address control circuit 100 calculates the number of motion detection pixels 52 having output the detected (confirmed) event pixel signal (step S112).

Subsequently, the reading address control circuit 100 determines whether or not the calculated number of motion detection pixels 52 is larger than the predetermined number of threshold values (step S113). Here, the predetermined number of threshold values is a value indicating a minimum value for motion detection pixels 52 for setting the reading region of the normal pixels 51 from which the pixel signals are read according to, for example, the number of motion detection pixels 52, the ratio of the number of motion detection pixels 52 to the total number of motion detection pixels 52 arranged in the pixel array section 40, or the like.

As a result of the determination in the step S113, if it is determined that the calculated number of motion detection pixels 52 is larger than the predetermined number of threshold values ("YES" in step S113), the reading address control circuit 100 determines a reading region of normal pixels 51 from which pixel signals are read according to a position of each detected (confirmed) motion detection pixel 52 (for example, the reading region ar shown in FIG. 7) (step S114).

Subsequently, the reading address control circuit 100 outputs a control signal for designating the normal pixels 51 arranged in the determined reading region to the vertical scanning circuit 20 and the horizontal scanning circuit 30. Thereby, each of the vertical scanning circuit 20 and the horizontal scanning circuit 30 sequentially drives the designated normal pixels 51 according to the control signal output from the reading address control circuit 100, and reads the pixel signals (step S115). Then, the reading address control circuit 100 completes a process of determining a region in which normal pixels 51 configured to output pixel signals (a reading region) are designated.

On the other hand, as a result of the determination in step S113, if it is determined that the calculated number of motion detection pixels 52 is not larger than the predetermined number of threshold values, i.e., smaller than or equal to the predetermined number of threshold values ("NO" in step S113), the reading address control circuit 100 completes the process of determining a reading region in which normal pixels 51 configured to output pixel signals are designated. In other words, the reading address control circuit 100 completes the process without determining the reading region of the normal pixels 51 from which pixel signals are read (without reading the pixel signals from the normal pixels 51), as in step S103 in the flowchart shown in FIG. 9.

The reading address control circuit 100 performs the processing procedure of the flowchart shown in FIG. 10 every time an event pixel signal is input from the motion detection pixel 52 as in the processing procedure shown in FIG. 9. Thereby, the reading address control circuit 100 can determine the reading region of the normal pixels 51 from which the pixel signals are read when the number of motion detection pixels 52 having detected the motion of the object is larger than the number determined by the threshold value. More specifically, for example, if the number of motion detection pixels 52 having output the event pixel signals is greater than or equal to 100, the process is completed by determining a reading region obtained by combining predetermined rectangular reading regions around positions of the motion detection pixels 52 as a reading region in which pixel signals are output (read) from normal pixels 51. On the other hand, if the number of motion detection pixels 52 having output the event pixel signals is less than 100, the process is completed without determining the reading region in which pixel signals are output (read) from normal pixels 51. Thereby, in the solid-state imaging device 1, as in the processing procedure shown in FIG. 9, when the motion of the object is little, it is possible to reduce power consumption without reading pixel signals from the normal pixels 51.

Also, it is also conceivable that, even when the reading region of the normal pixels 51 having output the pixel signals are determined on the basis of the number of motion detection pixels 52 having output the event pixel signals, the motion detection pixels 52 do not simultaneously output the event pixel signals. In other words, it is also conceivable that pluralities of event pixel signals are input from each of the plurality of motion detection pixels 52 in the same period, but the event pixel signals are not input to the reading address control circuit 100 at the same time. Thus, as in the processing procedure shown in FIG. 9, it is desirable to calculate the number of motion detection pixels 52 having output event pixel signals within a predetermined period if the reading address control circuit 100 calculates the number of motion detection pixels 52 having output the event pixel signals in step S112. Accordingly, as in the processing procedure shown in FIG. 9, it is desirable to perform the determination in step S113 after a state in which the number of motion detection pixels 52 having output the event pixel signals is established by iterating the processing of steps S110 to S112 in the flowchart shown in FIG. 10 for a predetermined period.

In the above description, the first to third pixel designation methods have been described as different methods. However, the first to third pixel designation methods may be combined and applied. In other words, a configuration in which whether to determine a reading region of the normal pixels 51 from which pixel signals are read using any one method of the first to third pixel designation methods is switched in accordance with a situation in which the event pixel signal is output from the motion detection pixel 52 may be adopted.

Also, in the first to third pixel designation methods, a case in which a reading region of normal pixels 51 from which the pixel signals corresponding to motion detection pixels 52 having output event pixel signals are read is determined by applying the concept of each of the first to third pixel designation methods is applied to the entire region of the pixel array section 40 has been described. However, a region to be determined when a reading region of normal pixels 51 from which pixel signals are read is not limited to the entire region of the pixel array section 40 as described above. For example, the entire region of the pixel array section 40 is divided into a plurality of blocks segmented according to the predetermined number of rows and the predetermined number of columns. Then, the reading address control circuit 100 may determine a reading region of normal pixels 51 from which pixel signals are read for each block by applying the concept of any one of the first to third pixel designation methods to a division region of each block. In this case, for example, a reading region of normal pixels 51 from which the pixel signals are read corresponding to motion detection pixels 52 having output event pixel signals may be determined in consideration of a region of division regions as the entire region of the above-described pixel array section 40. Also, for example, the threshold value in step S113 of the process of determining the reading region of the normal pixels 51 having output the pixel signals on the basis of the number of motion detection pixels 52 having output the event pixel signals shown in FIG. 10 may be processed as the number of blocks including the motion detection pixels 52 having output the event pixel signals in place of the number of motion detection pixels 52.

Also, in the solid-state imaging device 1 of the first embodiment, as the configurations of the pixels 50 (the normal pixels 51 and the motion detection pixels 52) arranged within the region of the pixel array section 40, the configurations of the normal pixel 51 shown in FIG. 3A and the pixel the motion detection pixel 52 shown in FIG. 3B are shown. However, the configurations of the pixels 50 arranged within the region of the pixel array section 40 are not limited to the configurations shown in FIG. 3A and FIG. 3B. For example, the normal pixel 51 shown in FIG. 3A does not have a circuit element configured to store a charge signal generated by a photoelectric conversion element PD1. Then, the motion detection pixel 52 shown in FIG. 3B outputs an event pixel signal at timing asynchronous with an operation of the normal pixel 51. Thus, it is also conceivable that the motion detection pixel 52 outputs an event pixel signal during a period in which the normal pixel 51 is performing exposure for the normal photographing at a predetermined cycle (frame rate) (i.e., during the exposure period of the normal pixel 51). In this case, it is also conceivable that it is impossible to read a pixel signal in the normal photographing obtained by immediately previous exposure, i.e., a pixel signal for generating a high-quality image reflecting the motion of the object if the normal pixel 51 is during an exposure period even if an attempt is made to read the pixel signal from the normal pixel 51 in accordance with the event pixel signal output from the motion detection pixel 52. In this case, it is necessary to await reading the pixel signal from the normal pixel 51 until exposure currently being performed is completed. Therefore, by changing the configuration of the normal pixel 51 to a configuration including a circuit element for storing the charge signal generated by the photoelectric conversion element PD1, a pixel signal according to the stored signal charge, i.e., a pixel signal in the normal photographing obtained by immediately previous exposure, can be read in accordance with the event pixel signal output from the motion detection pixel 52.

Modified Example of First Embodiment

Figure 11:
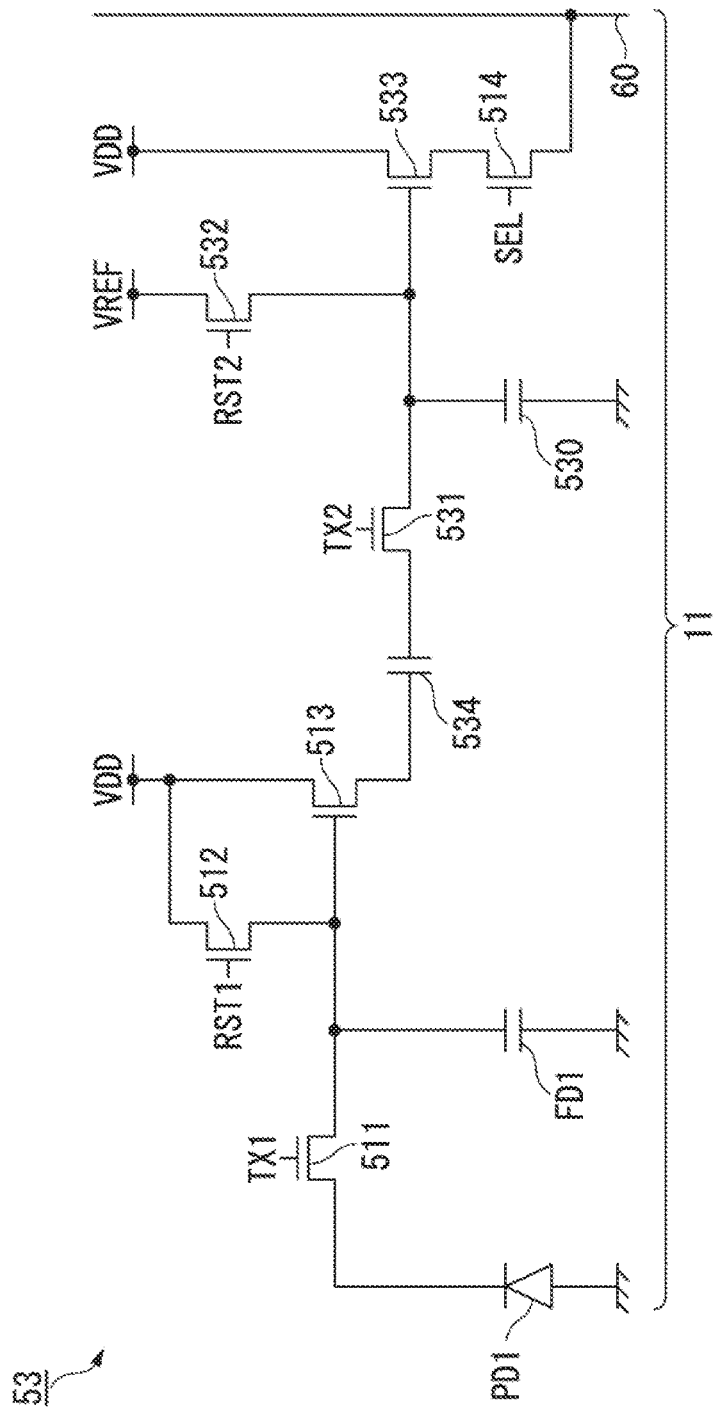
FIG. 11 is a circuit diagram showing an example of another configuration of a pixel in the solid-state imaging device according to the first embodiment of the present invention.

Next, another configuration of the normal pixel 51 arranged within the pixel array section 40 in the solid-state imaging device 1 of the first embodiment will be described. FIG. 11 is a circuit diagram showing an example of another configuration of the pixel 50 (the normal pixel 51) in the solid-state imaging device 1 according to the first embodiment of the present invention. In the following description, the normal pixel 51 having the other configuration is referred to as a "normal pixel 53".

The circuit elements constituting the normal pixel 53 include circuit elements similar to the circuit elements constituting the normal pixel 51. Therefore, in the following description, in the circuit elements constituting the normal pixel 53, the same reference signs are assigned to circuit elements similar to the circuit elements constituting the normal pixel 51 and a detailed description thereof will be omitted.

In FIG. 11, the normal pixel 53 includes a photoelectric conversion element PD1, a charge transfer transistor 511, a pixel reset transistor 512, an amplification transistor 513, a noise suppression element 534, a sample-hold transistor 531, a charge storage capacitor 530, a clamp transistor 532, a second amplification transistor 533, and a selection transistor 514. In FIG. 11, the node capacitor FD1, which is a capacitor associated with a node connected to a gate terminal of the amplification transistor 513 provided in the normal pixel 53, is indicated by a symbol of a capacitor serving as the circuit element of the normal pixel 53.

In the normal pixel 53, the charge transfer transistor 511, the pixel reset transistor 512, the amplification transistor 513, the noise suppression element 534, the sample-hold transistor 531, the charge storage capacitor 530, the clamp transistor 532, the second amplification transistor 533, the selection transistor 514, and the node capacitor FD1 constitute a reading circuit configured to store and read a pixel signal according to the charge signal generated by the photoelectric conversion element PD1. In the solid-state imaging device 1, the photoelectric conversion element PD1 and the reading circuit of the normal pixel 53 are formed on the first semiconductor substrate 11.

The charge transfer transistor 511 transfers the charge signal generated and stored by the photoelectric conversion element PD1 to the gate terminal of the amplification transistor 513 in accordance with a control signal TX1 input from the vertical scanning circuit 20. Thereby, the charge signal transferred by the charge transfer transistor 511 is stored in the node capacitor FD1.

The amplification transistor 513 outputs a signal voltage according to the charge signal transferred to the gate terminal (i.e., the charge signal stored in the node capacitor FD1) to a first terminal of the noise suppression element 534.

The pixel reset transistor 512 resets a charge signal within the normal pixel 53 to a power supply voltage VDD in accordance with a control signal RST1 input from the vertical scanning circuit 20.

The noise suppression element 534 is a capacitor configured to store a signal voltage input from the amplification transistor 513 to the first terminal thereof.

The clamp transistor 532 clamps each of the charge storage capacitor 530 and the noise suppression element 534 to a fixed potential VREF in accordance with a control signal RST2 input from the vertical scanning circuit 20. Thereby, each of the charge storage capacitor 530 and the noise suppression element 534 holds (stores) the clamped fixed potential VREF.

The sample-hold transistor 531 stores the signal voltage output from a second terminal of the noise suppression element 534 in the charge storage capacitor 530 in accordance with a control signal TX2 input from the vertical scanning circuit 20.

The charge storage capacitor 530 is a capacitor configured to store a signal voltage (a signal subjected to a noise removal process) output from the second terminal of the noise suppression element 534 input via the sample-hold transistor 531.

The noise removal process due to a leakage current (a dark current) is performed on a signal voltage output from the amplification transistor 513 (i.e., a signal voltage according to the charge signal generated by the photoelectric conversion element PD1) according to the configurations of the clamp transistor 532, the sample-hold transistor 531, the charge storage capacitor 530, and the noise suppression element 534. The charge storage capacitor 530 stores a signal voltage subjected to the noise removal process.

Also, as the charge storage capacitor 530, it is more preferable to use a metal insulator metal (MIM) capacitor or a metal oxide semiconductor (MOS) capacitor which has a small leakage current (dark current) per unit area. Thereby, resistance to noise is improved and a high-quality signal can be obtained.

The second amplification transistor 533 outputs a signal voltage corresponding to the voltage of the gate terminal (i.e., the signal voltage stored in the charge storage capacitor 530 subjected to the noise removal process) to the selection transistor 514.

The selection transistor 514 outputs a signal voltage output from the second amplification transistor 533 to the vertical signal line 60 as the pixel signal of the normal pixel 53 in accordance with a control signal SEL input from the vertical scanning circuit 20. Thereby, the pixel signal corresponding to the charge signal generated by the photoelectric conversion element PD1 provided in the normal pixel 53 is read to the vertical signal line 60.

According to such a configuration, in the normal pixel 53, each signal voltage according to a charge signal obtained through photoelectric conversion of the light incident on the photoelectric conversion element PD1 is temporarily stored in the charge storage capacitor 530. Then, in the normal pixel 53, the stored signal voltage is read as a pixel signal to the vertical signal line 60 in accordance with control from the vertical scanning circuit 20.

Figure 12:
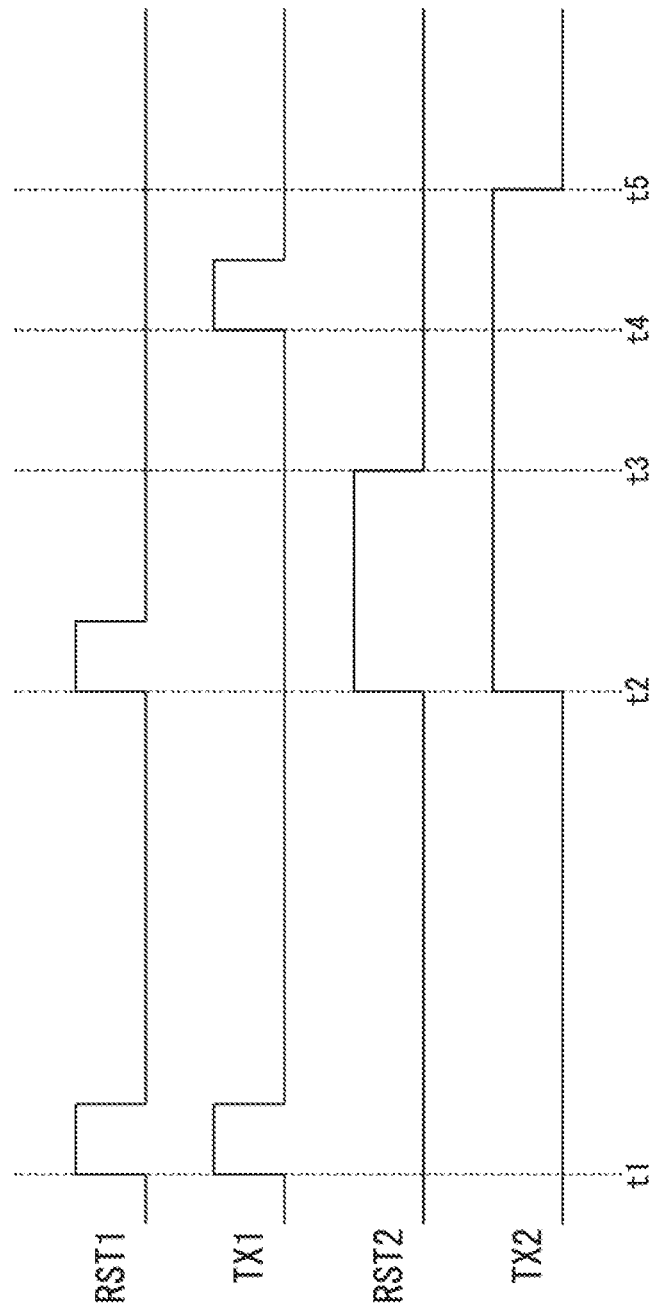
FIG. 12 is a timing chart showing an example of a timing at which a pixel is driven in the solid-state imaging device according to the first embodiment of the present invention.

Here, a drive timing of the normal pixel 53 shown in FIG. 11 will be described. FIG. 12 is a timing chart showing an example of a timing at which the normal pixel 53 is driven in the solid-state imaging device 1 according to the first embodiment of the present invention. The timing chart shown in FIG. 12 indicates a control timing of the vertical scanning circuit 20 for controlling the normal pixel 53 so that a stored signal voltage is output as a pixel signal to the vertical signal line 60 after a signal voltage according to a charge signal obtained through the normal photographing is temporarily stored.

When or in a case the normal photographing is performed, all the normal pixels 53 within the pixel array section 40 are first reset at time t1. More specifically, at time t1, the vertical scanning circuit 20 sets the control signal RST1 and the control signal TX1 to a "High" level at the same time and sets the pixel reset transistor 512 and the charge transfer transistor 511 to an ON state. Thereby, photoelectric conversion elements PD1 and node capacitors FD1 provided in all the normal pixels 53 within the pixel array section 40 are reset.

Thereafter, the vertical scanning circuit 20 sets the control signal RST1 and the control signal TX1 to a "Low" level at the same time, sets the pixel reset transistor 512 and the charge transfer transistor 511 to an OFF state, and releases the resetting of all the normal pixels 53 within the pixel array section 40. Thereby, all the normal pixels 53 within the pixel array section 40 start exposure at the same time. In other words, the photoelectric conversion element PD1 provided in all the normal pixels 53 within the pixel array section 40 starts generation and storage of a charge signal obtained by photoelectrically converting incident light.

Subsequently, after a fixed period elapses (i.e., after any exposure time in normal photographing elapses), a signal voltage of a reset level of the photoelectric conversion element PD1 and a signal voltage generated by exposure (hereinafter referred to as a "signal voltage of an exposure level") are read to the noise suppression element 534 from time t2. Then, the noise removal process is performed to obtain a difference between the signal voltage of the reset level of the photoelectric conversion element PD1 in the normal pixel 53 and the signal voltage of the exposure level.

More specifically, at time t2, the vertical scanning circuit 20 sets the control signal RST1 to the "High" level, sets the pixel reset transistor 512 to an ON state, and resets the node capacitor FD1. Thereby, the signal voltage of the reset level of the photoelectric conversion element PD1 from the amplification transistor 513 is output to the first terminal of the noise suppression element 534.

Also, the vertical scanning circuit 20 sets the control signal RST2 and the control signal TX2 to the "High" level and sets the clamp transistor 532 and the sample-hold transistor 531 to an ON state. Thereby, each of the charge storage capacitor 530 and the noise suppression element 534 is clamped to the fixed potential VREF.

Thereafter, the vertical scanning circuit 20 sets the control signal RST1 to the "Low" level, sets the pixel reset transistor 512 to an OFF state, and releases the resetting of the node capacitor FD1. Subsequently, at time t3, the vertical scanning circuit 20 sets the control signal RST2 to the "Low" level and releases the clamping of the charge storage capacitor 530.

Subsequently, at time t4, the vertical scanning circuit 20 sets the control signal TX1 to the "High" level, sets the charge transfer transistor 511 to an ON state, and transfers a charge signal stored in the photoelectric conversion element PD1 to the gate terminal of the amplification transistor 513. At this time, the charge signal transferred by the charge transfer transistor 511 is stored in the node capacitor FD1. Thereby, the charge signal generated by the photoelectric conversion element PD1 from the amplification transistor 513, i.e., a signal voltage according to the charge signal stored in the node capacitor FD1 (a signal voltage of the exposure level), is output to the first terminal of the noise suppression element 534.

Then, the noise suppression element 534 outputs a voltage of a difference between the signal voltage of the reset level of the photoelectric conversion element PD1 and the signal voltage of the exposure level, i.e., a signal voltage subjected to the noise removal process, from the second terminal thereof.

Thereafter, the vertical scanning circuit 20 sets the control signal TX1 to the "Low" level, sets the charge transfer transistor 511 to an OFF state, and stops the transfer of the charge signal stored in the photoelectric conversion element PD1 to the gate terminal of the amplification transistor 513.

Subsequently, at time t5, the vertical scanning circuit 20 sets the control signal TX2 to the "Low" level, sets the sample-hold transistor 531 to an OFF state, and stops a sample-hold operation of the charge storage capacitor 530. Thereby, the charge storage capacitor 530 stores the signal voltage output by the noise suppression element 534 subjected to the noise removal process.

Heretofore, the charge signal generated by the photoelectric conversion element PD1 provided in the normal pixel 53 is subjected to the noise removal process and stored in the charge storage capacitor 530. Also, in the solid-state imaging device 1, by controlling all the normal pixels 53 arranged within the pixel array section 40 at the same time, normal photographing is performed on the normal pixels 53 in a so-called global shutter function. Accordingly, if the signal voltage according to the charge signal generated by the photoelectric conversion element PD1 is subjected to the noise removal process and stored in the charge storage capacitor 530, the normal pixel 53 can continuously start exposure for the next normal photographing.

Thereafter, when a control signal for designating normal pixels 53 from which pixel signals are read is input from the reading address control circuit 100, the vertical scanning circuit 20 sequentially controls control signals SEL of the designated normal pixels 53 and causes signal voltages subjected to the noise removal process stored in the charge storage capacitors 530 provided in the normal pixels 53 to be sequentially output as pixel signals of the normal pixels 53 to the vertical signal line 60.

In this manner, in the solid-state imaging device 1, the reading address control circuit 100 reads a signal voltage temporarily stored in the normal pixel 53 corresponding to the motion detection pixel 52 in which the motion of the object has been detected as a pixel signal obtained by the normal pixel 53 according to exposure for the normal photographing.

When the exposure for the next normal photographing is completed, the normal pixel 53 from which the pixel signal according to the signal charge stored in the charge storage capacitor 530 is not read discards the signal charge stored in the charge storage capacitor 530. More specifically, at time t2, the vertical scanning circuit 20 sets the control signal RST2 to the "High" level and clamps the charge storage capacitor 530 to the fixed potential VREF, whereby the signal charge stored in the charge storage capacitor 530 is discarded. Then, according to control of the vertical scanning circuit 20 from time t3 to time t5, the charge signal generated by the photoelectric conversion element PD1 in the next exposure for the normal photographing is subjected to the noise removal process and stored in the charge storage capacitor 530.

As described above, in the solid-state imaging device 1 of the first embodiment, a pixel signal obtained through exposure for the normal photographing is temporarily stored within each normal pixel 53 by arranging normal pixels 53 having a configuration including a circuit element configured to store a charge signal generated by the photoelectric conversion element PD1 in place of the normal pixels 51 arranged within a region of the pixel array section 40. Thereby, even when the motion detection pixel 52 outputs the event pixel signal by detecting the motion of the object during the exposure period in which the normal pixel 53 performs the exposure for the normal photographing at the predetermined cycle (frame rate) in the solid-state imaging device 1, the reading address control circuit 100 can read the pixel signal from the normal pixel 53 in accordance with the event pixel signal. Thereby, the image processing section provided in the imaging system equipped with the solid-state imaging device 1 can generate a high-quality image reflecting the motion of the object with a short time lag when the motion of the object is detected.

According to the first embodiment, a solid-state imaging device (the solid-state imaging device 1) includes: n first photoelectric conversion elements (the photoelectric conversion elements PD1) configured to photoelectrically convert incident light and generate first charge signals; n first reading circuits (reading circuits of the normal pixels 51: the charge transfer transistor 511, the pixel reset transistor 512, the amplification transistor 513, the selection transistor 514, and the node capacitor FD1) corresponding to the n photoelectric conversion elements PD1 and configured to output signal voltages as first pixel signals (pixel signals output by the normal pixels 51), according to the first charge signals generated by the corresponding photoelectric conversion elements PD1; m second photoelectric conversion elements (the photoelectric conversion elements PD2) configured to photoelectrically convert incident light and generate second charge signals; m second reading circuits (reading circuits of the motion detection pixels 52) corresponding to the m photoelectric conversion elements PD2 and configured to sequentially output second pixel signals (event pixel signals) according to changes in the second charge signals generated by the corresponding photoelectric conversion elements PD2; and a reading control circuit (the reading address control circuit 100) configured to control reading of the first pixel signals (pixel signals output by normal pixels 51) corresponding to the photoelectric conversion elements PD1 arranged in predetermined reading regions (reading regions ar) within the photoelectric conversion elements PD1, wherein each of the reading circuits of the m motion detection pixels 52 includes a detection circuit (the threshold amplifier 524 and the threshold amplifier 525) configured to detect a change over time in the second charge signal generated by the corresponding photoelectric conversion element PD2 and output an event signal indicating the change when the change exceeding a predetermined threshold value is detected; and a pixel signal generation circuit (the AER circuit 526) configured to output the event pixel signal which is made by adding address information indicating a position at which the corresponding photoelectric conversion element PD2 is arranged to the event signal, wherein the reading address control circuit 100 determines a region (for example, the reading region ar1) according to a position at which the photoelectric conversion element PD2 corresponding to the address information included in the event pixel signal is arranged as the reading region ar for reading the first pixel signal (a pixel signal output by the normal pixel 51), and causes each of the first reading circuits corresponding to each of the photoelectric conversion elements PD1 arranged in the determined reading region ar to output the first pixel signal (the pixel signal output by the normal pixel 51), wherein n is a natural number greater than or equal to 2, and wherein m is a natural number greater than or equal to 2.

Also, according to the first embodiment, the solid-state imaging device 1 in which the reading address control circuit 100 determines, a rectangular region (for example, a predetermined rectangular reading region ar1 of 5 rows and 5 columns) generated on the basis of a position at which the photoelectric conversion elements PD2 corresponding to the address information included in the event pixel signals output in the same period are distributed, as the reading region ar is configured.

Also, according to the first embodiment, the solid-state imaging device 1 in which the reading address control circuit 100 determines, a rectangular region (for example, the reading region ar6) including a region (for example, the motion detection pixel distribution D1) in which the photoelectric conversion elements PD2 corresponding to the address information included in the event pixel signals output in the same period are distributed, as the reading region ar is configured.

Also, according to the first embodiment, the solid-state imaging device 1 in which the reading address control circuit 100 determines a rectangular region according to a magnitude of a distribution of the photoelectric conversion elements PD2 as the reading region ar if the magnitude of the distribution of the photoelectric conversion elements PD2 corresponding to the address information included in the second pixel signals output in the same period is greater than a predetermined threshold value, and does not determine the reading region ar if the magnitude of the distribution of the photoelectric conversion elements PD2 corresponding to the address information included in the second pixel signals output in the same period is less than or equal to the threshold value is configured.

Also, according to the first embodiment, the solid-state imaging device 1 in which the reading address control circuit 100 determines the reading region ar corresponding to the photoelectric conversion elements PD2 if the number of photoelectric conversion elements PD2 corresponding to the address information included in the event pixel signals output in the same period is greater than the predetermined threshold value, and does not determine the reading region ar if the number of photoelectric conversion elements PD2 corresponding to the address information included in the event pixel signals output in the same period is less than or equal to the threshold value is configured.

Also, according to the first embodiment, the solid-state imaging device 1 in which the reading address control circuit 100 divides an entire region in which the n photoelectric conversion elements PD1 are arranged into a plurality of blocks segmented in a predetermined size and determines the reading region ar for each division block is configured.

Also, according to the first embodiment, the solid-state imaging device 1 in which each of the n photoelectric conversion elements PD1 and each of the m photoelectric conversion elements PD2 are periodically arranged in a region of the same plane (a region of the pixel array section 40) of a first semiconductor substrate (the first semiconductor substrate 11) is configured.

Also, according to the first embodiment, the solid-state imaging device 1 in which the AER circuit 526 is arranged in a second semiconductor substrate (the second semiconductor substrate 12) stacked on a surface of the first semiconductor substrate 11, the surface being opposite to a side on which light is incident is configured.

Also, according to the first embodiment, the solid-state imaging device 1 father includes: a connection section (the chip connection section 13) formed between the first semiconductor substrate 11 and the second semiconductor substrate 12 and configured to electrically connect a circuit element of the first semiconductor substrate 11 and a circuit element of the second semiconductor substrate 12 and in which the chip connection section 13 electrically connects the threshold amplifier 524 and the threshold amplifier 525 provided in each of the reading circuits of the m motion detection pixels 52 and the corresponding photoelectric conversion element PD2 is configured.

As described above, in the solid-state imaging device 1 of the first embodiment, the normal pixels 51 (or the normal pixels 53) specialized for outputting the pixel signals in the normal photographing and the motion detection pixels 52 specialized for outputting the event pixel signals in the motion detection are arranged in a row direction and a column direction in the pixel array section 40 periodically (in a planar form). Thereby, in the solid-state imaging device 1 of the first embodiment, both the normal photographing and the motion detection for sequentially detecting motion of the object can be achieved.

In the solid-state imaging device 1 of the first embodiment, when an event pixel signal is output from the motion detection pixel 52, pixel signals are output (read) from normal pixels 51 (or normal pixels 53) arranged within a predetermined reading region corresponding to a position of the motion detection pixel 52 having output the event pixel signal. In other words, in the solid-state imaging device 1 of the first embodiment, pixel signals of the normal photographing are output (read) from only normal pixels 51 (or normal pixels 53 arranged in a predetermined small reading region corresponding to a position at which the motion detection pixels 52 having detected the motion of the object are arranged). Thereby, in the solid-state imaging device 1 of the first embodiment, it is possible to further reduce power consumption than when all pixel signals obtained through the normal photographing are read to generate an image reflecting the motion of the object as in a conventional solid-state imaging device.

Also, the image processing section provided in the imaging system equipped with the solid-state imaging device 1 of the first embodiment can generate an image reflecting the motion of the object on the basis of a small number of pixel signals output (read) from only normal pixels 51 (or normal pixels 53) arranged in a small reading region in which the motion of the object is detected. Thereby, in the image processing section provided in the imaging system equipped with the solid-state imaging device 1 of the first embodiment, a time lag when the motion of the object is detected is short and it is possible to generate a high-quality image reflecting the motion of the object.

In the example of the arrangement of the normal pixels 51 and the motion detection pixels 52 shown in FIG. 4, the number of motion detection pixels 52 arranged in the pixel array section 40 is smaller than the number of normal pixels 51. However, in the detection of the motion of the object, resolution, i.e., image quality, as high as in an image generated in the normal photographing is not required. On the other hand, in the normal photographing, it is desirable to increase the number of pixels by increasing the number of normal pixels 51 provided in the pixel array section 40. In the solid-state imaging device 1 of the first embodiment, a configuration in which the quality of an image generated in the normal photographing is improved, i.e., in which a highly precise output is obtained, by further increasing the number of the normal pixels 51 arranged within the pixel array section 40 can be adopted.

Second Embodiment

Next, a second embodiment of the present invention will be described. An overview and schematic configuration of a solid-state imaging device (hereinafter referred to as a "solid-state imaging device 2") in the second embodiment of the present invention are similar to those of the solid-state imaging device 1 in the first embodiment shown in FIG. 1 and FIG. 2. Accordingly, in the following description, the same reference signs are used for components of the solid-state imaging device 2 similar to those of the solid-state imaging device 1 of the first embodiment and a detailed description of each component or operation will be omitted.

Here, the configuration of the pixel 50 arranged in the pixel array section 40 in the solid-state imaging device 2 of the second embodiment will be described. As in the solid-state imaging device 1 of the first embodiment, pixels 50 arranged in the pixel array section 40 in the solid-state imaging device 2 also output pixel signals of normal photographing by normal reading and event pixel signals of motion detection by motion detection reading. However, the pixels 50 configured to output the event pixel signals of motion detection arranged within the pixel array section 40 in the solid-state imaging device 2 have a configuration in which pixel signals of the normal photographing can be output. In other words, the pixels 50 are pixels having a configuration including both functions of the normal pixels 51 and the motion detection pixels 52 arranged in the pixel array section 40 in the solid-state imaging device 1 of the first embodiment.

In the following description, the pixel 50 arranged in the pixel array section 40 of the solid-state imaging device 2 and configured to output pixel signals of the normal photographing by the normal reading and output event pixel signals of the motion detection by the motion detection reading is referred to as a "multi-use pixel 54". The multi-use pixel 54 uses both the photoelectric conversion element PD1 provided in the normal pixel 51 and the photoelectric conversion element PD2 provided in the motion detection pixel 52 and outputs each of the pixel signal of the normal photographing and the event pixel signal of the motion detection on the basis of a charge signal generated by the same photoelectric conversion element.

Figure 13:
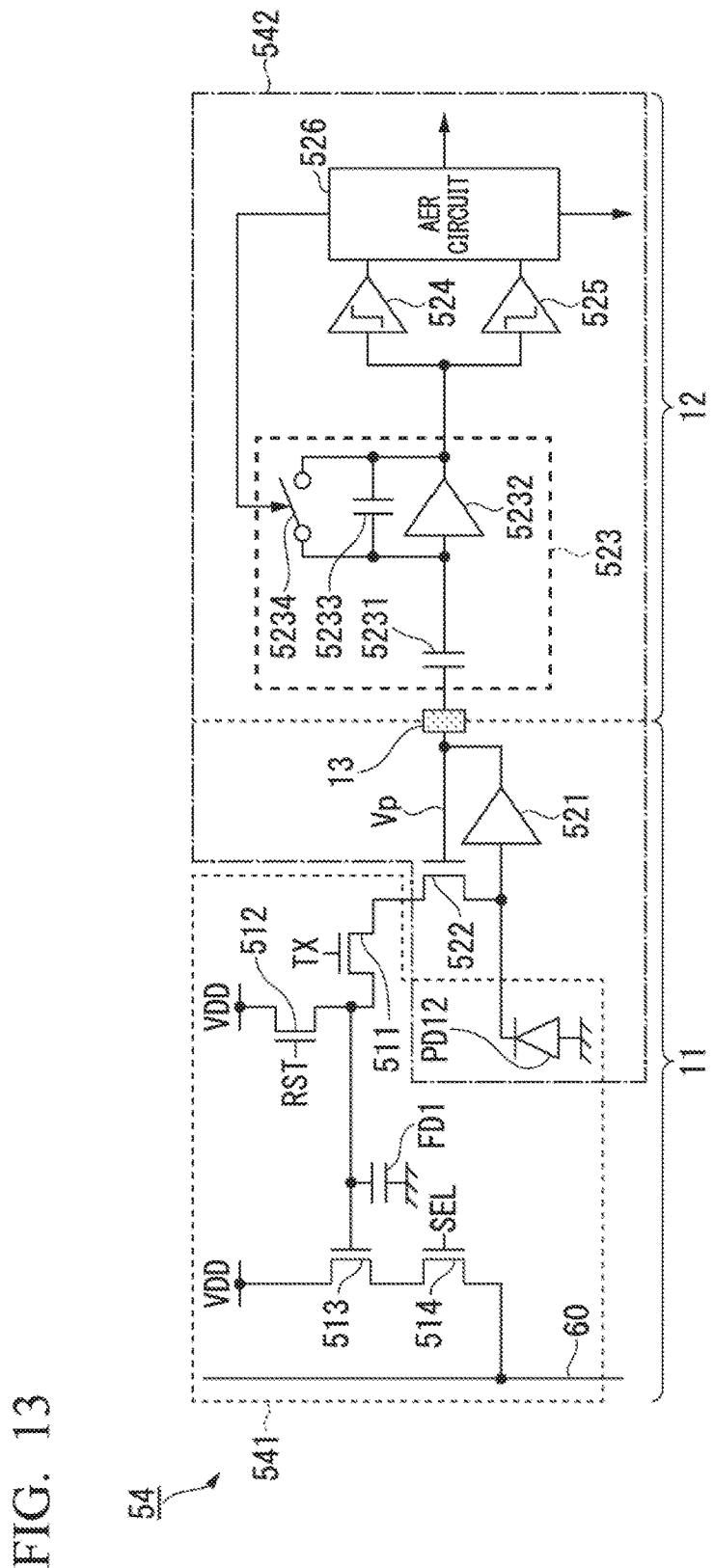
FIG. 13 is a circuit diagram showing an example of a configuration of a pixel in a solid-state imaging device according to a second embodiment of the present invention.

FIG. 13 is a circuit diagram showing an example of the configuration of the multi-use pixel 54 in the solid-state imaging device 2 according to the second embodiment of the present invention. The multi-use pixel 54 shown in FIG. 13 is a pixel in which both the photoelectric conversion element PD1 provided in the normal pixel 51 and the photoelectric conversion element PD2 provided in the motion detection pixel 52 arranged within the pixel array section 40 are used in the solid-state imaging device 1 of the first embodiment. The circuit elements constituting the multi-use pixel 54 include circuit elements similar to the circuit elements constituting the normal pixel 51 or the motion detection pixel 52 arranged in the solid-state imaging device 1 of the first embodiment. Accordingly, in the following description, the same reference signs are assigned to circuit elements constituting the multi-use pixel 54 similar to the circuit elements constituting the normal pixel 51 or the motion detection pixel 52 and a detailed description thereof will be omitted.

In FIG. 13, the multi-use pixel 54 includes a photoelectric conversion element PD12, a charge transfer transistor 511, a pixel reset transistor 512, an amplification transistor 513, a selection transistor 514, an amplifier 521, a bias transistor 522, a switched capacitor amplifier circuit 523, a threshold amplifier 524, a threshold amplifier 525, and an AER circuit 526. Also, the switched capacitor amplifier circuit 523 includes a capacitor 5231, an amplifier 5232, a capacitor 5233, and a switch 5234. Also, in FIG. 13, a node capacitor FD1, which is a capacitor associated with a node connected to a gate terminal of the amplification transistor 513 provided in the multi-use pixel 54, is indicated by a symbol of a capacitor as a circuit element of the multi-use pixel 54.

In the multi-use pixel 54, a pixel configured to generate a charge signal in the normal photographing according to configurations of the photoelectric conversion element PD12, the charge transfer transistor 511, the pixel reset transistor 512, the amplification transistor 513, the selection transistor 514, and the node capacitor FD1, i.e., a pixel similar to a normal pixel 51 in the solid-state imaging device 1 of the first embodiment, is configured. Also, in the following description, the multi-use pixel 54 configured to generate a charge signal in the normal photographing is referred to as a "normal multi-use pixel 541". In the normal multi-use pixel 541, the charge transfer transistor 511, the pixel reset transistor 512, the amplification transistor 513, the selection transistor 514, and the node capacitor FD1 constitute a reading circuit configured to read a pixel signal according to a charge signal generated by the photoelectric conversion element PD12 in the normal photographing.

Also, in the multi-use pixel 54, a pixel configured to generate a charge signal for motion detection, i.e., a pixel similar to a motion detection pixel 52 in the solid-state imaging device 1 of the first embodiment, is configured according to the configurations of the photoelectric conversion element PD12, the amplifier 521, the bias transistor 522, the switched capacitor amplifier circuit 523, the threshold amplifier 524, the threshold amplifier 525, and the AER circuit 526. In the following description, the multi-use pixel 54 configured to generate a charge signal for motion detection is referred to as a "motion detection multi-use pixel 542". In the motion detection multi-use pixel 542, the amplifier 521 and the bias transistor 522 constitute an output circuit configured to output the charge signal generated by the photoelectric conversion element PD12 for the motion detection. Also, in the motion detection multi-use pixel 542, a reading circuit for reading the charge signal generated by the photoelectric conversion element PD12 for the motion detection in the switched capacitor amplifier circuit 523, the threshold amplifier 524, the threshold amplifier 525, and the AER circuit 526 is configured.

In the solid-state imaging device 2, the multi-use pixels 54 are arranged instead of the motion detection pixels 52 arranged in the pixel array section 40 in the solid-state imaging device 1 of the first embodiment. At this time, in the solid-state imaging device 2, the photoelectric conversion element PD12, the reading circuit of the normal multi-use pixel 541, and the output circuit of the motion detection multi-use pixel 542 are formed on the first semiconductor substrate 11. Also, in the solid-state imaging device 2, a reading circuit of the motion detection multi-use pixel 542 is formed on the second semiconductor substrate 12.

Similar to the photoelectric conversion element PD1 provided in the normal pixel 51 and the photoelectric conversion element PD2 provided in the motion detection pixel 52 in the solid-state imaging device 1 of the first embodiment, the photoelectric conversion element PD12 is a photodiode configured to photoelectrically convert incident light (a light beam) to generate a charge signal and store the generated charge signal. The photoelectric conversion element PD12 sequentially outputs generated charge signals to the amplifier 521.

If the multi-use pixel 54 operates as a pixel configured to output a pixel signal in the normal photographing, i.e., if a pixel signal is output from the normal multi-use pixel 541 to the vertical signal line 60 by normal reading, the amplifier 521 outputs a voltage signal Vp of a voltage to a gate terminal of the bias transistor 522 so that the bias transistor 522 is always in an ON state in accordance with bias control. In other words, if a pixel signal is output in the normal photographing in the multi-use pixel 54, the bias transistor 522 transmits the charge signal generated by the photoelectric conversion element PD12 to the charge transfer transistor 511 as it is. Thereby, the charge transfer transistor 511 transfers a charge signal, which is generated and stored by the photoelectric conversion element PD12 and input via the bias transistor 522 in accordance with the control signal TX input from the vertical scanning circuit 20, to the gate terminal of the amplification transistor 513. Thereby, the charge signal transferred by the charge transfer transistor 511 is stored in the node capacitor FD1.

According to such an operation, in the multi-use pixel 54 (the normal multi-use pixel 541), each signal voltage according to the charge signal obtained through photoelectric conversion of the light incident on the photoelectric conversion element PD12 is read as a pixel signal to the vertical signal line 60.

On the other hand, when or in a case the multi-use pixel 54 operates as a pixel for generating a charge signal for motion detection. i.e., if the motion detection multi-use pixel 542 outputs an event pixel signal of motion detection by motion detection reading, the vertical scanning circuit 20 controls the control signal RST so that the pixel reset transistor 512 is always in an ON state. In addition, the vertical scanning circuit 20 controls the control signal TX to a fixed bias voltage. Thereby a fixed voltage according to a fixed bias voltage is supplied to the bias transistor 522 by the pixel reset transistor 512 and the charge transfer transistor 511.

According to this operation, the photoelectric conversion element PD12 generates a charge signal having a magnitude corresponding to the motion of the object in the multi-use pixel 54 (the motion detection multi-use pixel 542) and outputs an event pixel signal according to a change in the charge signal and a change direction thereof.

According to such a configuration and operation, the multi-use pixel 54 can output the pixel signal of the normal photographing by normal reading and the event pixel signal of motion detection by motion detection reading.

In the configuration of the multi-use pixel 54 shown in FIG. 13, a configuration in which the photoelectric conversion element PD1 provided in the normal pixel 51 and the photoelectric conversion element PD2 provided in the motion detection pixel 52 arranged within the pixel array section 40 are shown in the solid-state imaging device 1 of the first embodiment. However, the multi-use pixel 54 can be configured to include a photoelectric conversion element PD12 used as the photoelectric conversion element PD1 provided in the normal pixel 53 and the photoelectric conversion element PD2 provided in the motion detection pixel 52 shown in the modified example of the first embodiment. More specifically, as in the multi-use pixel 54 shown in FIG. 13, one terminal of a source terminal and a drain terminal of the charge transfer transistor 511 provided in the normal pixel 53 to which the photoelectric conversion element PD1 is connected is connected to one terminal of a source terminal and a drain terminal of the bias transistor 522 provided in the motion detection pixel 52 to which the photoelectric conversion element PD2 is not connected. Thereby, a configuration in which the photoelectric conversion element PD1 provided in the normal pixel 53 and the photoelectric conversion element PD2 provided in the motion detection pixel 52 are used can be adopted.

Also, in the multi-use pixel 54, as described above, the photoelectric conversion element PD12 is shared in the normal multi-use pixel 541 corresponding to the normal pixel 51 (or the normal pixel 53) and the motion detection multi-use pixel 542 corresponding to the motion detection pixel 52. Thus, the solid-state imaging device 2 exclusively performs the normal reading for reading a pixel signal from the normal multi-use pixel 541 and the motion detection reading for reading a motion detection pixel signal (an event pixel signal) from the motion detection multi-use pixel 542.

(Pixel Designation Method of Second Embodiment)

Next, a method of designating the pixel 50 (a normal pixel 51 or a normal pixel 53) in the solid-state imaging device 2 of the second embodiment will be described. Also, a method in which the reading address control circuit 100 determines a reading region of a normal pixel 53 from which a pixel signal is output (read) in the solid-state imaging device 2 is similar to the first to third pixel designation methods in the solid-state imaging device 1 of the first embodiment. Accordingly, a detailed description of the method in which the reading address control circuit 100 determines a reading region of a normal pixel 53 from which a pixel signal is output (read) in the solid-state imaging device 2 will be omitted. In the following description, a configuration in which a normal pixel 51 (or a normal pixel 53) from which a pixel signal is output is designated in the solid-state imaging device 2 will be described.

In the following description, a normal pixel 53 serving as the pixel 50 for reading a pixel signal of the normal photographing and a multi-use pixel 54 serving as the pixel 50 for reading a pixel signal of the normal photographing and an event pixel signal are assumed to be arranged within the pixel array section 40 of the solid-state imaging device 2. Also, an arrangement of normal pixels 53 and multi-use pixels 54 in the pixel array section 40 is assumed to be similar to an arrangement of pixels 50 in the solid-state imaging device 1 of the first embodiment shown in FIG. 4. More specifically, in the pixel array section 40 of the solid-state imaging device 2, it is assumed that normal pixels 53 are arranged in place of normal pixels 51 arranged within the pixel array section 40 of the solid-state imaging device 1 of the first embodiment shown in FIG. 4 and multi-use pixels 54 are arranged instead of the motion detection pixels 52.

Figure 14:
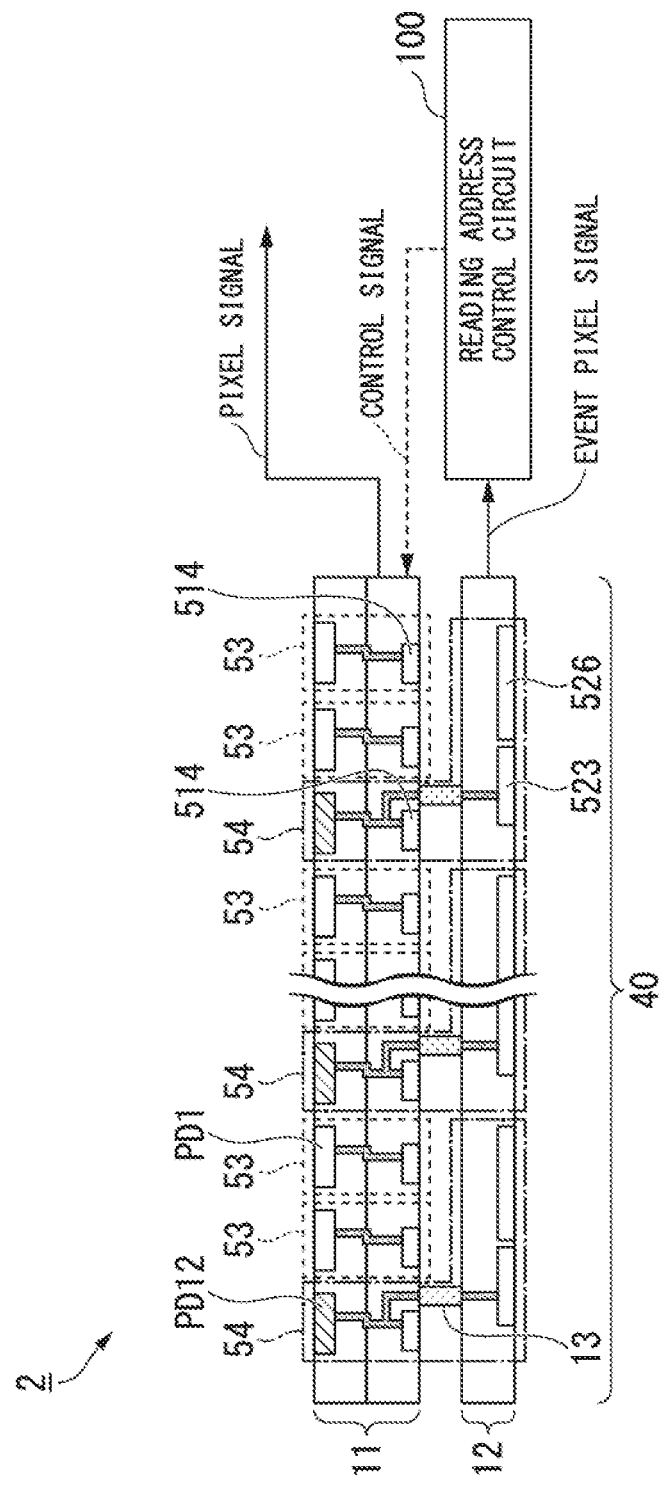
FIG. 14 is a diagram showing a configuration in which pixel signals are output in the solid-state imaging device according to the second embodiment of the present invention.

FIG. 14 is a diagram showing a configuration in which a pixel signal is output in the solid-state imaging device 2 according to the second embodiment of the present invention. FIG. 14 shows a vertical structure of a part of the pixel array section 40 in which the normal pixels 53 and the multi-use pixels 54 are arranged in the solid-state imaging device 2 and the reading address control circuit 100 provided in the control circuit 10. More specifically, signals exchanged between the normal pixels 53 formed on the first semiconductor substrate 11, the multi-use pixels 54 formed on the first semiconductor substrate 11 and the second semiconductor substrate 12, and the reading address control circuit 100 are shown.

As described above, in the solid-state imaging device 2, the photoelectric conversion element PD1 and the reading circuit of the normal pixel 53 are formed on the first semiconductor substrate 11. In FIG. 14, a state in which the photoelectric conversion element PD1 of the normal pixel 53 and the selection transistor 514 provided in the reading circuit of the normal pixel 53 are formed on the first semiconductor substrate 11 is shown.

Also, as described above, in the solid-state imaging device 2, the photoelectric conversion element PD12 of the multi-use pixel 54, the reading circuit of the normal multi-use pixel 541 configured within the multi-use pixel 54, and the output circuit of the motion detection multi-use pixel 542 configured within the multi-use pixel 54 are formed on the first semiconductor substrate 11. Also, as described above, in the solid-state imaging device 2, the reading circuit of the motion detection multi-use pixel 542 configured within the multi-use pixel 54 is formed on the second semiconductor substrate 12. In FIG. 14, a state in which the photoelectric conversion element PD12 of the multi-use pixel 54 and the selection transistor 514 provided in the reading circuit of the normal multi-use pixel 541 are formed on the first semiconductor substrate 11, and the switched capacitor amplifier circuit 523 and the AER circuit 526 provided in the reading circuit of the motion detection multi-use pixel 542 are formed on the second semiconductor substrate 12 is shown.

At this time, in the solid-state imaging device 2, the reading circuit of the motion detection multi-use pixel 542 is formed on the second semiconductor substrate 12 including a region overlapping that of the normal pixels 53 formed on the first semiconductor substrate 11. In FIG. 14, a state in which the switched capacitor amplifier circuit 523 and the AER circuit 526 provided in the reading circuit of the motion detection multi-use pixel 542 are formed in a region of the second semiconductor substrate 12 including the region overlapping that of the normal pixels 53 formed on the first semiconductor substrate 11 is shown.

Then, in the solid-state imaging device 2, the output circuit of the motion detection multi-use pixel 542 and the reading circuit of the motion detection multi-use pixel 542 corresponding thereto are electrically connected by the chip connection section 13 formed between the first semiconductor substrate 11 and the second semiconductor substrate 12. In FIG. 14, a state in which an amplifier 521 (not shown) provided in an output circuit of the motion detection multi-use pixel 542 formed on the first semiconductor substrate 11 and the switched capacitor amplifier circuit 523 provided in the reading circuit of the motion detection multi-use pixel 542 formed on the second semiconductor substrate 12 are connected by the chip connection section 13 is shown.

Also, in the solid-state imaging device 2, as in the solid-state imaging device 1 of the first embodiment, the AER circuit 526 of the motion detection multi-use pixel 542 formed on the second semiconductor substrate 12 outputs the event pixel signal to the reading address control circuit 100 when a change over time in the charge signal generated by the photoelectric conversion element PD12 is detected.

If the event pixel signal is input, the reading address control circuit 100 detects (confirms) a position of a multi-use pixel 54 having output an event pixel signal from address information included in the input event pixel signal. Then, the reading address control circuit 100 determines a region of the normal pixel 53 arranged in a predetermined reading region around the detected (confirmed) position of the multi-use pixel 54 as a reading region in which a pixel signal is output from the normal pixel 53.

Then, the reading address control circuit 100 outputs a control signal for designating the normal pixel 53 arranged in the determined reading region to the vertical scanning circuit 20 and the horizontal scanning circuit 30. Thereby, each of the vertical scanning circuit 20 and the horizontal scanning circuit 30 sequentially drives the designated normal pixels 53 and outputs (reads) pixel signals from the normal pixels 53 designated by the reading address control circuit 100.

In the solid-state imaging device 2, multi-use pixels 54 from which pixel signals of normal photographing and event pixel signals are read are arranged within the pixel array section 40. Thus, in the solid-state imaging device 2, it is possible to read a pixel signal in the normal photographing from the normal multi-use pixel 541 configured within the multi-use pixel 54 as well as a pixel signal in the normal photographing read from a normal pixel 53 as a pixel signal read in accordance with the event pixel signal output by the motion detection multi-use pixel 542 configured within the multi-use pixel 54. In other words, although a position within the pixel array section 40 in which the motion detection pixel 52 is arranged in the pixel array section 40 becomes a position at which a normal pixel 51 from which a pixel signal of the normal photographing is read is deficient in the solid-state imaging device 1 of the first embodiment, it is also possible to read a pixel signal in the normal photographing at a position at which the motion detection pixel 52 is arranged in the solid-state imaging device 1 in the solid-state imaging device 2. In other words, there is no position at which a pixel signal is deficient in normal photographing. Thus, when an image according to each pixel signal is generated, the image processing section configured to generate an image on the basis of a pixel signal in the normal photographing output from the solid-state imaging device 2 does not need to perform an arithmetic operation of interpolating a pixel signal of a pixel which is deficient.

However, as described above, in the solid-state imaging device 2, the normal reading in which a pixel signal is read from the normal multi-use pixel 541 configured within the multi-use pixel 54 and the motion detection reading in which a motion detection pixel signal (an event pixel signal) is read from the motion detection multi-use pixel 542 configured within the multi-use pixel 54 are performed in a time division manner.

Here, an operation of reading pixel signals (a pixel signal and an event pixel signal in the normal photographing) from the normal multi-use pixel 541 and the motion detection multi-use pixel 542 configured within the multi-use pixel 54 will be described. In the following description, the multi-use pixel 54 will be described as a multi-use pixel 54 having a configuration that also serves as the photoelectric conversion element PD1 provided in the normal pixel 53 and the photoelectric conversion element PD2 provided in the motion detection pixel 52. In other words, it will be described that the normal multi-use pixel 541 configured within the multi-use pixel 54 performs an operation of temporarily storing a signal voltage according to the charge signal generated by the photoelectric conversion element PD12 in the charge storage capacitor 530 as in the normal pixel 53 and the motion detection multi-use pixel 542 included in the multi-use pixel 54 performs a motion detection operation of sequentially detecting the motion of the object as in the motion detection pixel 52.

Figure 15:
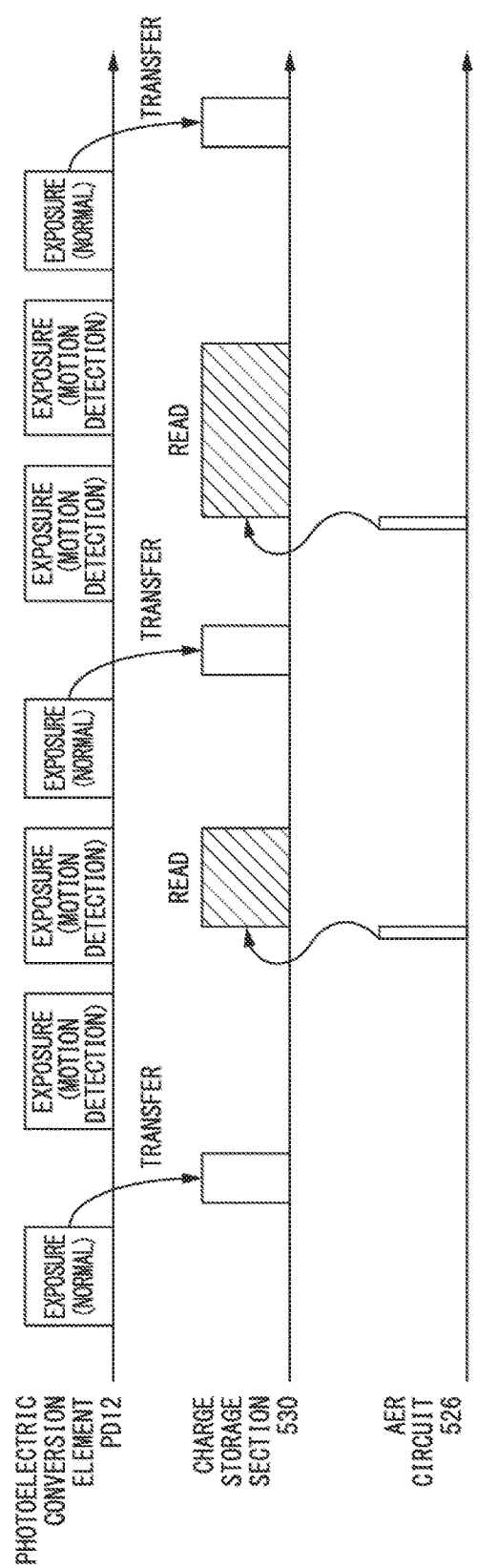
FIG. 15 is a timing chart showing a reading sequence of pixel signals in the solid-state imaging device according to the second embodiment of the present invention.

FIG. 15 is a timing chart showing a reading sequence of a pixel signal (a pixel signal and an event pixel signal in the normal photographing) in the solid-state imaging device 2 according to the second embodiment of the present invention. Also, in the solid-state imaging device 2, each of the vertical scanning circuit 20 and the horizontal scanning circuit 30 drives a normal pixel 53 or a multi-use pixel 54 in accordance with a control signal output by the control circuit 10 or the reading address control circuit 100 provided in the control circuit 10. However, in the following description, the reading address control circuit 100 will be described as a reading address control circuit configured to drive a normal pixel 53 and a multi-use pixel 54 for ease of description. Because the operation of the normal pixel 53 is similar to the operation of the normal multi-use pixel 541 configured in the multi-use pixel 54, the operation of the normal pixel 53 will be described as the operation of the normal multi-use pixel 541 in the following description. The operation of the motion detection pixel 52 will be described as the operation of the motion detection multi-use pixel 542 provided in the multi-use pixel 54. In FIG. 15, the photoelectric conversion element PD12 provided in the multi-use pixel 54, the charge storage capacitor 530 for indicating the operation of the normal multi-use pixel 541, and the AER circuit 526 for indicating the operation of the motion detection multi-use pixel 542 are shown.

The reading address control circuit 100 causes the normal multi-use pixel 541 (including the normal pixel 53) to perform exposure for the normal photographing at a predetermined frame rate cycle. Then, after any exposure time in the normal photographing elapses, the reading address control circuit 100 causes the charge storage capacitor 530 to store a signal voltage according to a charge signal generated by the photoelectric conversion element PD12 of every normal multi-use pixel 541 (also including the photoelectric conversion element PD1 of the normal pixel 53) by transferring the signal voltage according to an operation of a global shutter function to the charge storage capacitor 530.

Thereafter, the reading address control circuit 100 causes the motion detection multi-use pixel 542 to continue exposure for motion detection. Thereby, the motion detection multi-use pixel 542 sequentially detects the motion of the object. Also, in FIG. 15, a case in which the exposure for motion detection is divided into any predetermined exposure times and performed a plurality number of times in consideration of a case in which the charge signal generated by the photoelectric conversion element PD12 is saturated is shown.

When an event pixel signal is input from any motion detection multi-use pixel 542, the reading address control circuit 100 determines a reading region of a normal pixel 53 from which a pixel signal is read on the basis of address information included in the input event pixel signal and reads a pixel signal from the normal pixel 53 arranged within the determined reading region. At this time, the reading address control circuit 100 also reads a pixel signal from the normal multi-use pixel 541 used as the motion detection multi-use pixel 542 having output the event pixel signal and the photoelectric conversion element PD12. More specifically, pixel signals corresponding to stored signal voltages are read from the charge storage capacitors 530 provided in the normal pixel 53 and the normal multi-use pixel 541 arranged within the determined reading region.

As described above, in the solid-state imaging device 2, exposure for motion detection is performed for a time between exposures for the normal photographing. Then, a pixel signal is also read from the normal multi-use pixel 541 configured within the multi-use pixel 54 having the motion detection multi-use pixel 542 having detected the motion of the object. At this time, in the solid-state imaging device 2, as in the solid-state imaging device 1 of the first embodiment, a small number of pixel signals among already acquired pixel signals of one frame are read from a small reading region in which motion is detected. Thereby, in the solid-state imaging device 2, as in the solid-state imaging device 1 of the first embodiment, it is also possible to reduce power consumption when a pixel signal according to the detected motion of the object is read.

Moreover, in the solid-state imaging device 2, the pixel signal in the normal photographing at the position at which the motion detection multi-use pixel 542 having detected the motion of the object is arranged can also be read as the pixel signal in the reading region in which the pixel signal is read. Thus, when an image according to each pixel signal is generated, the image processing section provided in the imaging system equipped with the solid-state imaging device 2 does not need to perform an arithmetic operation of interpolating a pixel signal of a pixel which is deficient.

According to the second embodiment, the solid-state imaging device (the solid-state imaging device 2) in which a charge signal in which s first charge signals generated by s first photoelectric conversion elements (photoelectric conversion elements PD1) are designated as one unit is also used as the second charge signal generated by the second photoelectric conversion element (the photoelectric conversion element PD2), s is a natural number greater than or equal to 1, and the total number of the photoelectric conversion elements PD1 configured to output the first charge signals also used as the second charge signals is a natural number greater than or equal to 1 and less than or equal to n is configured.

As described above, in the solid-state imaging device 2 of the second embodiment, a normal pixel 51 (or a normal pixel 53) specialized for outputting the pixel signal in the normal photographing and a multi-use pixel 54 configured to output a pixel signal in the normal photographing and output an event pixel signal in the motion detection on the basis of a charge signal generated by the same photoelectric conversion element PD12 are arranged in a row direction and a column direction in the pixel array section 40 periodically (in a planar form). Thereby, in the solid-state imaging device 2 of the second embodiment, as in the solid-state imaging device 1 of the first embodiment, it is also possible to achieve both the normal photographing and the motion detection for sequentially detecting motion of the object.

Also, in the solid-state imaging device 2 of the second embodiment, as in the solid-state imaging device 1 of the first embodiment, when an event pixel signal is output from the motion detection multi-use pixel 542 configured within the multi-use pixel 54, a pixel signal is output (read) from a normal pixel 51 (or a normal pixel 53) arranged within a predetermined reading region corresponding to the position of the motion detection multi-use pixel 542 having output the event pixel signal. In other words, in the solid-state imaging device 2 of the second embodiment, as in the solid-state imaging device 1 of the first embodiment, pixel signals of the normal photographing are also output (read) from only a normal pixel 51 (or a normal pixel 53) arranged in a predetermined small reading region corresponding to a position at which a multi-use pixel 54 (a motion detection multi-use pixel 542) having detecting the motion of the object is arranged and a normal multi-use pixel 541 configured within the multi-use pixel 54 having output an event pixel signal. Thereby, in the solid-state imaging device 2 of the second embodiment, as in the solid-state imaging device 1 of the first embodiment, it is also possible to reduce the power consumption as compared with reading all the pixel signals obtained through the normal photographing to generate an image reflecting the motion of the object as in a conventional solid-state imaging device.

Also, the image processing section provided in the imaging system equipped with the solid-state imaging device 2 of the second embodiment can generate an image reflecting motion of an object on the basis of a small number of pixel signals output (read) from only normal pixels 51 (or normal pixels 53) arranged in a small reading region in which the motion of the object is detected and multi-use pixels 54 (normal multi-use pixels 541) as in the image processing section provided in the imaging system equipped with the solid-state imaging device 1 of the first embodiment. At this time, the image processing section provided in the imaging system equipped with the solid-state imaging device 2 according to the second embodiment can generate an image reflecting the motion of the object without performing an arithmetic operation of interpolating a pixel signal of a pixel which is deficient. Thereby, the image processing section provided in the imaging system equipped with the solid-state imaging device 2 of the second embodiment can generate a high-quality image reflecting the motion of the object with a short time lag when the motion of the object is detected in processing load which is less than that of the image processing section provided in the imaging system equipped with the solid-state imaging device 1 of the first embodiment.

The normal pixels 51 (or the normal pixels 53) and the multi-use pixels 54 have been described as having been arranged as in the arrangement of the pixels 50 in the solid-state imaging device 1 of the first embodiment shown in FIG. 4 in the solid-state imaging device 2 of the second embodiment. In other words, the normal pixels 53 in the pixel array section 40 of the solid-state imaging device 2 of the second embodiment have been described as being arranged in place of the normal pixels 51 arranged within the pixel array section 40 of the solid-state imaging device 1 of the first embodiment shown in FIG. 4 and the multi-use pixels 54 therein have been described as being arranged in place of the motion detection pixels 52. However, the arrangements of the normal pixels 51 (or the normal pixels 53) and the multi-use pixels 54 within the pixel array section 40 in the solid-state imaging device 2 of the second embodiment are not limited to an arrangement similar to that of the pixels 50 within the pixel array section 40 in the solid-state imaging device 1 of the first embodiment described above. For example, the multi-use pixels 54 may be uniformly arranged in the entire plane region of the pixel array section 40 in the solid-state imaging device 2 of the second embodiment. This is because the multi-use pixel 54 is the pixel 50 having a configuration in which the normal multi-use pixel 541 can output a pixel signal of the normal photographing through normal reading as in the normal pixel 51 (or the normal pixel 53).

As described above, it is also desirable to increase the number of pixels in the normal photographing by increasing the number of normal pixels 51 (or normal pixels 53) and the number of normal multi-use pixels 541 provided in the pixel array section 40 in the solid-state imaging device 2 of the second embodiment. In the solid-state imaging device 2 of the second embodiment, it is also possible to adopt a configuration in which the quality of an image generated in the normal photographing is improved, i.e., in which a high-definition output is obtained, by implementing higher definition for normal pixels 51 (or normal pixels 53) and normal multi-use pixels 541 arranged in the pixel array section 40 and further increasing the number thereof to be arranged within the pixel array section 40.

However, as described above, in the solid-state imaging device 2 of the second embodiment, it is also desirable that the photoelectric conversion element PD12 generate a charge signal for a short time and the motion detection multi-use pixel 542 detect motion of the object in motion detection for sequentially the motion of the object. Meanwhile, if the normal multi-use pixel 541 has higher definition, an area of the photoelectric conversion element PD12 shared with the motion detection multi-use pixel 542 is reduced and a level of a charge signal generated through photoelectric conversion is lowered. This means that the level of the charge signal for detecting a change over time in the motion detection by the motion detection multi-use pixel 542 is also lowered and the accuracy of motion detection is lowered. Therefore, by changing the configuration of the multi-use pixel 54 in the solid-state imaging device 2 of the second embodiment, it is possible to improve the quality of an image generated in the normal photographing, i.e., it is possible to adopt a configuration in which the number of pixels increases and reduce the accuracy of motion detection.

Third Embodiment

Next, a third embodiment of the present invention will be described. An overview and schematic configuration of a solid-state imaging device according to the third embodiment of the present invention (hereinafter referred to as a "solid-state imaging device 3") are similar to an overview and schematic configuration of the solid-state imaging device 2 according to the second embodiment, i.e., the overview and schematic configuration of the solid-state imaging device 1 according to the first embodiment shown in FIG. 1 and FIG. 2. Accordingly, in the following description, the same reference signs are assigned to components of the solid-state imaging device 3 similar to those of the solid-state imaging device 1 of the first embodiment and the solid-state imaging device 2 of the second embodiment and a detailed description of the components and operations will be omitted.

Here, a configuration of the pixel 50 arranged within the pixel array section 40 in the solid-state imaging device 3 of the third embodiment will be described. The pixel 50 arranged within the pixel array section 40 in the solid-state imaging device 3 also outputs a pixel signal of normal photographing by normal reading and an event pixel signal of motion detection by motion detection reading as in the multi-use pixel 54 arranged within the pixel array section 40 in the solid-state imaging device 2 of the second embodiment. In other words, similar to the multi-use pixel 54, the pixel 50 is also a pixel having a configuration in which both a photoelectric conversion element PD1 provided in a normal pixel 51 (or a normal pixel 53) and a photoelectric conversion element PD2 provided in a motion detection pixel 52 are used. Here, the pixel 50 arranged in the pixel array section 40 in the solid-state imaging device 3 detects the motion of an object on the basis of charge signals generated by a plurality of photoelectric conversion elements PD1 and output an event pixel signal.

In the following description, the pixel 50 arranged in the pixel array section 40 of the solid-state imaging device 3 and configured to output a pixel signal of the normal photographing by the normal reading and output an event pixel signal of the motion detection by the motion detection reading is referred to as a "multi-use pixel 55". The multi-use pixel 55 is a pixel configured to include a function of a plurality of normal pixels 51 (or normal pixels 53) and a function of one motion detection pixel 52. In other words, the multi-use pixel 55 is a pixel configured to improve the quality of an image generated in the normal photographing by implementing high definition for the normal multi-use pixel 541 for generating the charge signal in the normal photographing in the multi-use pixel 54 shown in FIG. 13 and minimizing deterioration in the accuracy of motion detection by increasing the number of photoelectric conversion elements PD12 also used by the motion detection multi-use pixel 542 for generating a charge signal for motion detection.

Figure 16:
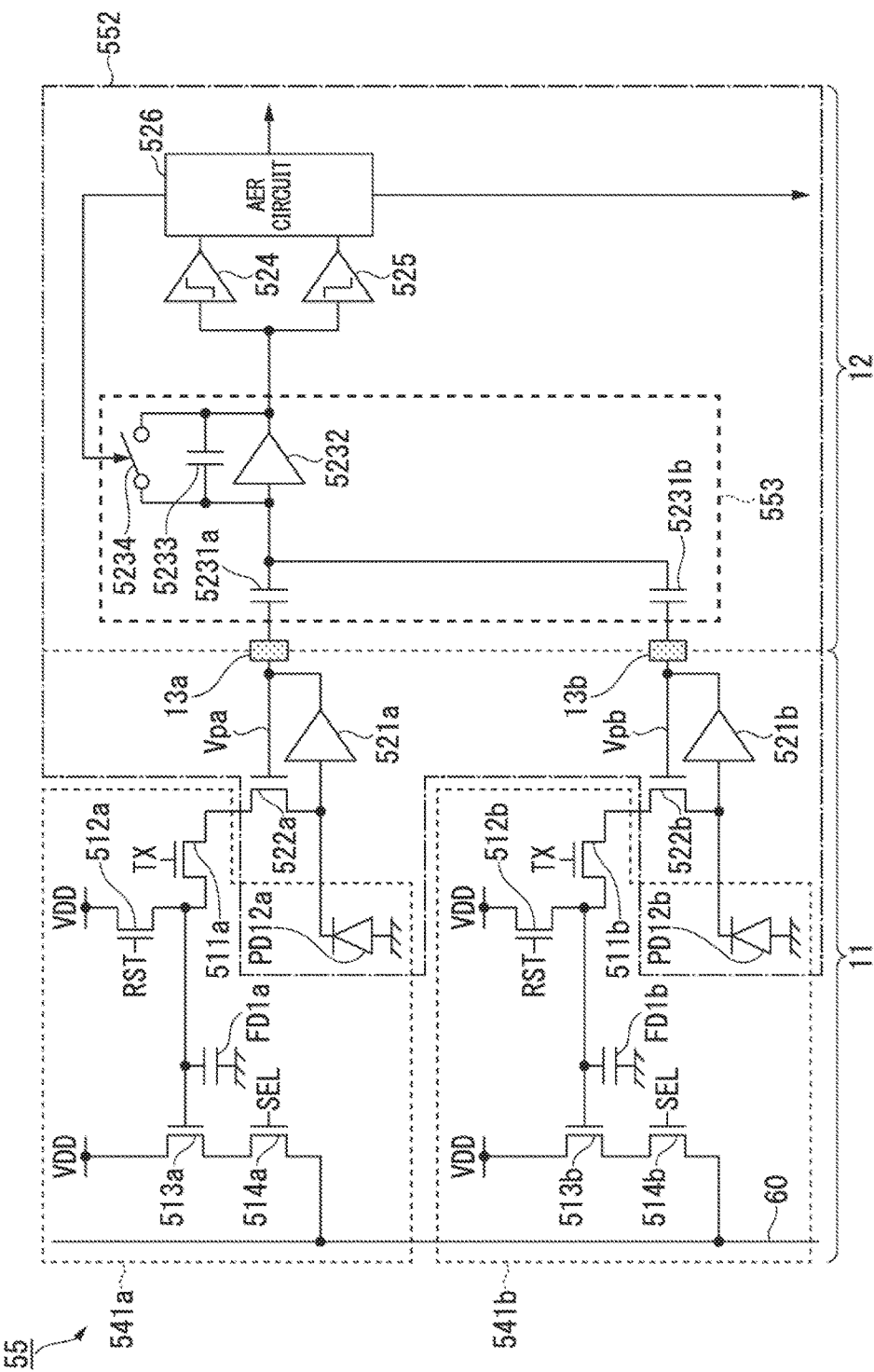
FIG. 16 is a circuit diagram showing an example of a configuration of a pixel in a solid-state imaging device according to a third embodiment of the present invention.

FIG. 16 is a circuit diagram showing an example of the configuration of the multi-use pixel 55 in the solid-state imaging device 3 according to the third embodiment of the present invention. In FIG. 16, a multi-use pixel 55 configured to include two high-definition normal multi-use pixels 541 and one motion detection multi-use pixel 552 is shown. Circuit elements constituting the multi-use pixel 55 include circuit elements similar to circuit elements constituting the multi-use pixel 54 arranged within the pixel array section 40 in the solid-state imaging device 2 of the second embodiment. Accordingly, in the following description, among the circuit elements constituting the multi-use pixel 55, circuit elements similar to the circuit elements constituting the multi-use pixel 54 arranged within the pixel array section 40 in the solid-state imaging device 2 of the second embodiment are denoted by the same reference signs, and a detailed description thereof will be omitted.

Each of the two normal multi-use pixels 541 provided for the multi-use pixel 55 is configured to be similar to the normal multi-use pixel 541 configured in the multi-use pixel 54. In FIG. 16, the two normal multi-use pixels 541 are distinguished as a normal multi-use pixel 541a and a normal multi-use pixel 541b. In FIG. 16, a reference sign assigned to distinguish each normal multi-use pixel 541, i.e., "a" or "b," is attached subsequently to the reference sign of each circuit element to distinguish the circuit elements within each normal multi-use pixel 541.

More specifically, a normal multi-use pixel 541a includes a photoelectric conversion element PD12a, a charge transfer transistor 511a, a pixel reset transistor 512a, an amplification transistor 513a, a selection transistor 514a, and a node capacitor FD1a. Also, a normal multi-use pixel 541b includes a photoelectric conversion element PD12b, a charge transfer transistor 511b, a pixel reset transistor 512b, an amplification transistor 513b, a selection transistor 514b, and a node capacitor FD1b.

Because operations of the normal multi-use pixel 541a and the normal multi-use pixel 541b and a control timing by the vertical scanning circuit 20 are similar to those of the normal multi-use pixel 541 configured in the multi-use pixel 54, a detailed description thereof will be omitted.

Also, one motion detection multi-use pixel 552 provided for the multi-use pixel 55 is configured to be similar to the motion detection multi-use pixel 542 configured in the multi-use pixel 54. However, in the motion detection multi-use pixel 552, one motion detection multi-use pixel 552 uses the plurality of normal multi-use pixels 541 and the photoelectric conversion element PD12 together. In FIG. 16, one motion detection multi-use pixel 552 shares the photoelectric conversion element PD12 with each of the high-definition normal multi-use pixel 541a and the normal multi-use pixel 541b. In other words, the motion detection multi-use pixel 552 detects the motion of the object on the basis of charge signals generated by the plurality of photoelectric conversion elements PD12. Thus, in the motion detection multi-use pixel 552, the configuration of the circuit element corresponding to each photoelectric conversion element PD12 is changed.

More specifically, the motion detection multi-use pixel 552 has a configuration in which each of the amplifier 521, the bias transistor 522, and the capacitor 5231, provided in the switched capacitor amplifier circuit 523, provided in the motion detection multi-use pixel 542 configured within the multi-use pixel 54 corresponds to each shared photoelectric conversion element PD12.

In FIG. 16, the photoelectric conversion element PD12 to which each circuit element corresponds is distinguished by attaching a reference sign ("a" or "b") assigned to the photoelectric conversion element PD12 to a circuit element corresponding to any one photoelectric conversion element PD12 among circuit elements within the motion detection multi-use pixel 552 subsequently to the reference sign of each circuit element.

More specifically, the motion detection multi-use pixel 552 includes an amplifier 521a, an amplifier 521b, a bias transistor 522a, a bias transistor 522b, a switched capacitor amplifier circuit 553, a threshold amplifier 524, a threshold amplifier 525, and an AER circuit 526. Also, the switched capacitor amplifier circuit 553 includes a capacitor 5231a, a capacitor 5231b, an amplifier 5232, a capacitor 5233, and a switch 5234.

The amplifier 521a amplifies a charge signal generated and output by a corresponding photoelectric conversion element PD12a and outputs the amplified charge signal to the capacitor 5231a within the switched capacitor amplifier circuit 553 via the chip connection section 13a. Also, the amplifier 521a transfers the amplified charge signal as a voltage signal Vpa to a gate terminal of the bias transistor 522a.

The amplifier 521b amplifies a charge signal generated and output by a corresponding photoelectric conversion element PD12b and outputs the amplified charge signal to the capacitor 5231b within the switched capacitor amplifier circuit 553 via the chip connection section 13b. Also, the amplifier 521b transfers the amplified charge signal as a voltage signal Vpb to a gate terminal of the bias transistor 522b.

The bias transistor 522a performs control so that a current flowing through the photoelectric conversion element PD12a becomes a constant current in accordance with the voltage signal Vpa transferred to the gate terminal thereof i.e., so that the magnitude of the charge signal is sequentially stable in a magnitude after a change even when the charge signal generated by the photoelectric conversion element PD12a changes. In other words, an output of the photoelectric conversion element PD12a is clipped.

The bias transistor 522b performs control so that a current flowing through the photoelectric conversion element PD12b becomes a constant current in accordance with the voltage signal Vpb transferred to the gate terminal thereof, i.e., so that the magnitude of the charge signal is sequentially stable in a magnitude after a change even when the charge signal generated by the photoelectric conversion element PD12b changes. In other words, an output of the photoelectric conversion element PD12b is clipped.

The switched capacitor amplifier circuit 553 adds a charge signal input from each of the amplifiers 521a and 521b via the corresponding chip connection section 13a or chip connection section 13b. More specifically, the capacitor 5231a stores the charge signal input from the corresponding amplifier 521a to a first terminal thereof, and outputs a voltage signal of a voltage corresponding to the stored charge signal from a second terminal thereof. Also, the capacitor 5231b stores a charge signal input from the corresponding amplifier 521b to a first terminal thereof and outputs a voltage signal of a voltage corresponding to the stored charge signal from a second terminal thereof. At this time, because the second terminal of the capacitor 5231a and the second terminal of the capacitor 5231b are connected as shown in FIG. 16, the voltage signal output from the second terminal of the capacitor 5231a and the voltage signal output from the second terminal of the capacitor 5231b are summed and a sum of the voltage signals is output to the amplifier 5232. Then, similar to the switched capacitor amplifier circuit 523 provided in the motion detection multi-use pixel 542 configured within the multi-use pixel 54, the switched capacitor amplifier circuit 553 converts a change in the sum of the charge signals into a voltage signal of a predetermined voltage range and outputs the voltage signal to each of the threshold amplifier 524 and the threshold amplifier 525. In other words, similar to the switched capacitor amplifier circuit 523 provided in the motion detection multi-use pixel 542 configured within the multi-use pixel 54, the switched capacitor amplifier circuit 553 converts an increase/decrease of a charge signal obtained by summing charge signals generated by the photoelectric conversion element PD12a and the photoelectric conversion element PD12b into a voltage signal of a predetermined voltage range and outputs the voltage signal to each of the threshold amplifier 524 and the threshold amplifier 525.

According to such a configuration, in the motion detection multi-use pixel 552, even when an area of the photoelectric conversion element PD12 provided in each normal multi-use pixel 541 decreases with the high definition of the normal multi-use pixel 541, it is possible to detect motion of the object on the basis of a larger charge signal by summing charge signals generated by a plurality of photoelectric conversion elements PD12. Thus, in the motion detection multi-use pixel 552, it is possible to minimize deterioration in the accuracy of motion detection.

Because the operation of the motion detection multi-use pixel 552 and the control timing of the vertical scanning circuit 20 are similar to those of the motion detection multi-use pixel 542 configured within the multi-use pixel 54, except that the motion detection multi-use pixel 552 operates on the basis of the summed charge signals, a detailed description thereof will be omitted.

According to such a configuration, in the multi-use pixel 55, it is possible to improve the quality of an image generated in the normal photographing by the high-definition normal multi-use pixel 541 and minimize deterioration in the accuracy of motion detection by increasing the number of photoelectric conversion elements PD12 which are also used by the motion detection multi-use pixel 552.

In the solid-state imaging device 3, the multi-use pixels 55 are uniformly arranged in the entire plane region of the pixel array section 40. At this time, in the solid-state imaging device 3, the photoelectric conversion elements PD12, reading circuits of the normal multi-use pixels 541, and output circuits of the motion detection multi-use pixels 552 are formed on the first semiconductor substrate 11 and reading circuits of the motion detection multi-use pixels 552 is formed on the second semiconductor substrate 12.

In the configuration of the multi-use pixel 55 shown in FIG. 16, as in the configuration of the multi-use pixel 54 shown in FIG. 13, a configuration in which both the photoelectric conversion element PD1 provided in the normal pixel 51 shown in FIG. 3A in the first embodiment and the photoelectric conversion element PD2 provided in the motion detection pixel 52 shown in FIG. 3B in the first embodiment are used is shown. In other words, a configuration in which a plurality of normal multi-use pixels 541 having no circuit element for storing a charge signal generated by each photoelectric conversion element PD12 and a motion detection multi-use pixel 542 are combined is shown. However, similar to the multi-use pixel 54, the multi-use pixel 55 can also be configured to include a photoelectric conversion element PD12 used as the photoelectric conversion element PD1 provided in the normal pixel 53 shown in FIG. 11 in the modified example of the first embodiment and the photoelectric conversion element PD2 provided in the motion detection pixel 52 shown in FIG. 3B in the first embodiment. Also, in this case, a connection of each circuit element is similar to a concept in the multi-use pixel 54. More specifically, as in the multi-use pixel 55 shown in FIG. 16, one terminal of a source terminal and a drain terminal to which the photoelectric conversion element PD1 is connected in the charge transfer transistor 511 provided in the normal pixel 53 and one terminal of a source terminal and a drain terminal to which the photoelectric conversion element PD2 is not connected in the bias transistor 522 provided in the motion detection pixel 52 are connected for each normal pixel 53. Thereby, the photoelectric conversion element PD2 provided for one motion detection pixel 52 can be constituted of the photoelectric conversion element PD1 provided in the plurality of normal pixels 53.

In the multi-use pixel 55, as described above, the photoelectric conversion element PD12 is shared between the normal multi-use pixel 541 corresponding to the plurality of normal pixels 51 (or normal pixels 53) and the motion detection multi-use pixel 552 corresponding to the motion detection pixel 52. Thus, similar to the solid-state imaging device 2 of the second embodiment, the solid-state imaging device 3 can also exclusively perform normal reading in which a pixel signal are read from the normal multi-use pixel 541 and motion detection reading in which a motion detection pixel signal (an event pixel signal) is read from the motion detection multi-use pixel 552.

(Pixel Designation Method of Third Embodiment)

Next, a method of designating a normal multi-use pixel 541 in the solid-state imaging device 3 of the third embodiment will be described. Also, a method of determining a reading region of a multi-use pixel 55 (a normal multi-use pixel 541) from which the reading address control circuit 100 outputs (reads) a pixel signal in the solid-state imaging device 3 is similar to the first to third pixel designation methods in the solid-state imaging device 1 of the first embodiment. Accordingly, a detailed description of the method of determining the reading region of the multi-use pixel 55 (the normal multi-use pixel 541) from which the reading address control circuit 100 outputs (reads) the pixel signal in the solid-state imaging device 3 will be omitted. In the following description, a configuration in which a multi-use pixel 55 (a normal multi-use pixel 541), which outputs a pixel signal in the solid-state imaging device 3, is designated will be described. In the following description, as described above, multi-use pixels 55 will be described as being uniformly arranged in the entire plane region of the pixel array section 40 of the solid-state imaging device 3.

Figure 17:
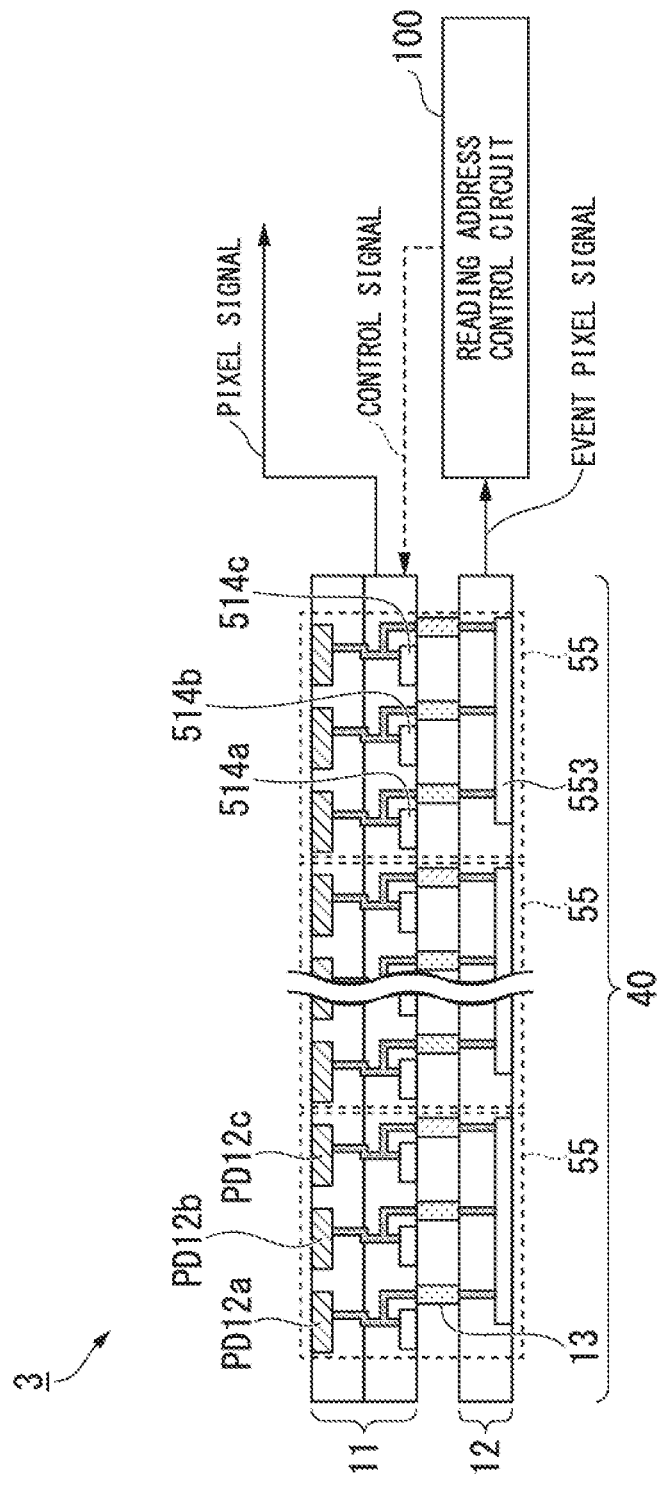
FIG. 17 is a diagram showing a configuration in which pixel signals are output in the solid-state imaging device according to the third embodiment of the present invention.

FIG. 17 is a diagram showing a configuration in which a pixel signal is output in the solid-state imaging device 3 according to the third embodiment of the present invention. In FIG. 17, a vertical structure of a part of the pixel array section 40 in which the multi-use pixels 55 are uniformly arranged in the solid-state imaging device 3 and a reading address control circuit 100 provided in the control circuit 10 are shown. More specifically, signals exchanged between the multi-use pixels 55 formed on the first semiconductor substrate 11 and the second semiconductor substrate 12 and the reading address control circuit 100 are shown. In FIG. 17, a multi-use pixel 55 having a configuration in which the photoelectric conversion element PD12 is shared by a normal multi-use pixel 541 corresponding to three normal pixels 51 (or normal pixels 53) and a motion detection multi-use pixel 552 corresponding to the motion detection pixel 52 is shown. In other words, the multi-use pixel 55 is a multi-use pixel configured to detect motion of an object on the basis of a charge signal generated by each of three photoelectric conversion elements PD12 (photoelectric conversion elements PD12*a* to PD12*c*). In FIG. 17, "a," "b," or "c" is attached subsequently to the reference signs of the circuit elements in order to distinguish the circuit elements in the normal multi-use pixels 541.

As described above, in the solid-state imaging device 3, the photoelectric conversion element PD12 of each of the multi-use pixels 55, the reading circuit of each normal multi-use pixel 541 configured within the multi-use pixel 55, and the output circuit of the motion detection multi-use pixel 552 configured within the multi-use pixel 55 are formed on the first semiconductor substrate 11. Also, as described above, in the solid-state imaging device 3, a reading circuit of the motion detection multi-use pixel 552 configured within the multi-use pixel 55 is formed on the second semiconductor substrate 12. In FIG. 17, a state in which three photoelectric conversion elements PD12*a* to PD12*c* of the multi-use pixel 55 and selection transistors 514 (selection transistors 514*a* to 514*c*) provided in the reading circuit of the normal multi-use pixel 541 are formed on the first semiconductor substrate 11 is shown. Also, in FIG. 17, a state in which the switched capacitor amplifier circuit 553 provided in the reading circuit of the motion detection multi-use pixel 552 is formed on the second semiconductor substrate 12 is shown.

At this time, in the solid-state imaging device 3, the reading circuit of the motion detection multi-use pixel 552 is formed in a region of the second semiconductor substrate 12 including a region overlapping that of an output circuit of the normal multi-use pixel 541 and the motion detection multi-use pixel 552 formed on the first semiconductor substrate 11. In FIG. 17, a state in which the switched capacitor amplifier circuit 553 provided in the reading circuit of the motion detection multi-use pixel 552 is formed in a region of the second semiconductor substrate 12 including the region overlapping that of the output circuit of the normal pixel 53 and the motion detection multi-use pixel 552 formed on the first semiconductor substrate 11 is shown.

In the solid-state imaging device 3, the reading circuit of the motion detection multi-use pixel 552 and the output circuit of the motion detection multi-use pixel 552 corresponding thereto are electrically connected by a chip connection section 13 formed between the first semiconductor substrate 11 and the second semiconductor substrate 12. In FIG. 17, an example in which amplifiers 521*a* to 521*c* (not shown) provided in the output circuit of each motion detection multi-use pixel 552 formed on the first semiconductor substrate 11 and the switched capacitor amplifier circuit 553 provided in the reading circuit of the motion detection multi-use pixel 552 formed on the second semiconductor substrate 12 are connected by the corresponding chip connection section 13 is shown.

Also in the solid-state imaging device 3, as in the solid-state imaging device 2 of the second embodiment, the AER circuit 526 (not shown) of the motion detection multi-use pixel 552 formed on the second semiconductor substrate 12 outputs an event pixel signal to the reading address control circuit 100 when a change over time in a charge signal generated by each of the photoelectric conversion elements PD12*a* to PD12*c* is detected.

When the event pixel signal is input, the reading address control circuit 100 detects (confirms) the position of the multi-use pixel 55 having output the event pixel signal from the address information included in the input event pixel signal. Here, the position of the multi-use pixel 55 detected (confirmed) by the reading address control circuit 100 is a region in which a plurality of normal multi-use pixels 541 configured within the multi-use pixel 55 are arranged. However, the reading address control circuit 100 may detect (confirm) a center position in the region of the multi-use pixel 55 as the position of the multi-use pixel 55 having output the event pixel signal. Then, the reading address control circuit 100 determines the region of the normal multi-use pixel 541 arranged in the predetermined reading region around the detected (confirmed) multi-use pixel 55 as a reading region in which the pixel signal is output (read) from the normal multi-use pixel 541.

Then, the reading address control circuit 100 outputs a control signal for designating the normal multi-use pixel 541 arranged within the determined reading region to the vertical scanning circuit 20 and the horizontal scanning circuit 30. Thereby, each of the vertical scanning circuit 20 and the horizontal scanning circuit 30 sequentially drives the designated normal multi-use pixel 541 and outputs (reads) a pixel signal from the normal multi-use pixel 541 designated by the reading address control circuit 100.

In the solid-state imaging device 3, multi-use pixels 55 from which a pixel signal of the normal photographing and an event pixel signal are read are uniformly arranged within the pixel array section 40. Thus, when the event pixel signal output by the motion detection multi-use pixel 552 configured within the multi-use pixel 55 is output in the solid-state imaging device 3, it is possible to read pixel signals of one frame of the normal photographing from normal multi-use pixels 541 configured within the multi-use pixel 55 is switched to the normal photographing. In other words, in the solid-state imaging device 3, as in the solid-state imaging device 2 of the second embodiment, there is also no pixel signal deficient in the normal photographing. Thus, when an image according to pixel signals is generated, the image processing section configured to generate the image according to the pixel signals in the normal photographing output from the solid-state imaging device 3 also does not need to perform an arithmetic operation of interpolating a pixel signal of a pixel which is deficient.

However, in the solid-state imaging device 3, as in the solid-state imaging device 2 of the second embodiment, normal reading in which a pixel signal is read from the normal multi-use pixel 541 configured within the multi-use pixel 55 and motion detection reading in which a motion detection pixel signal (an event pixel signal) is read from the motion detection multi-use pixel 552 configured within the multi-use pixel 55 are also performed in a time division manner.

In the configuration of the multi-use pixel 55 shown in FIG. 16, a configuration in which one motion detection multi-use pixel 552 shares photoelectric conversion elements PD12 (a photoelectric conversion element PD12*a* and a photoelectric conversion element PD12*b*) with two normal multi-use pixels 541 (a normal multi-use pixel 541a and a normal multi-use pixel 541b) is shown. However, the configuration of the multi-use pixel 55 is not limited to the configuration shown in FIG. 16. In other words, the number of photoelectric conversion elements PD12 used in one motion detection multi-use pixel 552 in the multi-use pixel 55 is not limited to two as shown in FIG. 16. For example, in the multi-use pixel 55, one motion detection multi-use pixel 552 may have a configuration in which four normal multi-use pixels 541 and four photoelectric conversion element PD12 are used together, i.e., the motion detection multi-use pixels 552 may have a configuration in which are motion of an object is detected on the basis of a charge signal obtained by summing charge signals generated by the four photoelectric conversion elements PD12.

A case in which multi-use pixels 55 from which a pixel signal of normal photographing and an event pixel signal are read are uniformly arranged within the pixel array section 40 in the solid-state imaging device 3 has been described. However, the arrangement of the multi-use pixels 55 within the pixel array section 40 in the solid-state imaging device 3 is not limited to the uniform arrangement in the entire region of the pixel array section 40. For example, even if the normal multi-use pixels 541 including the photoelectric conversion elements PD12 also used in the motion detection multi-use pixel 552 configured within the multi-use pixel 55 are arranged periodically in the row direction and the column direction of the pixel array section 40. In this case, a high-definition normal pixel 51 (or normal pixel 53) may be arranged at a position of a photoelectric conversion element which is not shared with the motion detection multi-use pixel 552 configured within the multi-use pixel 55.

Modified Example of Third Embodiment

Figure 18:
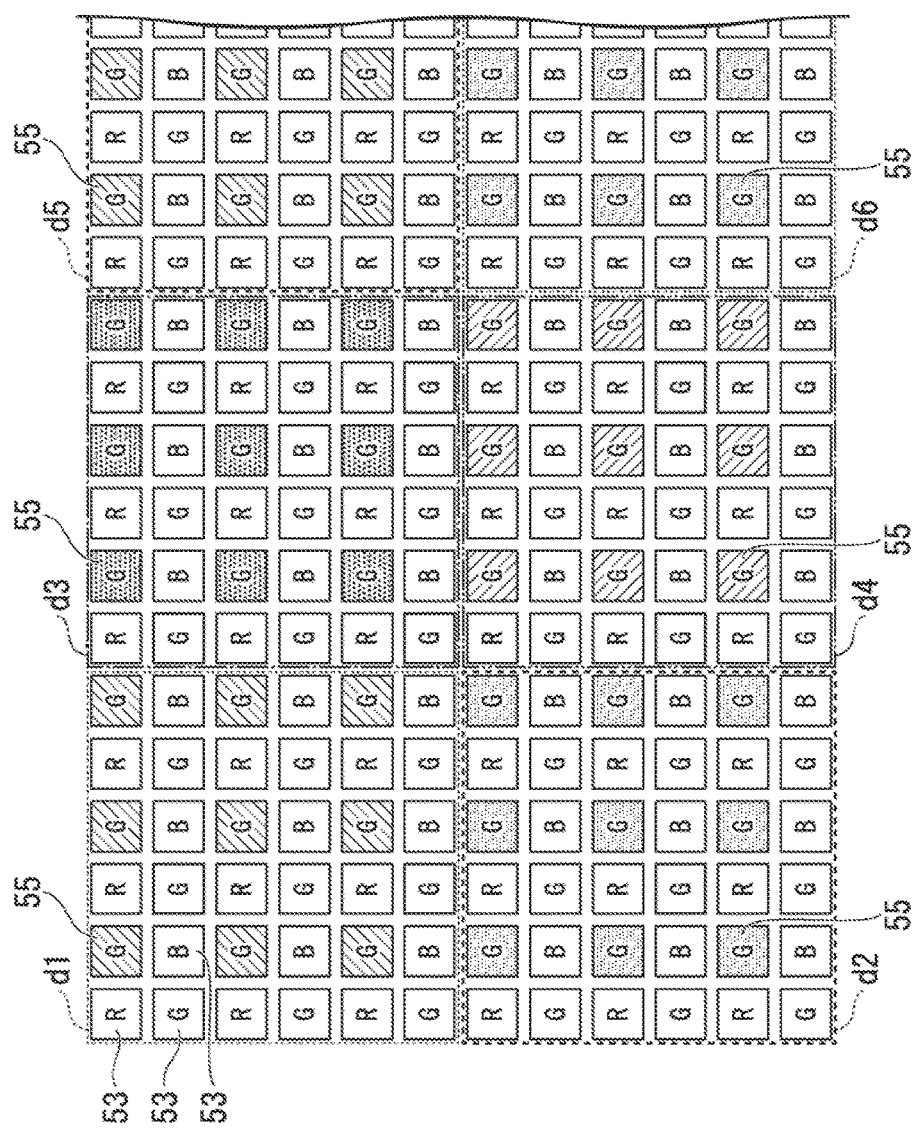
FIG. 18 is a diagram schematically showing an example of an arrangement of pixels in the solid-state imaging device according to the third embodiment of the present invention.

Here, an example of an arrangement of normal pixels 51 (or normal pixels 53) and multi-use pixels 55 within the pixel array section 40 in the solid-state imaging device 3 of the third embodiment will be described. FIG. 18 is a diagram schematically showing an example of an arrangement of pixels 50 (the normal pixels 51 (or the normal pixels 53) and the multi-use pixels 55) in the solid-state imaging device 3 according to the third embodiment of the present invention. In FIG. 18, an example of an arrangement of the normal pixels 53 and the multi-use pixels 55 within the pixel array section 40 of the first semiconductor substrate 11 constituting the solid-state imaging device 3 in which color filters corresponding to light of wavelength bands of red (R), green (G), and blue (B) are attached to a side on which light is incident on each of the normal pixels 51 (or the normal pixels 53) and the multi-use pixels 55 in a Bayer array is shown.

In the arrangement example of the pixels 50 in the solid-state imaging device 3 shown in FIG. 18, the multi-use pixels 55 are arranged so that the normal pixels 53 are uniformly arranged in the entire plane region of the pixel array section 40 and the photoelectric conversion element PD1 provided in the normal pixel 53 arranged at a predetermined position is also used in the motion detection multi-use pixel 552 configured within the multi-use pixel 55. In other words, the normal pixels 53 arranged in the pixel array section 40 are arranged to be periodically replaced with the multi-use pixels 55 in the row direction and the column direction. More specifically, the photoelectric conversion element PD1 provided in the normal pixel 53 arranged at a position at which a color filter corresponding to light of a wavelength band of green (G) of a row to which a color filter corresponding to light of the wavelength band of red (R) is attached in the pixel array section 40 is attached is arranged to be also used in the motion detection multi-use pixel 552 configured within the multi-use pixel 55. Thereby, the motion detection multi-use pixel 552 can detect the motion of the object with light of the wavelength band of green (G) capable of being regarded as representing luminance in an image generated in normal photographing.

As described above, the reading circuit of the motion detection multi-use pixel 552 formed on the second semiconductor substrate 12 is formed to include a region overlapping that of the normal pixel 53 formed on the first semiconductor substrate 11. Accordingly, in the arrangement example of the pixels 50 in the solid-state imaging device 3 shown in FIG. 18, the reading circuit of the motion detection multi-use pixel 552 is formed on the second semiconductor substrate 12 corresponding to each of rectangular regions d1 to d6 of 6 rows and 6 columns.

(Pixel Designation Method of Modified Example of Third Embodiment)

Next, a method of designating a normal multi-use pixel 541 in the solid-state imaging device 3 according to a modified example of the third embodiment will be described. Also, a method of determining a reading region of a multi-use pixel 55 (a normal multi-use pixel 541) from which the reading address control circuit 100 outputs (reads) a pixel signal in the solid-state imaging device 3 of the modified example is also similar to the first to third pixel designation methods in the solid-state imaging device 1 of the first embodiment. Accordingly, a detailed description of the method of determining the reading region of the multi-use pixel 55 (the normal multi-use pixel 541) from which the reading address control circuit 100 outputs (reads) the pixel signal in the solid-state imaging device 3 of the modified example will be omitted. In the following description, a configuration in which a multi-use pixel 55 (a normal multi-use pixel 541) from which a pixel signal is output in the solid-state imaging device 3 according to the modified example will be described. In the following description, a case in which the normal pixel 53 and the multi-use pixel 55 are arranged in the plane region of the pixel array section 40 of the solid-state imaging device 3 as shown in FIG. 18 will be described.

Figure 19:
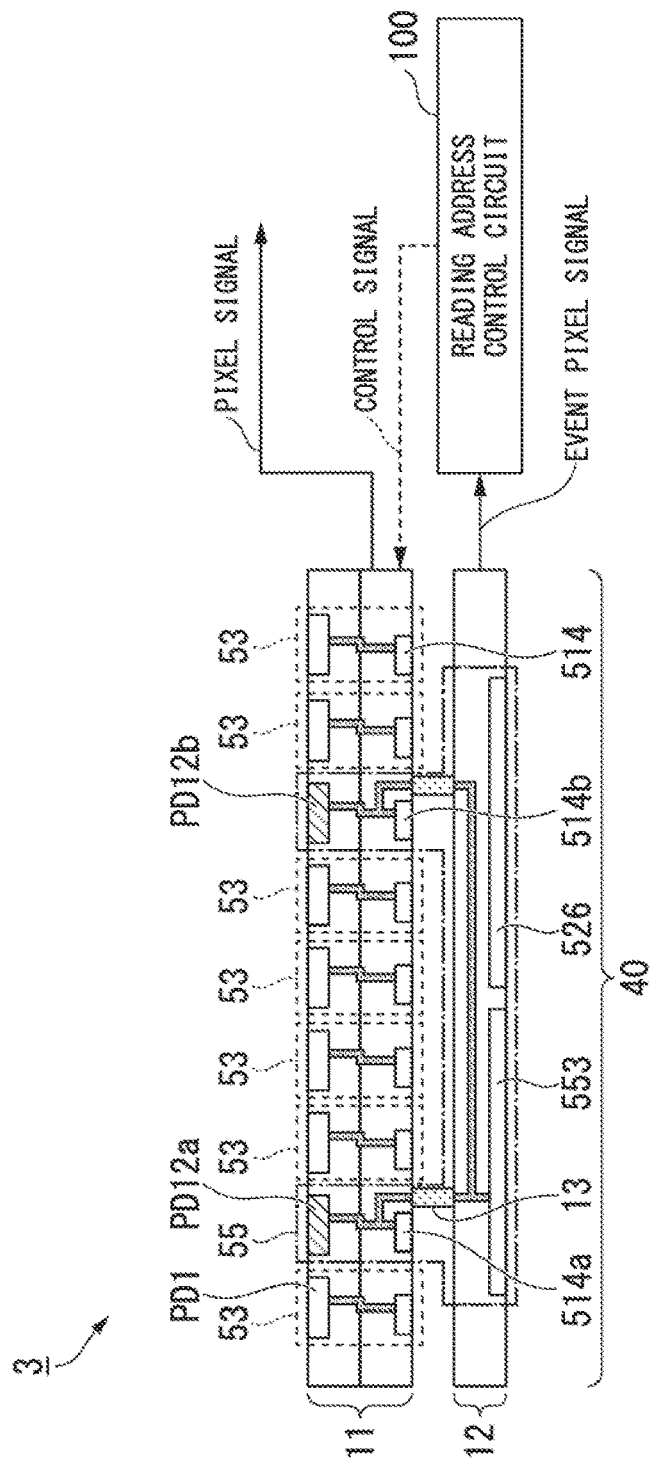
FIG. 19 is a diagram showing another configuration in which pixel signals are output in the solid-state imaging device according to the third embodiment of the present invention.

FIG. 19 is a diagram showing another configuration in which pixel signals are output in the solid-state imaging device 3 according to the modified example of the third embodiment of the present invention. In FIG. 19, a vertical structure of a part of the pixel array section 40 in which normal pixels 53 and multi-use pixels 55 are arranged in the solid-state imaging device 3 of the modified example and the reading address control circuit 100 provided in the control circuit 10 are shown. More specifically, signals exchanged between the normal pixels 53 formed on the first semiconductor substrate 11, the multi-use pixels 55 formed on the first semiconductor substrate 11 and the second semiconductor substrate 12, and the reading address control circuit 100 are shown. Also, in FIG. 19, a multi-use pixel 55 having a configuration in which both photoelectric conversion elements PD12 (the photoelectric conversion element PD12a and the photoelectric conversion element PD12b) are used in normal multi-use pixels 541 corresponding to two normal pixels 53 and the motion detection multi-use pixel 552 is shown. Accordingly, the multi-use pixel 55 is a multi-use pixel configured to detect the motion of the object on the basis of a charge signal generated by each of the photoelectric conversion element PD12a and the photoelectric conversion element PD12b.

In the solid-state imaging device 3 of the modified example, the photoelectric conversion element PD1 and the reading circuit of the normal pixel 53 are formed on the first semiconductor substrate 11. In FIG. 19, a state in which the photoelectric conversion element PD1 of the normal pixel 53 and a selection transistor 514 provided in the reading circuit of the normal pixel 53 are formed on the first semiconductor substrate 11 is shown.

Also, in the solid-state imaging device 3 of the modified example, the photoelectric conversion elements PD12 of the multi-use pixel 55, the reading circuits of the normal multi-use pixels 541 configured within the multi-use pixel 55, and the output circuit of the motion detection multi-use pixel 552 configured within the multi-use pixel 55 are formed on the first semiconductor substrate 11. Also, as described above, in the solid-state imaging device 3 of the modified example, the reading circuit of the motion detection multi-use pixel 552 configured within the multi-use pixel 55 is formed on the second semiconductor substrate 12. In FIG. 19, a state in which the two photoelectric conversion elements PD12a and PD12b of the multi-use pixel 55 and the selection transistors 514 (the selection transistors 514a and 514b) provided in the reading circuit of each normal multi-use pixel 541 are formed on the first semiconductor substrate 11 is shown. Also, in FIG. 19, a state in which the switched capacitor amplifier circuit 553 and the AER circuit 526 provided in the reading circuit of the motion detection multi-use pixel 552 are formed on the second semiconductor substrate 12 is shown.

At this time, in the solid-state imaging device 3 of the modified example, the reading circuit of the motion detection multi-use pixel 552 is formed in a region of the second semiconductor substrate 12 including a region overlapping that of the output circuit of the normal multi-use pixel 541 and the motion detection multi-use pixel 552 formed on the first semiconductor substrate 11. In FIG. 19, a state in which the switched capacitor amplifier circuit 553 and the AER circuit 526 provided in the reading circuit of the motion detection multi-use pixel 552 are formed in a region of the second semiconductor substrate 12 including a region overlapping that of the output circuit of the normal pixel 53 and the motion detection multi-use pixel 552 formed on the first semiconductor substrate 11 is shown.

In the solid-state imaging device 3 of the modified example, the reading circuit of the motion detection multi-use pixel 552 and the output circuit of each motion detection multi-use pixel 552 corresponding thereto are electrically connected by the chip connection section 13 formed between the first semiconductor substrate 11 and the second semiconductor substrate 12. In FIG. 19, a state in which an amplifier 521a (not shown) and an amplifier 521b (not shown) provided in the output circuit of each motion detection multi-use pixel 552 formed on the first semiconductor substrate 11 and the switched capacitor amplifier circuit 553 provided in the reading circuit of the motion detection multi-use pixel 552 formed on the second semiconductor substrate 12 are connected by the corresponding chip connection section 13 is shown.

In the solid-state imaging device 3 of the modified example, as in a case in which the multi-use pixels 55 are uniformly arranged in the entire plane region of the pixel array section 40, the AER circuit 526 of the motion detection multi-use pixel 552 formed on the second semiconductor substrate 12 also outputs an event pixel signal to the reading address control circuit 100 when a change over time in a charge signal generated by each of the photoelectric conversion element PD12a and the photoelectric conversion element PD12b is detected.

When the event pixel signal is input, the reading address control circuit 100 detects (confirms) a position of the multi-use pixel 55 having output the event pixel signal from the address information included in the input event pixel signal. Also, a concept when the reading address control circuit 100 detects (confirms) the position of the multi-use pixel 55 having output the event pixel signal is similar to a concept when the multi-use pixels 55 are uniformly arranged in the entire plane region of the pixel array section 40. For example, when an event pixel signal is input from the motion detection multi-use pixel 552 arranged in the region d1 shown in FIG. 18, the reading address control circuit 100 detects (confirms) a position of the normal multi-use pixel 541 arranged in a 4th column of a 3rd row corresponding to a region d1 in which the motion detection multi-use pixel 552 having output the event pixel signal is arranged or a center position of the region d1 as a position of the multi-use pixel 55 having output the event pixel signal.

Then, the reading address control circuit 100 determines a region of the normal multi-use pixel 541 arranged in a predetermined reading region around the detected (confirmed) position of the multi-use pixel 55 as a reading region in which a pixel signal is output (read) from the normal multi-use pixel 541 and outputs (reads) a pixel signal from the normal multi-use pixel 541 arranged within the determined reading region.

Thereby, the image processing section configured to generate an image on the basis of pixel signals in the normal photographing output from the solid-state imaging device 3 of the modified example can generate an image according to the pixel signals without performing an arithmetic operation of interpolating a pixel signal of a pixel which is deficient.

As described above, in the solid-state imaging device 3, as in the solid-state imaging device 2 of the second embodiment, a pixel signal of the normal photographing is output (read) from only a normal multi-use pixel 541 or a normal pixel 51 (or a normal pixel 53) arranged in a predetermined small reading region corresponding to a position at which the multi-use pixel 55 having detected the motion of the object is arranged. Thereby, in the solid-state imaging device 3, as in the solid-state imaging device 2 of the second embodiment, it is also possible to reduce power consumption when a pixel signal according to the detected motion of the object is read.

In the solid-state imaging device 3, as in the configuration of the multi-use pixel 55 shown in FIG. 16, a configuration in which one motion detection multi-use pixel 552 shares photoelectric conversion elements PD12 with a plurality of (two in FIG. 16) normal multi-use pixels 541 is shown. In other words, a case in which the motion detection multi-use pixel 552 configured within the multi-use pixel 55 is a pixel configured to implement an object motion detection function to be performed by one motion detection pixel 52 on the basis of charge signals generated by a plurality of (two in FIG. 16) photoelectric conversion elements PD12 corresponding to the photoelectric conversion element PD2 has been described. However, a configuration in which charge signals generated by the plurality of photoelectric conversion elements are used when the function of one motion detection pixel 52 is implemented is not limited to the configuration shown in FIG. 16. For example, one motion detection pixel 52 may be configured to detect the motion of an object on the basis of a charge signal obtained by summing charge signals generated by a plurality of photoelectric conversion elements PD2. In the case of this configuration, the motion detection pixel 52 can detect the motion of the object on the basis of a larger charge signal and improve the accuracy of motion detection without increasing the area of one photoelectric conversion element PD2.

The vertical structure of the pixel array section 40 in this configuration is conceivable as being similar to a structure in which the motion detection pixel 52 configured to detect the motion of the object on the basis of the above-described charge signal obtained by summing the charge signals generated by the plurality of photoelectric conversion elements PD2 is formed in place of the multi-use pixel 55 formed on the first semiconductor substrate 11 and the second semiconductor substrate 12 in the vertical structure of the solid-state imaging device 3 of the modified example shown in FIG. 19. Accordingly, the photoelectric conversion elements PD12 (the photoelectric conversion element PD12a and the photoelectric conversion element PD12b) shown in FIG. 19 serve as photoelectric conversion elements PD2 configured to generate charge signals to be used to detect the motion of the object in one motion detection pixel 52 configured to detect the motion of the object on the basis of the above-described charge signal obtained by summing the charge signals generated by the plurality of photoelectric conversion elements PD2.

According to the third embodiment, the solid-state imaging device (the solid-state imaging device 3) in which m is less than n, s is a natural number greater than or equal to 2, each of the m second reading circuits (reading circuits of the motion detection pixels 52) further includes an addition circuit (a capacitor 5231a and a capacitor 5231b) configured to sum s first charge signals generated by s corresponding first photoelectric conversion elements (photoelectric conversion elements PD1) as one unit, and a detection circuit (a threshold amplifier 524 and a threshold amplifier 525) detects a change in a first charge signal after summation by the capacitor 5231a and the capacitor 5231b is configured.

Also, according to the third embodiment, the solid-state imaging device 3 in which each of the reading circuits of the motion detection pixels 52 further includes the addition circuit (the capacitor 5231a and the capacitor 5231b) configured to sum second charge signals generated by t second photoelectric conversion elements by using the t second photoelectric conversion elements (photoelectric conversion elements PD2) as one unit, the detection circuit (the threshold amplifier 524 and the threshold amplifier 525) detects a change in the second charge signal after summation by the capacitor 5231a and the capacitor 5231b, and t is a natural number greater than or equal to 2 is configured.

As described above, in the solid-state imaging device 3 of the third embodiment, as in the solid-state imaging device 2 of the second embodiment, both the normal photographing and the motion detection for sequentially detecting the motion of the object can also be achieved. In the solid-state imaging device 3 of the third embodiment, it is also possible to obtain effects similar to those of the solid-state imaging device 2 of the second embodiment by outputting (reading) a pixel signal from the normal multi-use pixel 541 or the normal pixel 51 (or the normal pixel 53) arranged within a predetermined small reading region corresponding to the position of the motion detection multi-use pixel 552 having output the event pixel signal.

A photoelectric conversion element PD1 provided in a normal pixel 51 (or a normal pixel 53) arranged at a position of the pixel array section 40 to which a color filter corresponding to light of a wavelength band of green (G) of a Bayer array is attached is also used in the motion detection multi-use pixel 552 configured within the multi-use pixel 55 in the solid-state imaging device 3 of the third embodiment has been described with reference to FIG. 18. However, colors of the color filters attached to the solid-state imaging device 3 or an array thereof are not particularly specified in the present invention. For example, color filters corresponding to light of wavelength bands of red (R), green (G), blue (B), and white (W) may be attached to a side on which light is incident on each of the normal pixel 51 (or the normal pixel 53) and the multi-use pixel 55. Then, the photoelectric conversion element PD1 provided in the normal pixel 51 (or the normal pixel 53) arranged at the position of the pixel array section 40 to which the color filter corresponding to the light of the wavelength band of white (W) is attached may be configured to be also used in the motion detection multi-use pixel 552 configured within the multi-use pixel 55. In this case, the motion detection multi-use pixel 552 can detect motion of the object without light of a specific wavelength band. Also, for example, a configuration in which color filters corresponding to light of wavelength bands of red (R), green (G), blue (B), and near infrared (Ir) are attached to a side on which light is incident on each of the normal pixels 51 (or the normal pixels 53) and the multi-use pixels 55 and the photoelectric conversion element PD1 provided in the normal pixel 51 (or the normal pixel 53) arranged at the position of the pixel array section 40 to which a color filter corresponding to light of a wavelength band of near infrared (Ir) is attached is also used in the motion detection multi-use pixel 552 may be adopted. In this case, for example, it is also possible to adopt a configuration in which the accuracy of motion detection is improved by providing a light source configured to emit infrared light in an imaging system equipped with the solid-state imaging device 3 and radiating infrared light when the motion of the object is detected.

A configuration in which an arithmetic operation of interpolating a pixel signal of a pixel which is deficient in the normal photographing is not performed by adopting a configuration in which the photoelectric conversion element PD1 provided in the normal pixel 51 (or the normal pixel 53) is also used in the motion detection multi-use pixel 542 (the motion detection multi-use pixel 552) in the solid-state imaging device 2 of the second embodiment and the solid-state imaging device 3 of the third embodiment has been described. However, a configuration in which an arithmetic operation of interpolating a pixel signal of a pixel which is deficient in the normal photographing is not performed may be adopted in a configuration other than a configuration in which the photoelectric conversion element PD1 is also used in the motion detection multi-use pixel 542 (or the motion detection multi-use pixel 552).

Fourth Embodiment

Next, a fourth embodiment of the present invention will be described. A solid-state imaging device according to the fourth embodiment of the present invention (hereinafter referred to as a "solid-state imaging device 4") is a solid-state imaging device having a configuration in which an arithmetic operation of interpolating a pixel signal of a pixel which is deficient in the normal photographing is not performed if a configuration of the pixel 50 is the normal pixel 51 shown in FIG. 3A and the motion detection pixel 52 shown in FIG. 3B in the first embodiment. In other words, similar to the solid-state imaging device 2 of the second embodiment and the solid-state imaging device 3 of the third embodiment, the solid-state imaging device 4 has a configuration in which the configuration of the pixel 50 is not changed and an arithmetic operation of interpolating a pixel signal of a pixel which is deficient in the normal photographing is not performed.

The overview and schematic configuration of the solid-state imaging device 4 are similar to those of the solid-state imaging device 1 according to the first embodiment shown in FIG. 1 and FIG. 2. Accordingly, in the following description, the same reference signs are used for components of the solid-state imaging device 4 similar to those of the solid-state imaging device 1 of the first embodiment and a detailed description of the components and operations will be omitted.

In the solid-state imaging device 4, normal pixels 51 are uniformly arranged (formed) in the entire plane region of a pixel array section 40 of a first semiconductor substrate 11 and motion detection pixels 52 are uniformly arranged (formed) in the entire plane region of a pixel array section 40 of a second semiconductor substrate 12. In other words, the solid-state imaging device 4 has a configuration in which two solid-state imaging devices, i.e., a solid-state imaging device in which normal pixels 51 are arranged and a solid-state imaging device in which the motion detection pixels 52 are arranged, are stacked (bonded).

Also, a configuration of the normal pixel 51 is similar to that of the normal pixel 51 shown in FIG. 3A. Accordingly, a detailed description of the configuration and operation of the normal pixel 51 will be omitted. Also, because a configuration of the motion detection pixel 52 is similar to that of the motion detection pixel 52 shown in FIG. 3B, and the motion detection pixel 52 is formed on the second semiconductor substrate 12, only a difference is that the chip connection section 13 is deleted. Accordingly, a detailed description of the configuration and operation of the motion detection pixel 52 will be omitted.

In the solid-state imaging device 4, instead of the normal pixels 51 formed on the first semiconductor substrate 11, the normal pixels 53 shown in FIG. 11 may be formed on the first semiconductor substrate 11.

(Pixel Designation Method of Fourth Embodiment)

Next, a method of designating the pixel 50 (a normal pixel 51 or a normal pixel 53) in the solid-state imaging device 4 of the fourth embodiment will be described. A method in which a reading address control circuit 100 determines a reading region in which the normal pixel 51 outputs (reads) a pixel signal in the solid-state imaging device 4 is similar to the first to third pixel designation methods in the solid-state imaging device 1 of the first embodiment. Accordingly, a detailed description of the method in which the reading address control circuit 100 determines the reading region in which the normal pixel 53 outputs (reads) the pixel signal in the solid-state imaging device 4 will be omitted. In the following description, a configuration in which the normal pixel 51 (or the normal pixel 53) configured to output the pixel signal in the solid-state imaging device 4 is designated will be described.

Figure 20:
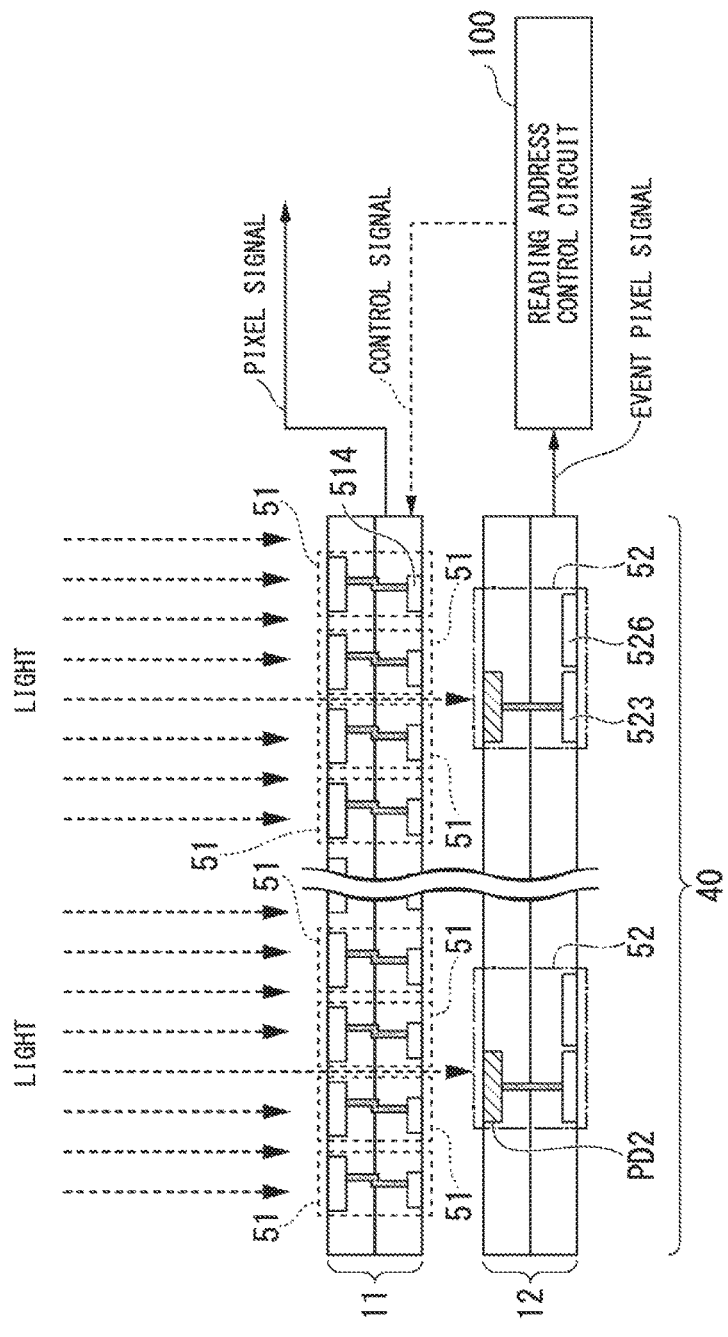
FIG. 20 is a diagram showing a configuration in which pixel signals are output in the solid-state imaging device according to a fourth embodiment of the present invention.

FIG. 20 is a diagram showing a configuration in which pixel signals are output in the solid-state imaging device 4 according to the fourth embodiment of the present invention. In FIG. 20, a vertical structure of a part of the pixel array section 40 in which the normal pixels 51 and the motion detection pixels 52 are uniformly arranged in the solid-state imaging device 4 and the reading address control circuit 100 provided in the control circuit 10 are shown. More specifically, signals exchanged between the normal pixels 51 formed on the first semiconductor substrate 11 and the motion detection pixels 52 formed on the second semiconductor substrate 12 and the reading address control circuit 100 are shown.

In the solid-state imaging device 4, a photoelectric conversion element PD1 and a reading circuit of the normal pixel 51 are formed on the first semiconductor substrate 11. In FIG. 20, a state in which the photoelectric conversion element PD1 of the normal pixel 51 and a selection transistor 514 provided in the reading circuit of the normal pixel 51 are formed on the first semiconductor substrate 11 is shown.

Also, in the solid-state imaging device 4, a photoelectric conversion element PD2, an output circuit, and a reading circuit of the motion detection pixel 52 are formed on the second semiconductor substrate 12. In FIG. 20, a state in which the photoelectric conversion element PD2 of the motion detection pixel 52 and a switched capacitor amplifier circuit 523 and an AER circuit 526 provided in the reading circuit of the motion detection pixel 52 are formed on the second semiconductor substrate 12 is shown.

At this time, in the solid-state imaging device 4, the motion detection pixels 52 are formed in the region of the second semiconductor substrate 12 overlapping the region of the normal pixels 51 formed on the first semiconductor substrate 11. In FIG. 20, a state in which the motion detection pixel 52 is formed in the region of the second semiconductor substrate 12 overlapping a region of four normal pixels 51 formed on the first semiconductor substrate 11 is shown.

In the solid-state imaging device 4, the photoelectric conversion element PD2 of each motion detection pixel 52 arranged on the second semiconductor substrate 12 generates a charge signal obtained by photoelectrically converting light (a light beam) passing through a region of the photoelectric conversion element PD1 of the normal pixel 51 arranged on the first semiconductor substrate 11. Thus, the photoelectric conversion element PD2 generates a larger charge signal with respect to more light having a long wavelength that passes through the first semiconductor substrate 11. In consideration of this fact, for example, it is desirable to form the photoelectric conversion element PD2 of the motion detection pixel 52 formed on the second semiconductor substrate 12 at a position corresponding to a normal pixel 51 to which a color filter corresponding to more light of a wavelength band of red (R) passing through the normal pixel 51 is attached because the wavelength length is long in the solid-state imaging device 4. However, colors and arrays of color filters to be attached to the solid-state imaging device 4 are not particularly specified in the present invention.

If the photoelectric conversion element PD2 of the motion detection pixel 52 formed on the second semiconductor substrate 12 in the solid-state imaging device 4 is formed at a position corresponding to the normal pixel 51 to which the color filter corresponding to the light of the wavelength band of red (R) is attached, it is also possible to adopt, for example, a configuration in which the accuracy of motion detection is improved by operating a light source configured to emit infrared light in an imaging system equipped with the solid-state imaging device 4 as auxiliary light when a motion of an object is detected.

In the solid-state imaging device 4, as in the solid-state imaging device 1 of the first embodiment, when the AER circuit 526 of the motion detection pixel 52 formed on the second semiconductor substrate 12 detects a change over time in the charge signal generated by the photoelectric conversion element PD2, an event pixel signal is output to the reading address control circuit 100.

When the event pixel signal is input, the reading address control circuit 100 detects (confirms) a position of the motion detection pixel 52 having output the event pixel signal from the address information included in the input event pixel signal as in the solid-state imaging device 1 of the first embodiment. Then, the reading address control circuit 100 determines the region of the normal pixel 51 arranged in a predetermined reading region around the position of the detected (confirmed) motion detection pixel 52 as the reading region in which the pixel signal is output (read) from the normal pixel 51.

As in the solid-state imaging device 1 of the first embodiment, the reading address control circuit 100 outputs a control signal for designating the normal pixel 51 arranged in the determined reading region to a vertical scanning circuit 20 and a horizontal scanning circuit 30 and outputs (reads) the pixel signal from the normal pixel 51 arranged in the determined reading region.

In the solid-state imaging device 4, the normal pixels 51 (or the normal pixels 53) are uniformly arranged in the pixel array section 40 of the first semiconductor substrate 11 and the motion detection pixels 52 are uniformly arranged in the pixel array section 40 of the second semiconductor substrate 12. Thus, in the solid-state imaging device 4, as in the solid-state imaging device 2 of the second embodiment and the solid-state imaging device 3 of the third embodiment, there is no deficient pixel signal in the normal photographing. Thereby, the image processing section configured to generate an image on the basis of pixel signals in the normal photographing output from the solid-state imaging device 4 can generate an image according to the pixel signals without performing an arithmetic operation of interpolating a pixel signal of a pixel which is deficient.

Moreover, in the solid-state imaging device 4, the normal pixel 51 (or the normal pixel 53) and the motion detection pixel 52 do not share the photoelectric conversion element. Thus, in the solid-state imaging device 4, it is not necessary to exclusively perform normal reading for reading a pixel signal from the normal pixel 51 (or the normal pixel 53) and motion detection reading for reading a motion detection pixel signal (an event pixel signal) from the motion detection pixel 52. Accordingly, in the solid-state imaging device 4, as in the solid-state imaging device 2 of the second embodiment and the solid-state imaging device 3 of the third embodiment, normal reading in which a pixel signal is read from the normal pixel 51 (or the normal pixel 53) and motion detection reading in which a motion detection pixel signal (an event pixel signal) is read from the motion detection pixel 52 can be simultaneously performed without being performed in a time division manner.

Also in the solid-state imaging device 4, as in the solid-state imaging device 3 of the third embodiment, one motion detection pixel 52 can be configured to detect the motion of the object on the basis of a charge signal obtained by summing charge signals generated by the plurality of photoelectric conversion elements PD2. With this configuration, the motion detection pixel 52 can generate a charge signal obtained by photoelectrically converting light (a light beam) passing through a region of photoelectric conversion elements PD1 of a plurality of normal pixels 51 arranged in the first semiconductor substrate 11. Thereby, in the solid-state imaging device 4, as in the solid-state imaging device 3 of the third embodiment, the motion detection pixel 52 can also detect the motion of the object on the basis of a larger charge signal and improve the accuracy of motion detection without increasing the area of one photoelectric conversion element PD2.

According to the fourth embodiment, the solid-state imaging device (the solid-state imaging device 4) in which each of the n first photoelectric conversion elements (the photoelectric conversion elements PD1) is periodically arranged on a first semiconductor substrate (the first semiconductor substrate 11) on which light is incident, each of the in second photoelectric conversion elements (the photoelectric conversion elements PD2) is periodically arranged on a second semiconductor substrate (the second semiconductor substrate 12) stacked on a surface of the first semiconductor substrate 11, the surface being opposite to a side on which light is incident and generates the second charge signal obtained by photoelectrically converting light passing through the first semiconductor substrate 11 is configured.

As described above, in the solid-state imaging device 4 of the fourth embodiment, as in the solid-state imaging device 1 of the first embodiment, each of the normal pixel 51 (or the normal pixel 53) specialized for outputting a pixel signal in the normal photographing and the motion detection pixel 52 specialized for outputting an event pixel signal in the motion detection is arranged within the pixel array section 40. At this time, in the solid-state imaging device 4 of the fourth embodiment, the normal pixels 51 (or the normal pixels 53) are uniformly arranged in the entire plane region of the pixel array section 40 of the first semiconductor substrate 11. Also, in the solid-state imaging device 4 of the fourth embodiment, the motion detection pixels 52 are uniformly arranged in the entire plane region of the pixel array section 40 of the second semiconductor substrate 12. Thereby, in the solid-state imaging device 4 of the fourth embodiment, as in the solid-state imaging device 1 of the first embodiment, it is also possible to achieve both the normal photographing and the motion detection for sequentially detecting motion of the object. In the solid-state imaging device 4 of the fourth embodiment, the normal reading and the motion detection reading can be performed in the same period. Also, in the solid-state imaging device 4 of the fourth embodiment, it is possible to obtain effects similar to those of the solid-state imaging device 1 of the first embodiment by outputting (reading) a pixel signal from a normal pixel 51 (or a normal pixel 53) arranged within a predetermined small reading region corresponding to the position of the motion detection pixel 52 having output the event pixel signal.

Also, in the solid-state imaging device 4 of the fourth embodiment, a deficient pixel signal in the normal photographing is eliminated by forming normal pixels 51 (or normal pixels 53) specialized for outputting the pixel signals in the normal photographing on the first semiconductor substrate 11 and forming motion detection pixels 52 specialized for outputting event pixel signals in the motion detection on the second semiconductor substrate 12. Thereby, as in the solid-state imaging device 2 of the second embodiment and the solid-state imaging device 3 of the third embodiment, the image processing section provided in the imaging system equipped with the solid-state imaging device 4 of the fourth embodiment can generate a high-quality image reflecting the motion of the object with a short time lag when the motion of the object is detected with a small processing load.

As described above, according to the embodiments of the present invention, a normal pixel configured to output a pixel signal of the normal photographing and a motion detection pixel configured to output an event pixel signal of motion detection are arranged as pixels provided in the solid-state imaging device in the pixel array section. In each embodiment of the present invention, the number of normal pixels arranged in the pixel array section is more than the number of motion detection pixels. Thereby, in each embodiment of the present invention, both the normal photographing and the motion detection for sequentially detecting the motion of the object can be achieved and the quality of images generated in the normal photographing can be improved.

In each embodiment of the present invention, when an event pixel signal is output from a motion detection pixel, a pixel signal obtained in the normal photographing is read from a normal pixel having output an event pixel signal. i.e., arranged within a predetermined reading region around a position within a pixel array section in which a motion detection pixel having detecting the motion of the object is arranged. In other words, when the motion of the object is detected in each embodiment of the present invention, pixel signals are not read from all the normal pixels arranged in the pixel array section, but pixel signals are read from a small number of normal pixels within a predetermined reading region. In other words, in each embodiment of the present invention, a pixel signal is read from only a predetermined neighboring region (reading region) of a normal pixel changed by detecting the motion of the object. Thereby, in the solid-state imaging device according to each embodiment of the present invention, power consumption when the pixel signal obtained through the normal photographing is read to generate an image reflecting the motion of the object can be reduced more than in that of the conventional solid-state imaging device.

Also, in each embodiment of the present invention, because pixel signals are read from normal pixels arranged within the small reading region where the motion of the object is detected, the number of pixel signals to be read to generate an image reflecting the motion of the object is small. Thus, in the imaging system equipped with the solid-state imaging device according to each embodiment of the present invention, it is necessary to reduce pressure on a data transmission band required for transmitting the pixel signal read in accordance with the motion of the object, i.e., a so-called bus band. The image processing section provided in the imaging system equipped with the solid-state imaging device according to each embodiment of the present invention mounted thereon performs image processing by replacing some pixel signals (a small number of pixel signals) corresponding to a position at which the motion of the object is detected among pixel signals of one frame. Thereby, the image processing section provided in the imaging system mounting the solid-state imaging device according to each embodiment of the present invention can generate a high-quality image reflecting the motion of the object with a short time lag when the motion of the object is detected with small processing load.

In each embodiment of the present invention, a configuration in which the reading address control circuit 100 is provided in the control circuit 10 has been described. However, a configuration including the reading address control circuit 100 is not limited to the configuration of each embodiment of the present invention. For example, the reading address control circuit 100 may be provided outside the control circuit 10, i.e., in parallel to the control circuit 10 and/or the vertical scanning circuit 20. Also, for example, the reading address control circuit 100 may be configured to be provided outside the solid-state imaging device, i.e., as a component of the imaging system.

While preferred embodiments of the present invention have been described and shown above, it should be understood that these are exemplary of the invention and the present invention is not limited to these embodiments and modified examples thereof. Within a range not departing from the gist or spirit of the present invention, additions, omissions, substitutions, and other modifications to the configuration can be made.

Also, the present invention is not to be considered as being limited by the foregoing description, and is limited only by the scope of the appended claims.

Also, in the solid-state imaging device according to each embodiment of the present invention, two semiconductor substrates may be connected by a chip connection section, or three or more semiconductor substrates may be connected by a chip connection section. In the case of a solid-state imaging device in which three or more semiconductor substrates are connected by a chip connection section, two semiconductor substrates among them correspond to the first semiconductor substrate and the second semiconductor substrate according to the claims.

What is claimed is:

1. A solid-state imaging device comprising:
   n first photoelectric conversion elements configured to photoelectrically convert incident light and generate first charge signals;
   n first reading circuits corresponding to the n first photoelectric conversion elements and configured to output signal voltages as first pixel signals, according to the first charge signals generated by the corresponding first photoelectric conversion elements;
   m second photoelectric conversion elements configured to photoelectrically convert incident light and generate second charge signals;
   m second reading circuits corresponding to the m second photoelectric conversion elements and configured to sequentially output second pixel signals according to changes in the second charge signals generated by the corresponding second photoelectric conversion elements, and
   a reading control circuit configured to control reading of the first pixel signals corresponding to the first photoelectric conversion elements arranged in predetermined reading regions within the first photoelectric conversion elements,
   wherein each of the m second reading circuits includes
      a detection circuit configured to detect a change over time in the second charge signal generated by the corresponding second photoelectric conversion element and output an event signal indicating the change when the change exceeding a predetermined threshold value is detected; and
      a pixel signal generation circuit configured to output the second pixel signal which is made by adding address information indicating a position at which the corresponding second photoelectric conversion element is arranged to the event signal,
   wherein the reading control circuit determines a region according to a position at which the second photoelectric conversion element corresponding to the address information included in the second pixel signal is arranged as the reading region for reading the first pixel signal, and causes each of the first reading circuits corresponding to each of the first photoelectric conversion elements arranged in the determined reading region to output the first pixel signal,
   wherein n is a natural number greater than or equal to 2, and
   wherein m is a natural number greater than or equal to 2.

2. The solid-state imaging device according to claim 1,
wherein the reading control circuit determines, a rectangular region generated on the basis of a position at which the second photoelectric conversion elements corresponding to the address information included in the second pixel signals output in the same period are distributed, as the reading region.

3. The solid-state imaging device according to claim 1,
wherein the reading control circuit determines, a rectangular region including a region in which the second photoelectric conversion elements corresponding to the address information included in the second pixel signals output in the same period are distributed, as the reading region.

4. The solid-state imaging device according to claim 1,
wherein the reading control circuit determines a rectangular region according to a magnitude of a distribution of the second photoelectric conversion elements as the reading region if the magnitude of the distribution of the second photoelectric conversion elements corresponding to the address information included in the second pixel signals output in the same period is greater than a predetermined threshold value, and
wherein the reading control circuit does not determine the reading region if the magnitude of the distribution of the second photoelectric conversion elements corresponding to the address information included in the second pixel signals output in the same period is less than or equal to the threshold value.

5. The solid-state imaging device according to claim 1,
wherein the reading control circuit determines the reading region corresponding to the second photoelectric conversion elements corresponding to the address information if the number of second photoelectric conversion elements corresponding to the address information included in the second pixel signals output in the same period is greater than a predetermined threshold value, and
wherein the reading control circuit does not determine the reading region if the number of second photoelectric conversion elements corresponding to the address information included in the second pixel signals output in the same period is less than or equal to the threshold value.

6. The solid-state imaging device according to claim 4,
wherein the reading control circuit divides an entire region in which the n first photoelectric conversion elements are arranged into a plurality of blocks segmented in a predetermined size and determines the reading region for each division block.

7. The solid-state imaging device according to claim 1,
wherein each of the n first photoelectric conversion elements and each of the m second photoelectric conversion elements are periodically arranged in a region of the same plane of a first semiconductor substrate.

8. The solid-state imaging device according to claim 7,
wherein the pixel signal generation circuit is arranged in a second semiconductor substrate stacked on a surface of the first semiconductor substrate, the surface being opposite to a side on which light is incident.

9. The solid-state imaging device according to claim 8, further comprising:
a connection section formed between the first semiconductor substrate and the second semiconductor substrate and configured to electrically connect a circuit element of the first semiconductor substrate and a circuit element of the second semiconductor substrate,
wherein the connection section electrically connects the detection circuit provided in each of the m second reading circuits and the corresponding second photoelectric conversion element.

10. The solid-state imaging device according to claim 9,
wherein a charge signal in which s first charge signals generated by s first photoelectric conversion elements are designated as one unit is also used as the second charge signal generated by the second photoelectric conversion element,
wherein s is a natural number greater than or equal to 1, and
wherein the total number of the first photoelectric conversion elements configured to output the first charge signals also used as the second charge signals is a natural number greater than or equal to 1 and less than or equal to n.

11. The solid-state imaging device according to claim 10,
wherein m is less than n,
wherein s is a natural number greater than or equal to 2,
wherein each of the m second reading circuits further includes an addition circuit configured to sum the s first charge signals generated by the s first photoelectric conversion elements corresponding thereto as one unit, and
wherein the detection circuit detects a change in the first charge signal after summation by the addition circuit.

12. The solid-state imaging device according to claim 1,
wherein each of the n first photoelectric conversion elements is periodically arranged on a first semiconductor substrate on which light is incident,
wherein each of the m second photoelectric conversion elements is periodically arranged on a second semiconductor substrate stacked on a surface of the first semiconductor substrate, the surface being opposite to a side on which light is incident, and
wherein each of the m second photoelectric conversion elements generates the second charge signal obtained by photoelectrically converting light passing through the first semiconductor substrate.

13. The solid-state imaging device according to claim 9,
wherein each of the second reading circuits further includes an addition circuit configured to designate t second photoelectric conversion elements as one unit and sum second charge signals generated by the t second photoelectric conversion elements,
wherein the detection circuit detects a change in the second charge signal after summation by the addition circuit, and
wherein t is a natural number greater than or equal to 2.

* * * * *